United States Patent
Hirose et al.

(10) Patent No.: US 7,455,916 B2
(45) Date of Patent: *Nov. 25, 2008

(54) ORGANIC ELECTROLUMINESCENT ELEMENT

(75) Inventors: Hidekazu Hirose, Minamiashigara (JP); Daisuke Okuda, Minamiashigara (JP); Mieko Seki, Minamiashigara (JP); Tadayoshi Ozaki, Minamiashigara (JP); Hirohito Yoneyama, Minamiashigara (JP); Toru Ishii, Minamiashigara (JP); Takeshi Agata, Minamiashigara (JP); Kiyokazu Mashimo, Minamiashigara (JP); Katsuhiro Sato, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/389,947

(22) Filed: Mar. 18, 2003

(65) Prior Publication Data

US 2004/0081854 A1 Apr. 29, 2004

(30) Foreign Application Priority Data

Sep. 18, 2002 (JP) .................... 2002-271831

(51) Int. Cl.
*H01J 1/62* (2006.01)
*H01L 29/08* (2006.01)

(52) U.S. Cl. .................. 428/690; 428/917; 313/504

(58) Field of Classification Search ........... 428/690, 428/917; 313/504, 506, 503; 257/40, E51.03; 408/917; 252/301.16; 430/59
See application file for complete search history.

(56) References Cited

U.S. PATENT DOCUMENTS

| 4,539,507 | A | | 9/1985 | VanSlyke et al. |
| 5,247,190 | A | | 9/1993 | Friend et al. |
| 5,281,489 | A | * | 1/1994 | Mori et al. ............... 428/690 |
| 5,414,069 | A | * | 5/1995 | Cumming et al. ........... 528/310 |
| 5,604,064 | A | * | 2/1997 | Nukada et al. ........... 430/58.65 |
| 5,639,581 | A | * | 6/1997 | Iwasaki et al. ............ 430/58.7 |
| 6,057,048 | A | * | 5/2000 | Hu et al. ..................... 428/690 |
| 6,096,453 | A | * | 8/2000 | Grunwald ................ 429/212 |
| 6,486,601 | B1 | * | 11/2002 | Sakai et al. ................. 313/504 |

(Continued)

FOREIGN PATENT DOCUMENTS

EP 0710893 5/1996

(Continued)

OTHER PUBLICATIONS

P.S. Vincett et al., Electrical Conduction and Low Voltage Blue Electroluminescence in Vacuum-Deposited Organic Films, *Thin Solid Films*, 94, 1982, pp. 171-183.

(Continued)

*Primary Examiner*—Bruce H. Hess
*Assistant Examiner*—Camie S Thompson
(74) *Attorney, Agent, or Firm*—Fildes & Outland, P.C.

(57) ABSTRACT

An organic electroluminescent element having at least one pair of electrodes including an anode and a cathode, at least one of which having light transmissive, and at least one organic compound layer disposed between the electrodes, wherein the at least one organic compound layer contains at least one kind of non-conjugated polymer having terminal groups, and at least one of terminal groups of the non-conjugated polymer contains a fluorescent substance emitting fluorescence in a solid state.

40 Claims, 1 Drawing Sheet

U.S. PATENT DOCUMENTS

| | | | |
|---|---|---|---|
| 6,537,687 B1 * | 3/2003 | Nii | 428/690 |
| 6,538,263 B1 * | 3/2003 | Park et al. | 257/40 |
| 6,670,052 B2 | 12/2003 | Hirose et al. | 428/690 |
| 2004/0018384 A1 * | 1/2004 | Hirose et al. | 428/690 |
| 2004/0131886 A1 * | 7/2004 | Marrocco et al. | 428/690 |

FOREIGN PATENT DOCUMENTS

| | | | |
|---|---|---|---|
| JP | 59-194393 | | 11/1984 |
| JP | 10-092576 | | 4/1998 |
| JP | 2002-043066 | * | 2/2002 |
| JP | 2002-075654 | | 3/2002 |

OTHER PUBLICATIONS

C. W. Tang et al., "Organic Electroluminescent Diodes", *Appl. Phys. Lett.*, vol. 51, Sep. 21, 1987, pp. 913-915.

Sato et al., "Application of Organic EL Device to Flat Panel Display", The Institute of Electronics, Information and Communications Engineers, Partial Translation of Technical Report of IEICE. OME 95-54 (1995), pp. 47-52.

Pioneer Electronic Corp. et al., "Organic Electroluminescence Devices with a Starburst Amine as a Hole Transport Material", The 40$^{th}$ Meeting, Japan Society of Applied Physics & Related Societies Preprints 30a-SZK-14, 1993, p. 1146.

Gustafsson et al., "Flexible Light-Emitting Diodes Made from Soluble Conducting Polymers", *Nature*, vol. 357, Jun. 11, 1992, pp. 477-479.

M. Sugihara et al., "Synthesis and Physical Properties of Polyphosphazenes Having Hole-Transporting Aromatic Tertiary Amines in Side Chains", Polymer Preprints, Japan vol. 42, No. 7, 20J-21 (1993), pp. 2860-2863.

Y. Mori et al., "Light-Emitting Characteristics of Organic Electroluminescent Devices With a Mixed-Layer Structure", The 38$^{th}$ Meeting, Japan Society of Applied Physics & Related Societies, Preprints 31p-G-12 (1991).

Nagoya Univ. Minolta Camera Co., et al., Preparation of Organic Electroluminescent Devices by Casting Method and Their Evaluation (Nagoya Univ. and Minolta Camera), The 50$^{th}$ Meeting, Japan Society of Applied Physics, Preprints 29p-ZP-5 (1989), p. 1006.

Sanyo Electric Co. et al., "Organic EL Devices Having a Cast Polymer Film as a Hole Transport Layer", The 51th Meeting, Japan Society of Applied Physics, Preprints 28a-PB-7 (1990), p. 1041.

Thelakkat et al., Synthetic Metals, 102 (1999), p. 1125-1128.

Thelakkat et al., Polymer Preprints, (1999), 40(2), p. 1230-1231.

Bayerl et al., Macromol. Rapid Commun., vol. 20, pp. 224-228 (1999).

* cited by examiner

ORGANIC ELECTROLUMINESCENT ELEMENT

BACKGROUND OF THE INVENTION

1. Field of the Invention

The present invention relates to an element which emits light by converting electric energy into light, and more particularly to an organic electroluminescent element which can be suitably used in the fields of display elements, back lights of liquid crystals, illumination light sources, exposing apparatus for electrophotography, labels, sign boards and the like.

2. Description of the Related Art

Since an electroluminescent element is a spontaneously emitting wholly solid element, has high visibility, and withstands impacts, wide application thereof is expected. Currently, an electroluminescent element using an inorganic fluorescent substance is popular and is used widely. Since such an electroluminescent element requires alternating current voltage in a range of 200 V or greater and 50 to 1000 Hz for driving, it has a problem in that a running cost thereof is high and luminance is insufficient. On the other hand, study of an electroluminescent element using an organic compound first started using a single crystal of anthracene or the like, but a film thickness of the element is as great as 1 mm, and the element requires a driving voltage of 100 V or greater. For that reason, as reported in Thin Solid Films, 94, 171(1982), thinning by a deposition method has been tried.

Light emission by these electroluminescent elements is a phenomenon in which electrons are injected from one electrode and holes are injected from another electrode, whereby, a light emitting material in an electroluminescent element is excited to a high energy level, and an excited light emitting substance releases, as light, extra energy produced when returned to a ground state. However, in these electroluminescent elements, a driving voltage is still as high as 30 V, densities of electron carriers and hole carriers present in a film are low, and a probability of production of photons by recombination of carriers is low. Therefore, sufficient luminance cannot be obtained, and these electroluminescent elements have not been put to practical use.

However, in 1997, Tang et al. reported in Appl. Phys. Lett., 51, 913(1987) and Japanese Patent Application Laid-Open (JP-A) No. 59-194393 that a high luminance of 1000 cd/m$^2$ or larger can be obtained under a low driving voltage of around 10 V by an organic electroluminescent element. This organic electroluminescent element is a function separated-type organic electroluminescent element in which a hole transporting organic low-molecular compound, and a fluorescent organic low-molecular compound having electron transporting ability are successively deposited in order, as an extremely thin film, on a transparent substrate by a vacuum deposition method. Since this study by Tang et al., organic luminescence elements have been actively studied and developed.

These multilayer electroluminescent elements have a structure in which an organic light emitting substance and a charge transporting organic compound (charge transporting material) are deposited on an electrode, and the light emission by these elements is caused by recombination of holes and electrons, which are generated in both materials and move in the charge transporting material.

In this case, as the organic light emitting substance, organic dyes emitting fluorescene such as a 8-quinlinol aluminium complex and a coumarin compound are used. In addition, examples of the charge transporting material include diamino compounds such as N,N-di(m-tolyl) N,N'-diphenylbenzidine and 1,1-bis[N,N-di(p-tolyl)aminophenyl]cyclohexane, a 4-(N,N-diphenyl)aminobenzaldehyde-N,N-diphenylhydrazone compound and the like.

Organic electroluminescent elements using these organic compounds have high light emitting properties, but they have problems with respect to heat stability upon light emission and the storage stability. A thickness of a layer formed of an organic compound in an electroluminescent element is very thin, being as thin as several tens to several hundred of nanometers. Therefore, a voltage applied per unit thickness of a layer composed of this organic compound becomes very high, and the element is driven at a high current density of a few mA/cm$^2$. Therefore, a large amount of Joule heat is generated from this layer. For this reason, a hole transporting low-molecular compound and a fluorescent organic low-molecular compound which are formed into an amorphous film are gradually crystallized as a temperature thereof is elevated and, finally, those compounds are melted, thereby causing a reduction in luminance and dielectric breakdown in many cases. Therefore, there is a problem in that a lifetime of the organic electroluminescent element is reduced. It is considered that the low heat stability of this organic electroluminescent element is derived from a low glass transition temperature of a material used in an organic electroluminescent element. That is, low-molecular compounds used as such a material have a low melting point and have high symmetry.

Thus, in order to solve the problem regarding heat stability, an organic electroluminescent element using N,N-di(1-naphthyl)N,N'-diphenylbenzidine with an α-naphthyl group introduced therein, as a material which has an improved glass transition temperature and can obtain a stable amorphous state, has been reported in Technical Study Report of the Electronic Information Communication Society, OME95-54 (1995) and, for the same purpose, an organic electroluminescent element using a star burst amine has been reported in Proceedings of the 40th Applied Physics Related Associated Seminar 30a-SZK-14(1993). However, when these materials are used alone, since there is an energy barrier derived from ionization potential of a hole transporting material, hole injectability from an anode or hole injectability into a light emitting layer can not be satisfied. Further, in a 2-layered type element in which a hole transporting layer and a light emitting layer are deposited, a mutual diffusion phenomenon is caused. In addition, it is required that a material used in an organic electroluminescent element has heat stability with respect to heat treatment during a step of preparing an organic electroluminescent element, such as deposition, baking, annealing, wiring, sealing and the like, and with respect to change over time due to long term use of the organic electroluminescent element. For this reason, it is desired that a glass transition temperature of a material used in an organic electroluminescent element is even higher.

On the other hand, an electroluminescent element using a high-molecular material in place of a low-molecular compound has also been studied and developed. For example, in Nature, 357,577(1992) and JP-A No. 10-92576, there has been proposed an element using an electrically conductive polymer such as poly(p-phenylenevinylene) or the like. In addition, in Proceedings of the 42nd Polymer Discussion Meeting 20J21(1993), there has been proposed an element using a polymer in which triphenylamine is introduced on a side chain of polyphosphazene. Further, in Proceedings of the 38th Applied Physics Related Associated Seminar 31p-GI-2 (1991), there has been proposed an element using a material in which an electron transporting material and a fluorescent dye are mixed into hole transporting polyvinylcarbazole.

These high-molecular materials have a comparatively higher glass transition points than that of a low-molecular compound. However, since poly(p-phenylenevinylene) is subjected to heat treatment after spin coating with a soluble precursor, defects are easily generated in a conjugated polymer on a main chain and light emitting properties are remarkably reduced. In addition, phosphazene has a high ionization potential, and thus, charge injecting properties are reduced. Further, polyvinylcarbazole has a high glass transition point, but has a problem due to traps. In addition, when a low-molecular compound is mixed into polyvinylcarbazole, the low-molecular compound acts as a plasticizer. For this reason, an organic electroluminescent element using these high-molecular materials has not yet caught up with the multilayer-type electroluminescent element using an organic low-molecular compound, in luminance, light emitting efficiency and the like.

In addition, a method of preparing an organic electroluminescent element is desirably a coating method in view of simplification of preparation, processibility, enlargement, cost and the like and, additionally, Proceedings of the 50th Applied Physics Society Seminar, 29p-ZP-5(1989) and Proceeding of the 51th Applied Physics Society Seminar, 28a-PB-7(1990) report that an organic electroluminescent element can also be prepared by a casting method. However, since a charge transporting material has deteriorated solubility in or compatibility with a solvent or a resin, the charge transporting material is easily crystallized and, thus, the above preparation methods lead to defects in preparation and properties of an organic electroluminescent element.

SUMMARY OF THE INVENTION

An object of the present invention is to solve the various problems of the prior art as described above.

That is, an object of the invention is to provide an organic electroluminescent element which has high light emitting intensity, has high light emitting efficiency, has a long element life and is easily prepared, using a non-conjugated polymer having a light emitting function which is excellent in the heat stability during light emission, storage stability, and solubility in and compatibility with a solvent and a resin.

In order to attain the above object, the present inventors intensively studied a non-conjugated polymer having light emitting properties. As a result, the present inventors have found that a non-conjugated polymer having a fluorescent substance emitting fluorescence in a solid state on at least one terminal group has charge injecting properties, charge mobility, thin film forming ability and light emitting properties which are suitable for the organic electroluminescent element, which resulted in completion of the invention.

That is, a first aspect of the invention provides an electroluminescent element comprising at least one pair of electrodes comprising an anode and a cathode, at least one of which having light transmissive, and at least one organic compound layer disposed between the electrodes, wherein the at least one organic compound layer contains at least one kind of non-conjugated polymer having terminal groups, and at least one terminal group of the non-conjugated polymer contains a fluorescent substance emitting fluorescence in a solid state.

A second aspect of the invention provides an organic electroluminescent element according to the first aspect, wherein the non-conjugated polymer may be selected from the group consisting of polyester, polyether and polyurethane.

A third aspect of the invention provides an organic electroluminescent element according to the first aspect, wherein the non-conjugated polymer may be hole transporting polymer.

A fourth aspect of the invention provides an organic electroluminescent element according to the first aspect, wherein the non-conjugated polymer may comprises a repetition unit containing at least one partial structure selected from the group consisting of the following general formulas (I-1) and (I-2),

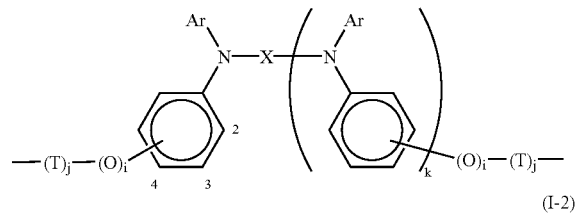

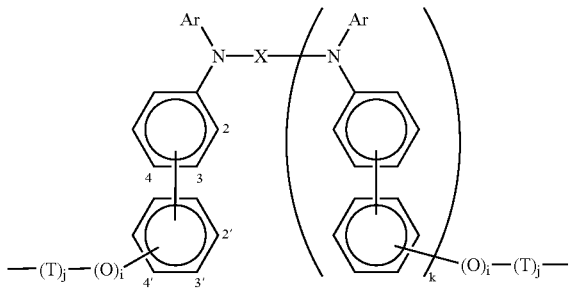

wherein, in the general formulas (I-1) and (I-2), Ar represents a group selected from the group consisting of a substituted or unsubstituted monovalent benzene ring, a substituted or unsubstituted monovalent polynuclear aromatic hydrocarbon having an aromatic ring number of 2 to 10, a substituted or unsubstituted monovalent condensed aromatic hydrocarbon having an aromatic ring number of 2 to 10, and a substituted or unsubstituted monovalent aromatic heterocyclic ring; X represents a group selected from the group consisting of a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, and a substituted or unsubstituted divalent aromatic heterocyclic ring; T represents a group selected from the group consisting of a divalent straight hydrocarbon group having a carbon number of 1 to 6 and a divalent branched hydrocarbon group having a carbon number of 2 to 10; and k, i and j each independently represent an integer selected from 0 to 1.

A fifth aspect of the invention provides an organic electroluminescent element according to the first aspect, wherein the at least one organic compound layer may comprise 2 or more layers including at least a light emitting layer, and the light emitting layer may contain at least one kind of the non-conjugated polymer.

A sixth aspect of the invention provides an organic electroluminescent element according to the fifth aspect, wherein the at least one organic compound layer may have a construction selected from the group consisting of a construction comprising the light emitting layer and an electron transporting layer, a construction comprising the light emitting layer and an electron injecting layer, and a construction comprising the light emitting layer, an electron transporting layer and an electron injecting layer.

A seventh aspect of the invention provides an organic electroluminescent element according to the fifth aspect, wherein the at least one organic compound layer may have a construction selected from the group consisting of a construction comprising the light emitting layer and a hole transporting layer, a construction comprising the light emitting layer and a hole injecting layer, and a construction comprising the light emitting layer, a hole transporting layer and a hole injecting layer.

An eighth aspect of the invention provides an organic electroluminescent element according to the fifth aspect, wherein the at least one organic compound layer may have a construction selected from the group consisting of a construction comprising the light emitting layer, a hole transporting layer and an electron transporting layer, a construction comprising the light emitting layer, a hole transporting layer and an electron injecting layer, a construction comprising the light emitting layer, a hole transporting layer and an electron injecting layer, a construction comprising the light emitting layer, a hole injecting layer and an electron transporting layer, a construction comprising the light emitting layer, a hole injecting layer and an electron injecting layer, a construction comprising the light emitting layer, a hole injecting layer, an electron transporting layer and an electron injecting layer, a construction comprising the light emitting layer, a hole transporting layer, a hole injecting layer and an electron transporting layer, a construction comprising the light emitting layer, a hole transporting layer, a hole injecting layer and an electron injecting layer, and a construction comprising the light emitting layer, a hole transporting layer, a hole injecting layer, an electron transporting layer and an electron injecting layer.

A ninth aspect of the invention provides an organic electroluminescent element according to the first aspect, wherein the at least one organic compound layer may be composed only of a light emitting layer having a charge transporting function, and the light emitting layer having the charge transporting function may contain one or more kinds of non-conjugated polymers.

A tenth aspect of the invention provides an organic electroluminescent element according to the fourth aspect, wherein the non-conjugated polymer may be a polyester selected from the group consisting of the following general formulas (II-1) and (II-2),

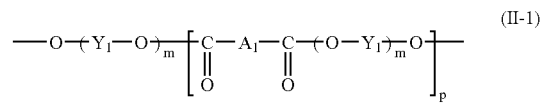

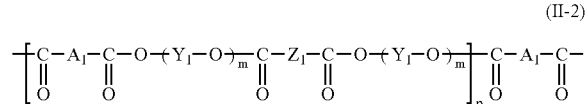

wherein, in the general formulas (II-1) and (II-2), Al represents at least one structure selected from the group consisting of general formulas (I-1) and (I-2), $Y_1$ represents a divalent alcohol residue, $Z_1$ represents a divalent carboxylic acid residue, m represents an integer from 1 to 5, and p represents an integer selected from the range of 5 to 5,000.

An eleventh aspect of the invention provides an organic electroluminescent element according to the fourth aspect, wherein the non-conjugated polymer may be a polyether represented by the following general formula (III-1),

wherein, in the general formula (III-1), $A_1$ represents at least one structure selected from the group consisting of general formulas (I-1) and (I-2), and p represents an integer from 5 to 5,000.

A twelfth aspect of the invention provides an organic electroluminescent element according to the fourth aspect, wherein the non-conjugated polymer may be a polyurethane selected from the group consisting of the general formulas (IV-1) and (IV-2),

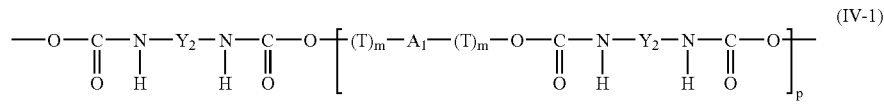

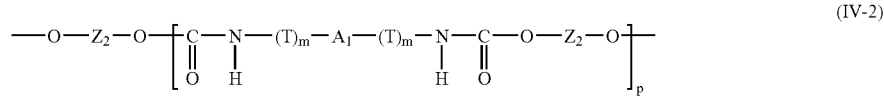

wherein, in the general formulas (IV-1) and (IV-2), $A_1$ represents at least one structure selected from the group consisting of general formulas (I-1) and (I-2), T represents a group selected from the group consisting of a divalent straight hydrocarbon group having a carbon number of 1 to 6, and a divalent branched hydrocarbon group having a carbon number of 2 to 10; $Y_2$ and $Z_2$ each independently represents a group selected from the group consisting of divalent diisocyanate, alcohol and amine residue; m represents an integer from 1 to 5; and p represents an integer from 5 to 5,000.

A thirteenth aspect of the invention provides an organic electroluminescent element according to the first aspect, wherein the fluorescent substance may be an organic fluorescent substance.

A fourteenth aspect of the invention provides an organic electroluminescent element according to the thirteenth aspect, wherein the organic fluorescent substance may be selected from the group consisting of a compound including an aromatic hydrocarbon having an aromatic ring number of 2 or more, and a chelating metal complex.

A fifteenth aspect of the invention provides an organic electroluminescent element according to the fourteenth aspect, wherein the compound including an aromatic hydrocarbon having an aromatic ring number of 2 or more may be an organic fluorescent substance selected from the group consisting of a polyacene derivative compound, a styrylamine compound, a quinacridone derivative compound, a rubulen derivative compound, a coumarin derivative compound, and a pyran derivative compound.

A sixteenth aspect of the invention provides an organic electroluminescent element according to the fifteenth aspect, wherein the polyacene derivative compound may be selected from the group consisting of a naphthalene derivative, an anthracene derivative, a tetracene derivative, a perylene derivative, and a pyrne derivative.

A seventeenth aspect of the invention provides an organic electroluminescent element according to the fourteenth aspect, wherein the chelating metal complex may contain a metal selected from the group consisting of Al, Zn, Be, Mg, Eu, Ga, Pt and Ir.

An eighteenth aspect of the invention provides an organic electroluminescent element according to the first aspect, wherein a maximum peak wavelength of a fluorescent spectrum of the fluorescent substance may be in the a visible light region.

A nineteenth aspect of the invention provides an organic electroluminescent element according to the first aspect, wherein both terminal groups of the non-conjugated polymer may contain a fluorescent substance emitting fluorescence in a solid state.

A twentieth aspect of the invention provides an organic electroluminescent element according to the first aspect, wherein emission colors of fluorescent substances emitting fluorescence in a solid state and respectively contained in the terminal groups may be different from each other.

DETAILED DESCRIPTION OF THE INVENTION

Figure 1:
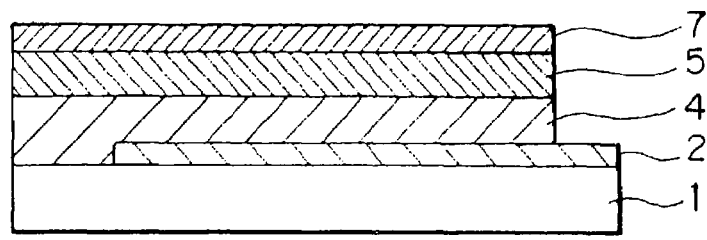
FIG. 1 is a schematic view showing one example of a layer construction of the organic electroluminescent element of the present invention.

The organic electroluminescent element of the present invention is an electroluminescent element, which comprises at least one pair of electrodes comprising an anode and a cathode, at least one of which having light transmissive, and at least one organic compound layer disposed between the electrodes, wherein the at least one organic compound layer contains at least one kind of non-conjugated polymer having terminal groups, and at least one of terminal groups of the non-conjugated polymer contains a fluorescent substance emitting fluorescence in a solid state.

In the invention, the "non-conjugated polymer" is a polymer having a repetition structure containing at least one σ bond on a main chain of the polymer, and is not particularly limited as long as at least one of terminal ends of the main chain has a fluorescent substance emitting fluorescence in a solid state (hereinafter, referred to as "fluorescent substance").

In a non-conjugated molecule such as a molecule in which a plurality of light emitting compounds such as a fluorescent substance and the like continuously link together, an emitting intensity of the light emitting compound contained in the molecule is remarkably reduced as compared with a light emitting compound unlinked with any compound in some cases. In view of this point, it is preferable that the emitting compound is dispersed in a molecule. Since the non-conjugated polymer used in the invention has at least one non-connected fluorescent substance at terminal ends of a chain of the molecule, the aforementioned reduction in light emitting efficiency can be prevented and, as a result, sufficient light emitting intensity can be obtained.

Alternatively, a fluorescent substance may be added to any position other than terminal ends of a molecular chain of a polymer. However, when a non-conjugated polymer dose not have a fluorescent substance at terminal ends of the molecular chain, functional groups at terminal ends of the molecular chain may has an adverse effect on light emission of a fluorescent substance added to a part other than the terminal ends in some cases. In addition, when a charge moves on a molecular chain, functional groups at the terminal ends may suppress mobility of the charge in some cases.

However, since the non-conjugated polymer used in the invention has a fluorescent substance in place of at least one of functional groups at terminal ends of a molecular chain, it can sufficiently exert the light emitting properties of a non-connected fluorescent substance. In addition, when a charge moves on a molecular chain, mobility of the charge may be improved. Further, replacement of a functional group at a terminal end with a fluorescent substance is easy in synthesis of a non-conjugated polymer.

Further, the non-conjugated polymer used in the invention may have a fluorescent substance on both terminal ends. In this case, an emission color of the non-conjugated polymer can be easily adjusted to a desired color by choosing from combinations of fluorescent substances having different emission colors from each other. Such a non-conjugated polymer can be easily synthesized by copolymerization reaction.

Since the aforementioned non-conjugated polymer can be synthesized by selecting a structure of a part other than a fluorescent substance and adjusting a molecular weight, it is easy to obtain desired properties (e.g. heat stability, solubility in and compatibility with solvent and resin). For this reason, a non-conjugated polymer having excellent heat stability and film forming ability can be easily obtained.

As explained above, the non-conjugated polymer used in the invention has a high light emitting intensity, has high light emitting efficiency, has excellent charge moving properties, and is excellent in heat stability, and a film of the polymer can be easily made. Therefore, since in the organic electroluminescent element of the invention, the at least one organic compound layer contains the aforementioned non-conjugated polymer, light emitting intensity is high, the light emitting efficiency is high, a life of the element is long, and it is easy to make the element.

Examples of a fundamental structure of such a non-conjugated polymer include polymers comprising polyester, polyether, polyurethane, polyimide, polyamide, polyetherketone, polycarbonate, polysulfide, polyethersulfide, a silicon-containing polymer, and a germanium-containing polymer, or copolymers thereof. Among these, it is preferable that a fundamental structure of the non-conjugated polymer is any of polyester, polyether and polyurethane, in view of ease of synthesizing, heat stability, solubility in and the compatibility with a solvent and a resin, and the like.

In addition, the non-conjugated polymer may have a molecular chain on which a charge can move. In this case, it is preferable that the non-conjugated polymer is a hole transporting polymer.

It is preferable that the non-conjugated polymer as explained above comprises a repetition unit containing at least one partial structure selected from the group consisting of the following general formulas (I-1) and (I-2).

Since such a non-conjugated polymer is excellent in the heat stability during light emission, and solubility in and compatibility with a solvent and a resin, it is easy to prepare an organic electroluminescent element and, further, as an organic electroluminescent element, reliability of the light emitting property and a element life can be improved.

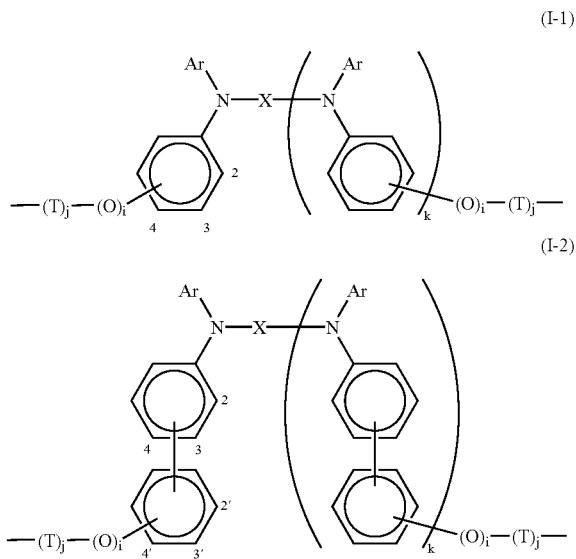

Wherein, in the general formulas (I-1) and (I-2), Ar represents a group selected from the group consisting of a substituted or unsubstituted monovalent benzene ring, a substituted or unsubstituted monovalent polynuclear aromatic hydrocarbon having an aromatic ring number of 2 to 10, a substituted or unsubstituted monovalent condensed aromatic hydrocarbon having an aromatic ring number of 2 to 10, and a substituted or unsubstituted monovalent aromatic heterocyclic ring; X represents a group selected from the group consisting of a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, and a substituted or unsubstituted divalent aromatic heterocyclic ring; T represents a group selected from the group consisting of a divalent straight hydrocarbon group having a carbon number of 1 to 6, and a divalent branched hydrocarbon group having a carbon number of 2 to 10; and k, i and j each independently represent an integer selected from 0 to 1.

In addition, the polynuclear aromatic hydrocarbon and the condensed aromatic hydrocarbon specifically are compounds defined below in the invention.

That is, the "polynuclear hydrocarbon" represents hydrocarbon containing 2 or more aromatic rings composed of carbon and hydrogen, in which aromatic rings are connected by a carbon-carbon bond. Examples thereof include biphenyl and terphenyl. In addition, the "condensed aromatic hydrocarbon" represents hydrocarbon containing 2 or more aromatic rings composed of carbon and hydrogen, in which aromatic rings share one pair of carbon atoms. Examples thereof include naphthalene, anthracene, phenanthrene and fluorene.

In addition, as a heterocyclic ring, heterocyclic rings having the number of atoms (Nr) constituting the ring skeleton of 5 and/or 6 are preferably used. In addition, atoms (hetero atom) other than carbon atoms constituting the ring skeleton are not particularly limited, but for example, a sulfur atom, a nitrogen atom, an oxygen atom and the like are preferably used. In addition, the ring skeleton may contain two or more kinds of and/or two or more hetero atoms. In particular, as a heterocyclic ring having a 5-membered ring structure, thiophene, pyrrole and furan, or heterocyclic rings in which 3- and 4-positional carbon atoms are replaced with nitrogen atoms are preferably used. In addition, as a heterocyclic ring having a 6-membered ring structure, pyridine is preferably used.

Examples of a substituent of the benzene ring, the polynuclear aromatic hydrocarbon or the condensed aromatic hydrocarbon include a hydrogen atom, an alkyl group, an alkoxy group, an aryl group, an aralkyl group, a substituted amino group, a halogen atom and the like. As the alkyl group, alkyl groups having a carbon number of 1 to 10 are preferable, and examples thereof include a methyl group, an ethyl group, a propyl group, an isopropyl group and the like. As the alkoxy group, alkoxy groups having a carbon number of 1 to 10 are preferable, and examples thereof include a methoxy group, an ethoxy group, a propoxy group, an isopropoxy group and the like. As the aryl group, aryl groups having a carbon number of 6 to 20 are preferable, and examples thereof include a phenyl group, a toluyl group and the like. As the aralkyl group, aralkyl groups having a carbon number of 7 to 20, and examples thereof include a benzyl group, a phenethyl group and the like. Examples of the substituent of the substituted amino group include an alkyl grouop, an aryl group, an aralkyl group and the like, and specific examples are as described above.

X represents a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, or a substituted or unsubstituted divalent aromatic heterocyclic ring, and examples thereof include a group selected from the following formulas (1) to (13).

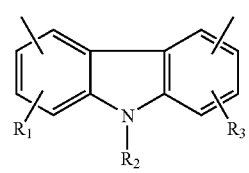

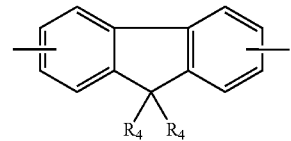

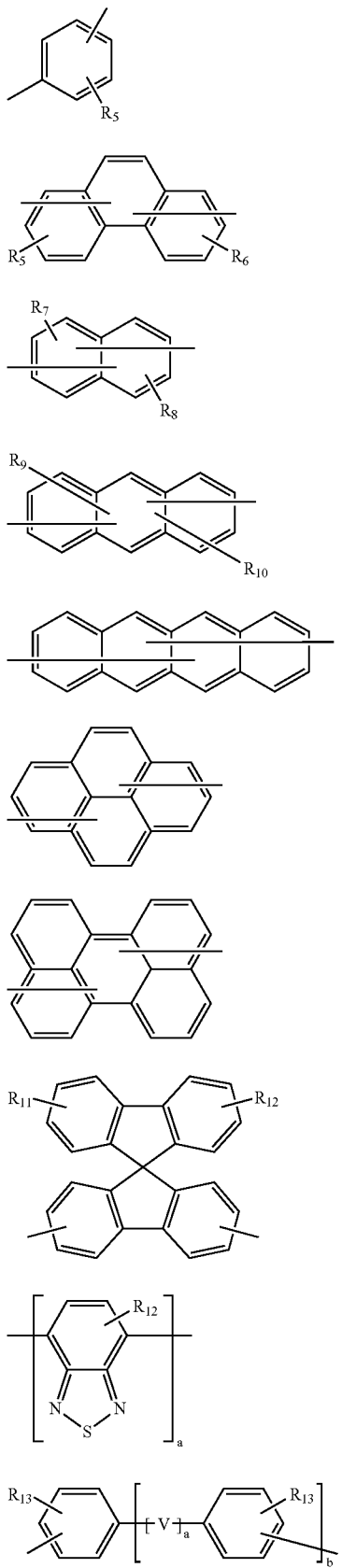
In the formulas (1) to (13), $R_1$ to $R_{14}$ represent a hydrogen atom, an alkyl group having a carbon number of 1 to 10, an alkoxy group having a carbon number of 1 to 10, a substituted or unsubstituted phenyl group, a substituted or unsubstituted aralkyl group, or a halogen atom, a means 0 or 1, and b means an integer of 0 to 10. In addition, V represents a group selected from the following formulas (14) to (34).

-continued

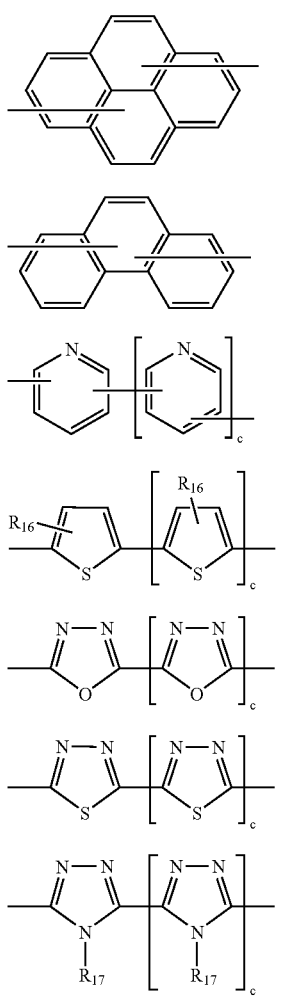
(28)
(29)
(30)
(31)
(32)
(33)
(34)

In formulas (14) to (34), $R_{15}$ represents a hydrogen atom, an alkyl group or a cyano group, $R_{16}$ to $R_{17}$ represent a hydrogen atom, an alkyl group having a carbon number of 1 to 10, an alkoxyl group having a carbon number of 1 to 10, a substituted or unsubstituted phenyl group, a substituted or unsubstituted aralkyl group, or a halogen atom, and c means an integer of 0 to 10.

In addition, T represents a divalent straight hydrocarbon group having a carbon number of 1 to 6, or a divalent branched hydrocarbon group having a carbon number of 2 to 10, and is preferably selected from a divalent straight hydrocarbon group having a carbon number of 2 to 6, and a divalent branched hydrocarbon group having a carbon number of 3 to 7. Specific structures are shown below.

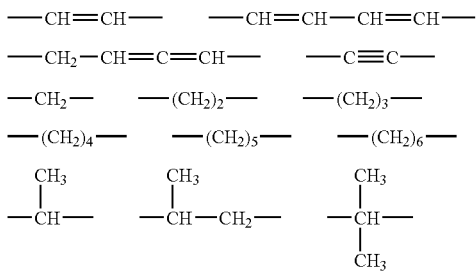

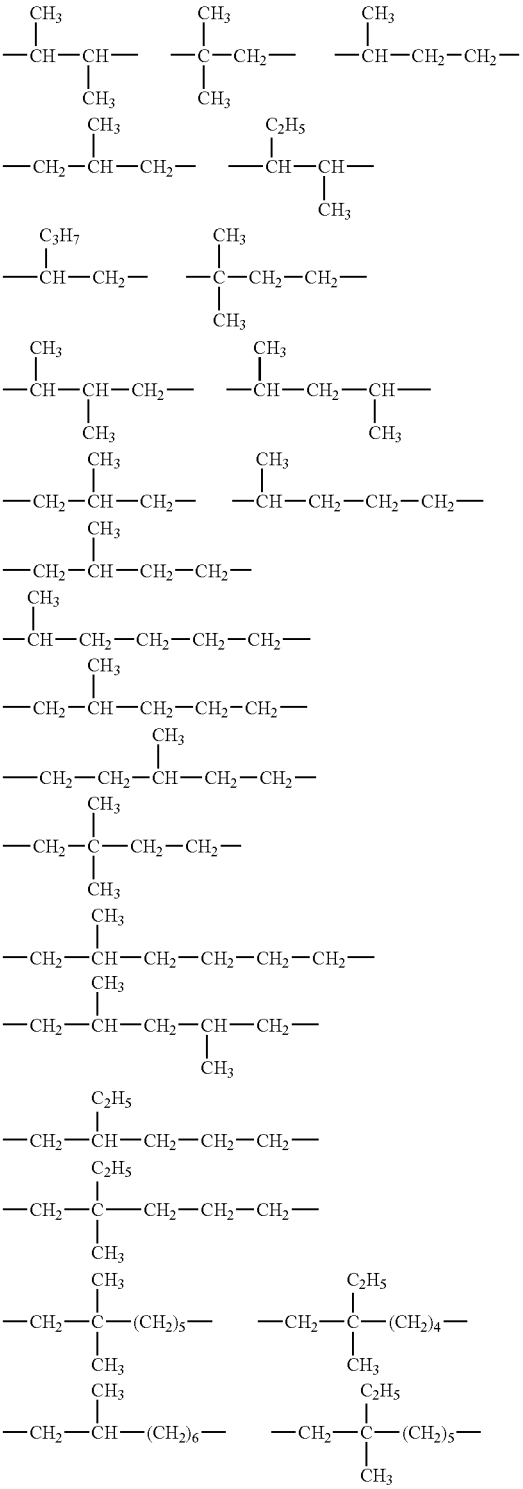

In addition, specific examples of the structure represented by the general formulas (I-1) are shown in Table 1 to Table 49, and specific examples of the structure represented by the general formula (I-2) are shown in Table 50 to Table 88. In Table 1 to Table 88, the number described in the "Bonding Point." column shows that carbon in a benzene ring with this number added thereto is a bonding position, in the general formulas (I-1) and (I-2).

TABLE 1
| Structure | k | X | Ar | Bonding Point | i | j | T |
|---|---|---|---|---|---|---|---|
| 1 | 0 | 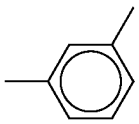 | 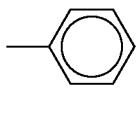 | 3 | 0 | 0 | — |
| 2 | 0 | 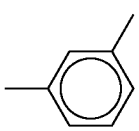 | 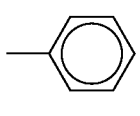 | 4 | 1 | 1 | —CH$_2$CH$_2$— |
| 3 | 0 | 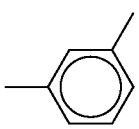 | 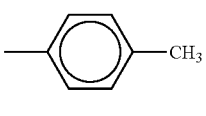 | 3 | 0 | 1 | —CH$_2$CH$_2$— |
| 4 | 0 | 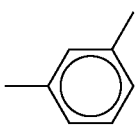 | 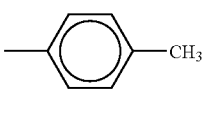 | 4 | 0 | 1 | 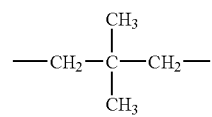 |
| 5 | 0 | 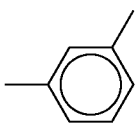 | 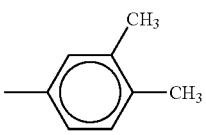 | 4 | 0 | 1 | 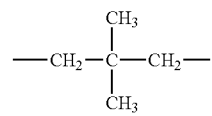 |
| 6 | 0 | 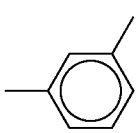 | 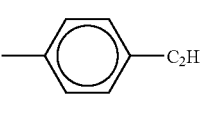 | 4 | 0 | 1 | —CH$_2$CH$_2$— |
| 7 | 0 | 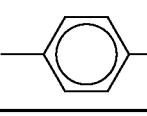 | 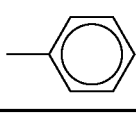 | 4 | 0 | 1 | —CH$_2$CH$_2$— |
TABLE 2
| Structure | k | X | Ar | Bonding Point | i | j | T |
|---|---|---|---|---|---|---|---|
| 8 | 0 | 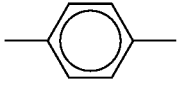 | 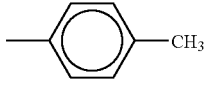 | 4 | 0 | 1 | —CH$_2$— |
| 9 | 0 | 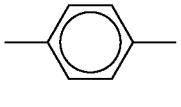 | 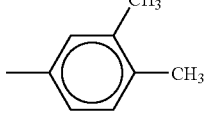 | 4 | 0 | 1 | —CH$_2$CH$_2$— |
| 10 | 0 | 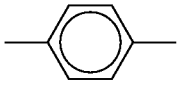 | 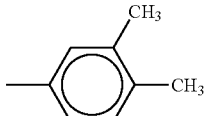 | 4 | 1 | 0 | — |
| 11 | 0 | 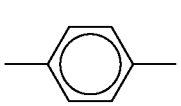 | 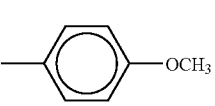 | 4 | 0 | 1 | —CH$_2$— |

TABLE 2-continued
| Structure | k | X | Ar | Bonding Point | i | j | T |
|---|---|---|---|---|---|---|---|
| 12 | 0 |  | 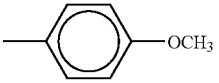 —OCH₃ | 4 | 0 | 1 | —CH₂CH₂— |
| 13 | 0 |  | 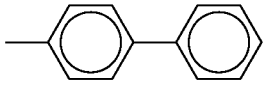 | 4 | 0 | 1 | —CH₂— |
| 14 | 0 |  | 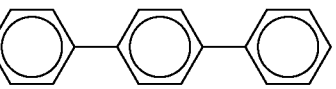 | 4 | 0 | 1 | —CH₂CH₂— |
TABLE 3
| Structure | k | X | Ar | Bonding Point | i | j | T |
|---|---|---|---|---|---|---|---|
| 15 | 0 |  | 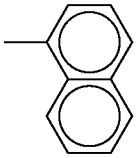 | 4 | 0 | 1 |  |
| 16 | 0 | 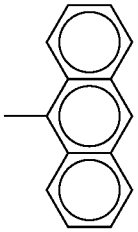 |  | 4 | 0 | 1 | —CH₂— |
| 17 | 0 | 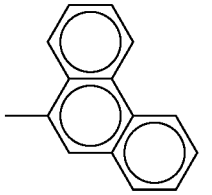 |  | 4 | 0 | 1 | —CH₂CH₂— |
| 18 | 0 | 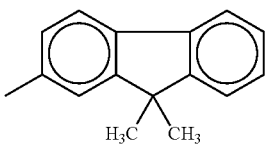 |  | 4 | 0 | 1 | —CH₂CH₂— |
| 19 | 0 | 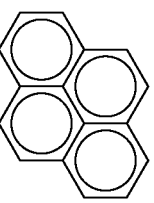 | | 4 | 0 | 1 | —CH₂CH₂— |

TABLE 4
| Structure | k | X | Ar | Bonding Point | i | j | T |
|---|---|---|---|---|---|---|---|
| 20 | 0 |  | 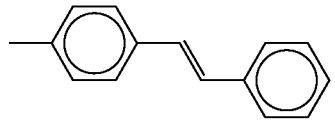 | 4 | 0 | 1 | —CH$_2$CH$_2$— |
| 21 | 0 |  | 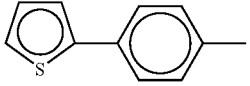 | 3 | 0 | 1 | —CH$_2$CH$_2$— |
| 22 | 0 |  | 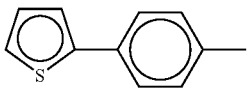 | 4 | 0 | 1 | —CH$_2$CH$_2$— |
| 23 | 0 |  | 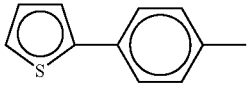 | 4 | 0 | 1 | —CH$_2$—C(CH$_3$)$_2$—CH$_2$— |
| 24 | 0 | 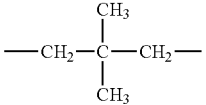 |  | 4 | 0 | 1 | —CH$_2$CH$_2$— |
| 25 | 0 | 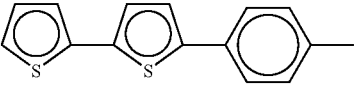 |  | 4 | 0 | 1 | —CH$_2$CH$_2$— |
| 26 | 0 | 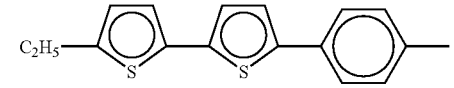 |  | 4 | 0 | 1 | —CH$_2$— |
TABLE 5
| Structure | k | X | Ar | Bonding Point | i | j | T |
|---|---|---|---|---|---|---|---|
| 27 | 0 | 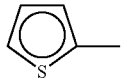 |  | 4 | 0 | 0 | — |
| 28 | 0 | 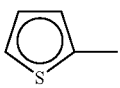 |  | 4 | 1 | 0 | — |
| 29 | 0 | 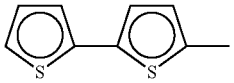 |  | 4 | 0 | 1 | —CH$_2$CH$_2$— |
| 30 | 0 | 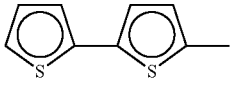 |  | 4 | 1 | 0 | — |
| 31 | 0 | 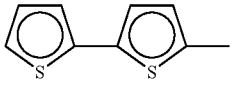 | 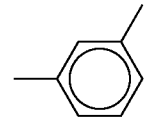 | 4 | 0 | 0 | — |

TABLE 5-continued

| Structure | k | X | Ar | Bonding Point | i | j | T |
|---|---|---|---|---|---|---|---|
| 32 | 0 | phenylene | thiophene-phenylene | 4 | 0 | 0 | — |
| 33 | 0 | phenylene | thiophene-thiophene-phenylene | 4 | 0 | 0 | — |

TABLE 6

| Structure | k | X | Ar | Bonding Point | i | j | T |
|---|---|---|---|---|---|---|---|
| 34 | 0 | phenylene | C$_2$H$_5$—thiophene-thiophene-phenylene | 4 | 0 | 0 | — |
| 35 | 0 | phenylene | thiophene-thiophene | 4 | 0 | 0 | — |
| 36 | 0 | dimethylphenylene | thiophene-phenylene | 3 | 1 | 1 | —CH$_2$CH$_2$— |
| 37 | 0 | phenylene | thiophene-phenylene | 4 | 1 | 1 | —CH$_2$— |
| 38 | 0 | phenylene | thiophene-phenylene | 4 | 1 | 1 | —CH$_2$CH$_2$— |
| 39 | 0 | phenylene | C$_2$H$_5$—thiophene-thiophene-phenylene | 4 | 1 | 1 | —CH$_2$— |
| 40 | 0 | phenylene | thiophene-thiophene | 4 | 1 | 1 | —CH$_2$— |

TABLE 7

| Structure | k | X | Ar | Bonding Point | i | j | T |
|---|---|---|---|---|---|---|---|
| 41 | 1 | biphenylene | phenylene | 4 | 0 | 1 | —CH$_2$CH$_2$— |
| 42 | 1 | biphenylene | phenylene—CH$_3$ | 4 | 0 | 1 | —CH$_2$CH$_2$— |

TABLE 7-continued
| Structure | k | X | Ar | Bonding Point | i | j | T |
|---|---|---|---|---|---|---|---|
| 43 | 1 | 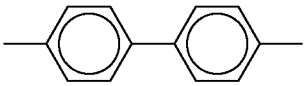 | 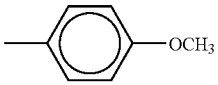 | 4 | 0 | 1 | —CH$_2$CH$_2$— |
| 44 | 1 | 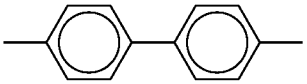 | 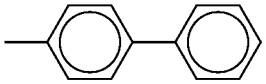 | 4 | 0 | 1 | —CH$_2$CH$_2$— |
| 45 | 1 | 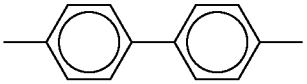 |  | 4 | 0 | 1 | —CH$_2$CH$_2$— |
| 46 | 1 | 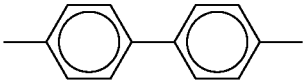 | 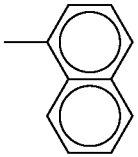 | 4 | 0 | 1 | —CH$_2$CH$_2$— |
TABLE 8
| Structure | k | X | Ar | Bonding Point | i | j | T |
|---|---|---|---|---|---|---|---|
| 47 | 1 | 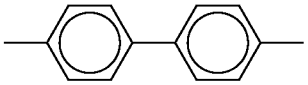 | 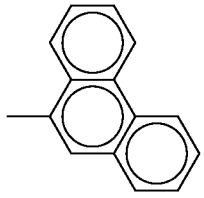 | 4 | 0 | 1 | —CH$_2$— |
| 48 | 1 | 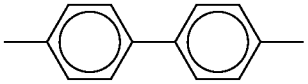 | 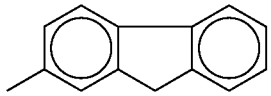 | 4 | 0 | 1 | 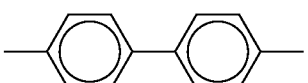 |
| 49 | 1 |  | 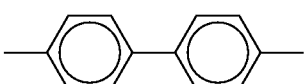 | 4 | 0 | 1 | 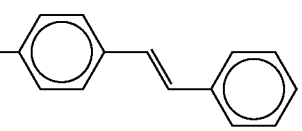 |
| 50 | 1 | 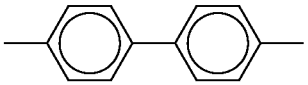 | 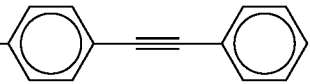 | 4 | 0 | 1 | —CH$_2$CH$_2$— |
| 51 | 1 | | | 4 | 0 | 1 | —CH$_2$CH$_2$— |

TABLE 8-continued
| Structure | k | X | Ar | Bonding Point | i | j | T |
|---|---|---|---|---|---|---|---|
| 52 | 1 | 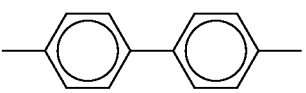 | 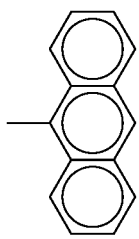 | 4 | 0 | 1 | —CH$_2$CH$_2$— |
TABLE 9
| Structure | k | X | Ar | Bonding Point | i | j | T |
|---|---|---|---|---|---|---|---|
| 53 | 1 | 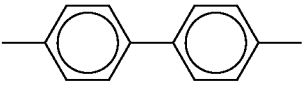 | 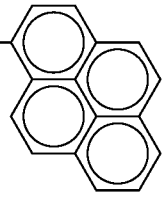 | 4 | 0 | 1 | —CH$_2$CH$_2$— |
| 54 | 1 | 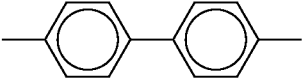 | 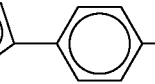 | 2 | 0 | 1 | —CH$_2$CH$_2$— |
| 55 | 1 | 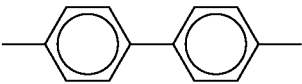 | 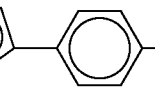 | 3 | 0 | 1 | —CH$_2$CH$_2$— |
| 56 | 1 | 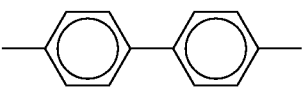 | 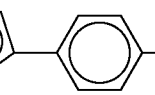 | 4 | 0 | 1 | —CH$_2$— |
| 57 | 1 | 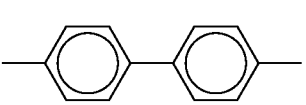 | 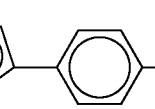 | 4 | 0 | 1 | —CH$_2$CH$_2$— |
| 58 | 1 | 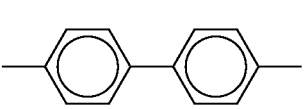 | 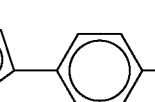 | 4 | 0 | 1 | —(CH$_2$)$_4$— |

TABLE 10
| Structure | k | X | Ar | Bonding Point | i | j | T |
|---|---|---|---|---|---|---|---|
| 59 | 1 | 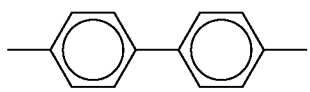 | 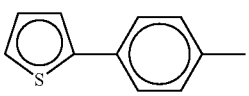 | 4 | 0 | 1 | 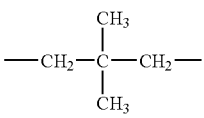 |
| 60 | 1 | 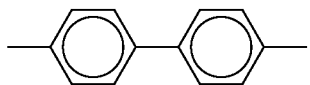 | 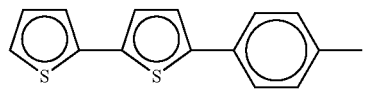 | 4 | 0 | 1 | —CH$_2$CH$_2$— |
| 61 | 1 | 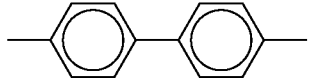 | 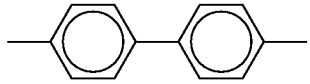 | 4 | 0 | 1 | —CH$_2$CH$_2$— |
| 62 | 1 | 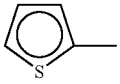 | 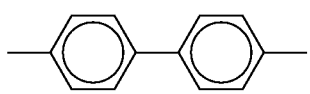 | 3 | 0 | 1 | —CH$_2$CH$_2$— |
| 63 | 1 | 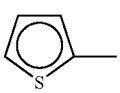 | 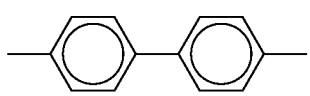 | 4 | 0 | 1 | —CH$_2$CH$_2$— |
| 64 | 1 | 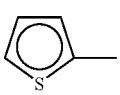 | 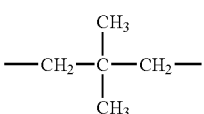 | 4 | 0 | 1 | 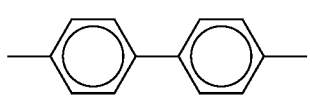 |
| 65 | 1 | 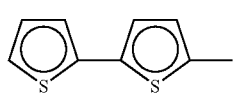 | | 3 | 0 | 1 | —CH$_2$CH$_2$— |

TABLE 11
| Structure | k | X | Ar | Bonding Point | i | j | T |
|---|---|---|---|---|---|---|---|
| 66 | 1 | 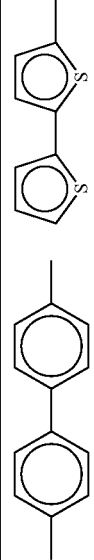 | 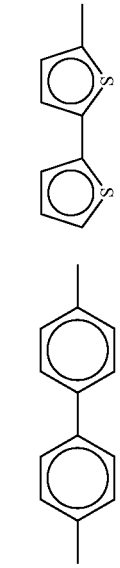 | 4 | 0 | 1 | —CH$_2$CH$_2$— |
| 67 | 1 | 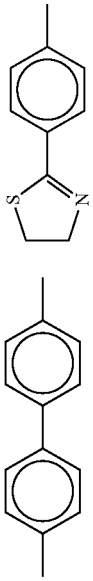 | 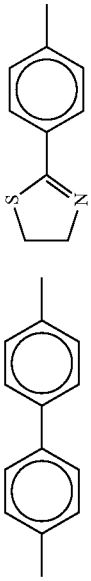 | 4 | 0 | 1 | —(CH$_2$)$_3$— |
| 68 | 1 | | | 4 | 0 | 1 | —CH$_2$CH$_2$— |
| 69 | 1 | | | 4 | 0 | 1 | —CH$_2$—C(CH$_3$)(CH$_3$)—CH$_2$— |
| 70 | 1 | | 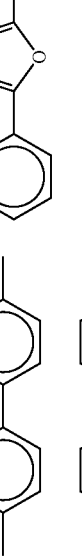 | 4 | 0 | 1 | —CH$_2$CH$_2$— |
| 71 | 1 | | 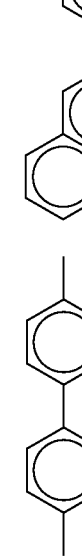 | 4 | 0 | 1 | —CH$_2$CH$_2$— |
| 72 | 1 | |  | 4 | 0 | 1 | —CH$_2$CH$_2$— |

TABLE 12
| Structure | k | X | Ar | Bonding Point | i | j | T |
|---|---|---|---|---|---|---|---|
| 73 | 1 | 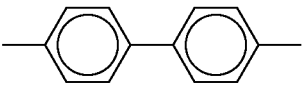 | 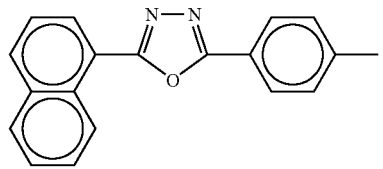 | 3 | 0 | 1 | —CH$_2$— |
| 74 | 1 | 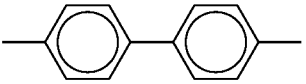 | 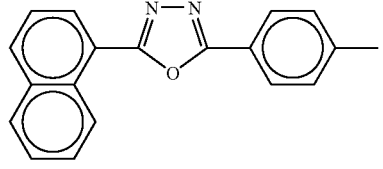 | 3 | 0 | 1 | —CH$_2$CH$_2$— |
| 75 | 1 | 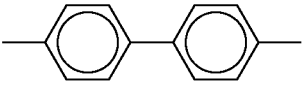 | 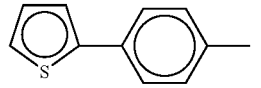 | 4 | 0 | 0 | — |
| 76 | 1 | 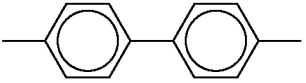 | 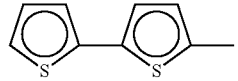 | 4 | 0 | 0 | — |
| 77 | 1 | 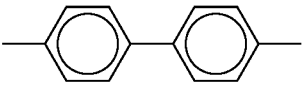 | 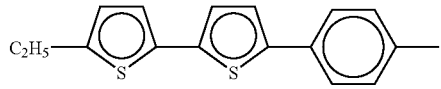 | 4 | 0 | 0 | — |
| 78 | 1 | 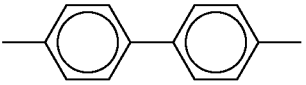 | 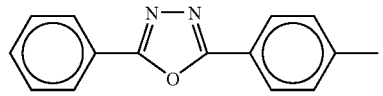 | 4 | 0 | 0 | — |
TABLE 13
| Structure | k | X | Ar | Bonding Point | i | j | T |
|---|---|---|---|---|---|---|---|
| 79 | 1 | 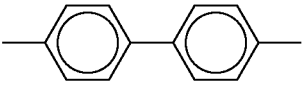 | 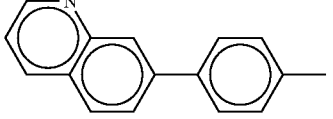 | 4 | 0 | 1 | — |
| 80 | 1 | 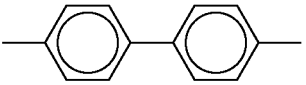 | 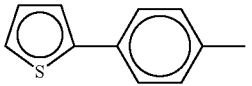 | 4 | 0 | 1 | —CH$_2$— |
| 81 | 1 | 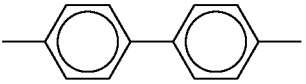 | 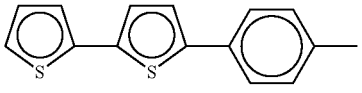 | 4 | 0 | 1 | —CH$_2$— |
| 82 | 1 | 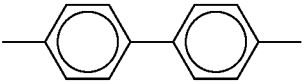 | 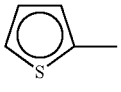 | 4 | 0 | 1 | —CH$_2$— |
| 83 | 1 | 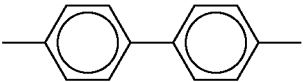 | 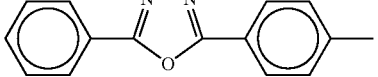 | 4 | 0 | 1 | —CH$_2$— |

TABLE 13-continued
| Structure | k | X | Ar | Bonding Point | i | j | T |
|---|---|---|---|---|---|---|---|
| 84 | 1 | 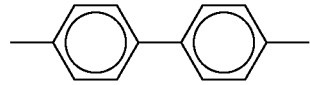 | 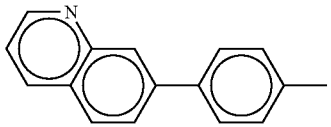 | 4 | 0 | 1 | —CH$_2$— |
| 85 | 1 | 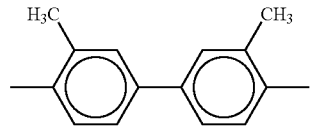 | 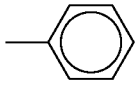 | 4 | 0 | 1 | —CH$_2$CH$_2$— |
TABLE 14
| Structure | k | X | Ar | Bonding Point | i | j | T |
|---|---|---|---|---|---|---|---|
| 86 | 1 | 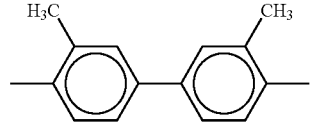 | 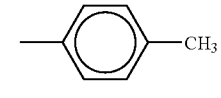 | 4 | 0 | 1 | —CH$_2$CH$_2$— |
| 87 | 1 | 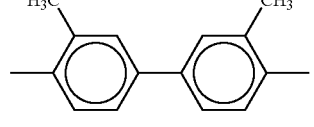 | 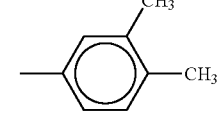 | 4 | 0 | 1 | —CH$_2$CH$_2$— |
| 88 | 1 | 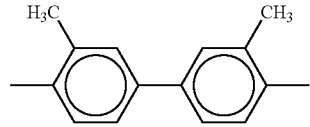 | 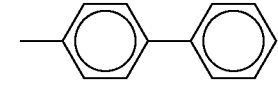 | 4 | 0 | 1 | —CH$_2$CH$_2$— |
| 89 | 1 | 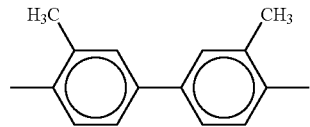 | 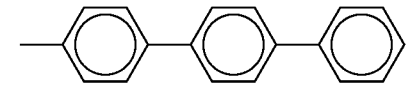 | 4 | 0 | 1 | —CH$_2$CH$_2$— |

TABLE 14-continued
| Structure | k | X | Ar | Bonding Point | i | j | T |
|---|---|---|---|---|---|---|---|
| 90 | 1 | 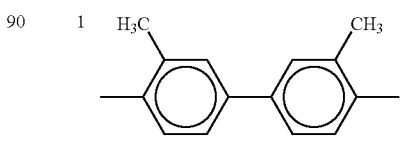 | 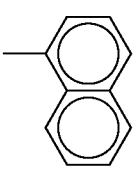 | 4 | 0 | 1 | —CH$_2$CH$_2$— |
| 91 | 1 | 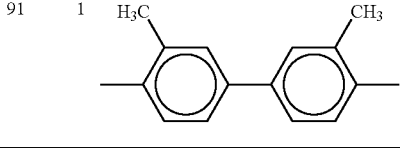 | 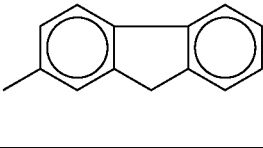 | 4 | 0 | 1 | —CH$_2$CH$_2$— |
TABLE 15
| Structure | k | X | Ar | Bonding Point | i | j | T |
|---|---|---|---|---|---|---|---|
| 92 | 1 | 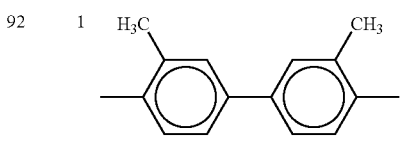 | 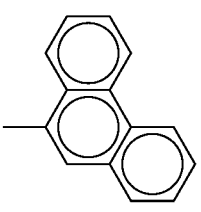 | 4 | 0 | 1 | —CH$_2$CH$_2$— |
| 93 | 1 | 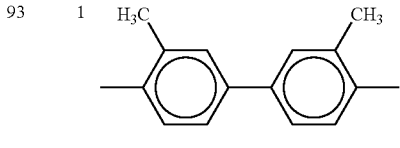 | 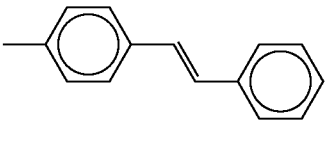 | 4 | 0 | 1 | —CH$_2$CH$_2$— |
| 94 | 1 | 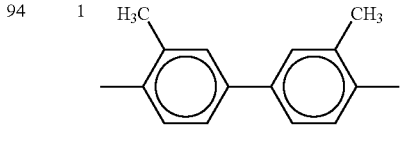 | 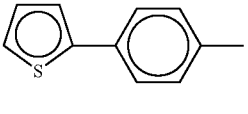 | 4 | 0 | 1 | —CH$_2$CH$_2$— |
| 95 | 1 | 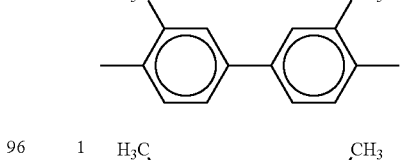 | 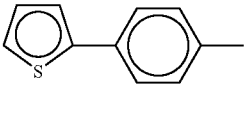 | 4 | 0 | 1 | —CH$_2$CH$_2$— |
| 96 | 1 | 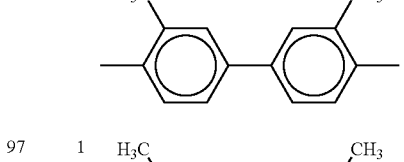 | 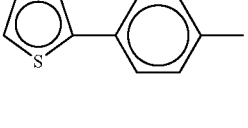 | 4 | 0 | 1 | —(CH$_2$)$_4$— |
| 97 | 1 | 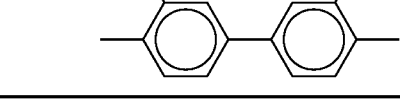 |  | 4 | 0 | 1 | $-CH_2-\underset{\underset{CH_3}{\vert}}{\overset{\overset{CH_3}{\vert}}{C}}-CH_2-$ |

TABLE 16

| Structure | k | X | Ar | Bonding Point | i | j | T |
|---|---|---|---|---|---|---|---|
| 98 | 1 | 3,3'-dimethylbiphenyl-4,4'-diyl | bithiophene-phenylene | 4 | 0 | 1 | —CH₂CH₂— |
| 99 | 1 | 3,3'-dimethylbiphenyl-4,4'-diyl | bithiophene-phenylene | 4 | 0 | 1 | —CH₂CH₂— |
| 100 | 1 | 3,3'-dimethylbiphenyl-4,4'-diyl | bithiophene-phenylene | 4 | 0 | 1 | —CH₂— |
| 101 | 1 | 3,3'-dimethylbiphenyl-4,4'-diyl | thiophene | 4 | 0 | 1 | —CH₂CH₂— |
| 102 | 1 | 3,3'-dimethylbiphenyl-4,4'-diyl | thiophene | 4 | 0 | 1 | —CH₂CH₂— |
| 103 | 1 | 3,3'-dimethylbiphenyl-4,4'-diyl | bithiophene | 4 | 0 | 1 | —CH₂CH₂— |
| 104 | 1 | 3,3'-dimethylbiphenyl-4,4'-diyl | bithiophene | 4 | 0 | 1 | —CH₂CH₂— |

TABLE 17
| Structure | k | X | Ar | Bonding Point | i | j | T |
|---|---|---|---|---|---|---|---|
| 105 | 1 |  |  | 4 | 0 | 1 | —CH₂CH₂— |
| 106 | 1 |  |  | 4 | 0 | 1 | 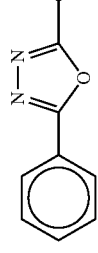 |
| 107 | 1 |  | 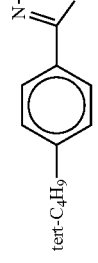 | 4 | 0 | 1 | —CH₂CH₂— |
| 108 | 1 |  |  | 4 | 0 | 1 | —CH₂— |
| 109 | 1 |  |  | 4 | 0 | 1 | —CH₂CH₂— |
| 110 | 1 |  |  | 4 | 0 | 0 | — |
| 111 | 1 |  | 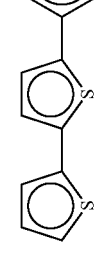 | 4 | 0 | 0 | — |

TABLE 18
| Structure | k | X | Ar | Bonding Point | i | j | T |
|---|---|---|---|---|---|---|---|
| 112 | 1 | 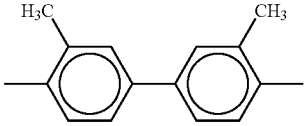 | 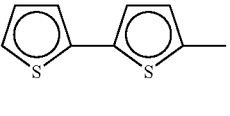 | 4 | 0 | 0 | — |
| 113 | 1 | 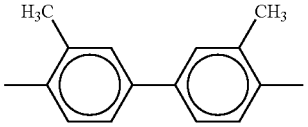 | 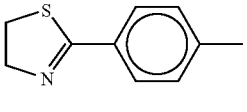 | 4 | 0 | 0 | — |
| 114 | 1 | 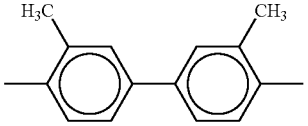 | 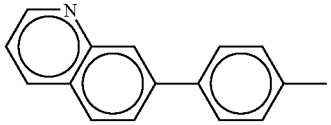 | 4 | 0 | 0 | — |
| 115 | 1 | 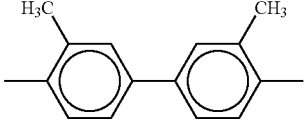 | 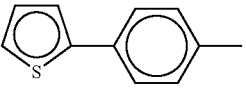 | 4 | 0 | 1 | —$CH_2$— |
| 116 | 1 | 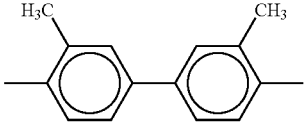 | 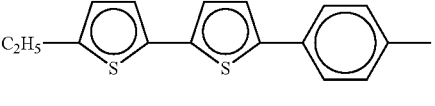 | 4 | 0 | 1 | —$CH_2$— |
| 117 | 1 | 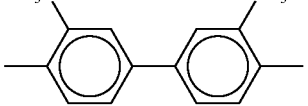 | 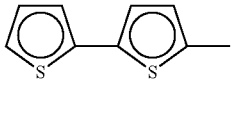 | 4 | 0 | 1 | —$CH_2$— |
| 118 | 1 | 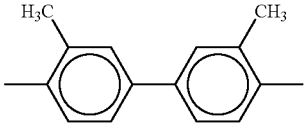 | 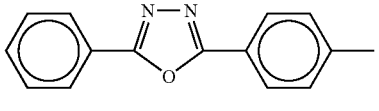 | 4 | 0 | 1 | —$CH_2$— |

TABLE 19

| Structure | k | X | Ar | Bonding Point | i | j | T |
|---|---|---|---|---|---|---|---|
| 119 | 1 | H₃C—⟨⟩—⟨⟩—CH₃ (with CH₃) | oxadiazole-biphenyl with tert-C₄H₉ | 4 | 0 | 1 | —CH₂— |
| 120 | 1 | H₃CO—⟨⟩—⟨⟩— (with OCH₃) | methylthiophene | 4 | 0 | 1 | —CH₂CH₂— |
| 121 | 1 | H₃CO—⟨⟩—⟨⟩— (with OCH₃) | tolyl-thiophene | 4 | 0 | 1 | —CH₂— |
| 122 | 1 | H₃CO—⟨⟩—⟨⟩— (with OCH₃) | tolyl-thiophene | 4 | 0 | 1 | —CH₂CH₂— |
| 123 | 1 | H₃CO—⟨⟩—⟨⟩— (with OCH₃) | tolyl-phenyl-thiophene | 4 | 0 | 1 | —CH₂CH₂— |
| 124 | 1 | H₃CO—⟨⟩—⟨⟩— (with OCH₃) | tolyl-phenyl-thiophene | 4 | 0 | 1 | neopentyl C(CH₃)₂(CH₂—)₂ |
| 125 | 1 | H₃CO—⟨⟩—⟨⟩— (with OCH₃) | tolyl-phenyl-thiophene | 4 | 0 | 0 | — |

TABLE 20
| Structure | k | X | Ar | Bonding Point | i | j | T |
|---|---|---|---|---|---|---|---|
| 126 | 1 | 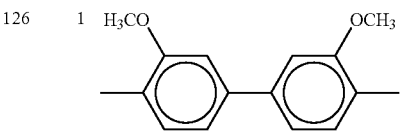 | 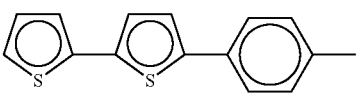 | 4 | 0 | 1 | —CH$_2$— |
| 127 | 1 | 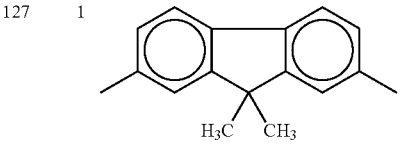 | 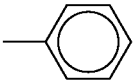 | 4 | 0 | 1 | —CH$_2$CH$_2$— |
| 128 | 1 | 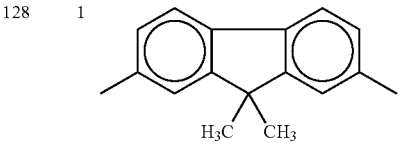 | 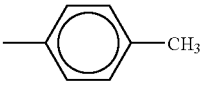 | 4 | 0 | 1 | —CH$_2$CH$_2$— |
| 129 | 1 | 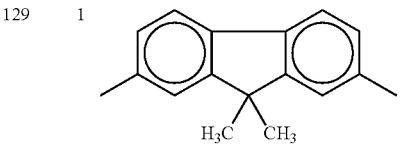 | 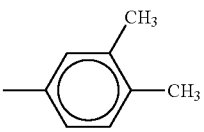 | 4 | 0 | 1 | —CH$_2$CH$_2$— |
| 130 | 1 | 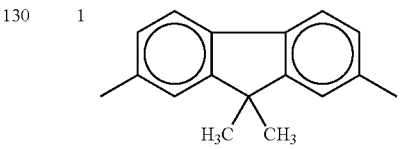 | 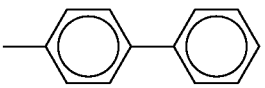 | 4 | 0 | 1 | —CH$_2$CH$_2$— |
| 131 | 1 | 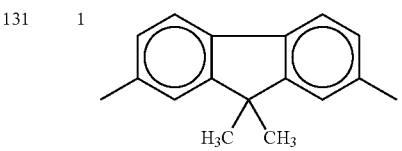 | 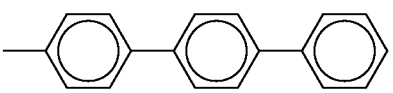 | 4 | 0 | 1 | —CH$_2$CH$_2$— |
| 132 | 1 | 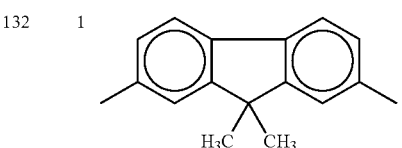 | 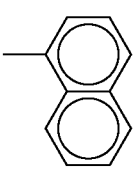 | 4 | 0 | 1 | —CH$_2$CH$_2$— |
TABLE 21
| Structure | k | X | Ar | Bonding Point | i | j | T |
|---|---|---|---|---|---|---|---|
| 133 | 1 | 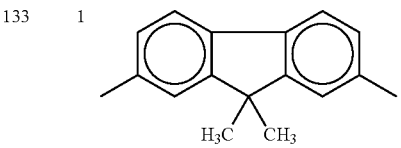 | 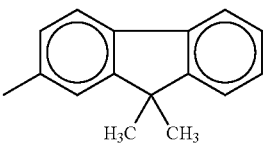 | 4 | 0 | 1 | —CH$_2$CH$_2$— |

TABLE 21-continued
| Structure | k | X | Ar | Bonding Point | i | j | T |
|---|---|---|---|---|---|---|---|
| 134 | 1 | 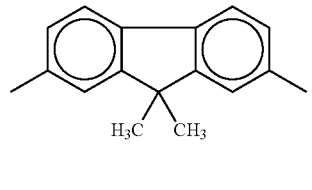 | 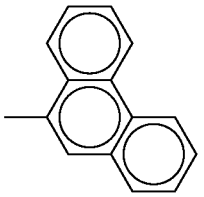 | 4 | 0 | 1 | —CH$_2$CH$_2$— |
| 135 | 1 | 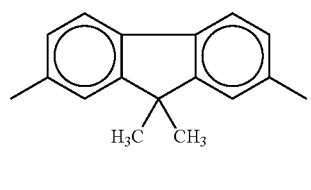 | 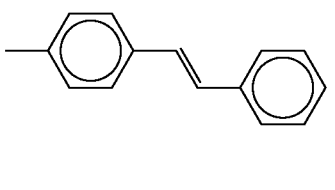 | 4 | 0 | 1 | —CH$_2$CH$_2$— |
| 136 | 1 | 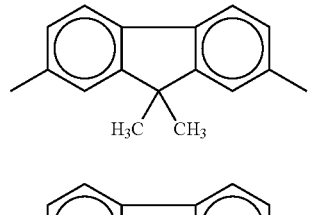 | 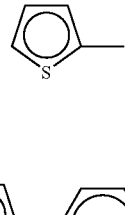 | 4 | 0 | 1 | —CH$_2$CH$_2$— |
| 137 | 1 | 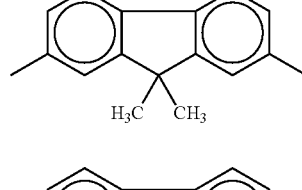 | 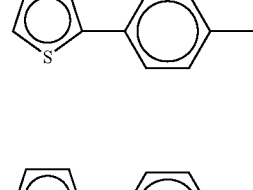 | 4 | 0 | 1 | —CH$_2$CH$_2$— |
| 138 | 1 | 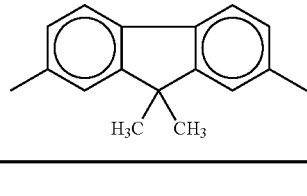 | 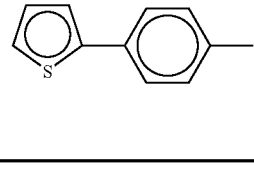 | 4 | 0 | 1 | —(CH$_2$)$_4$— |
TABLE 22
| Structure | k | X | Ar | Bonding Point | i | j | T |
|---|---|---|---|---|---|---|---|
| 139 | 1 | 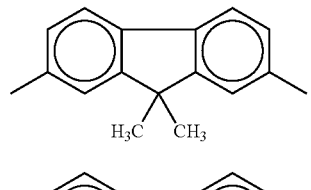 | 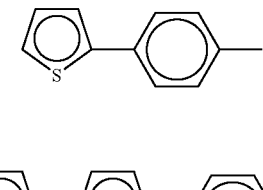 | 4 | 0 | 1 | —CH$_2$—C(CH$_3$)$_2$—CH$_2$— |
| 140 | 1 | 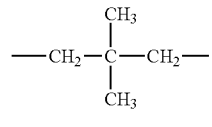 | 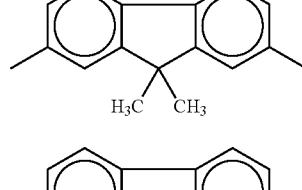 | 4 | 0 | 1 | —CH$_2$CH$_2$— |
| 141 | 1 | 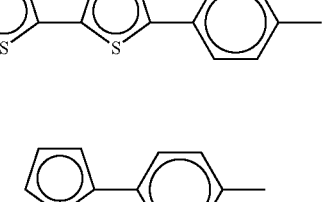 | 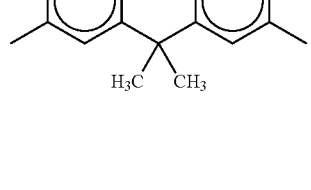 | 4 | 0 | 0 | — |

TABLE 22-continued

| Structure | k | X | Ar | Bonding Point | i | j | T |
|---|---|---|---|---|---|---|---|
| 142 | 1 | 9,9-dimethyl-2,7-disubstituted fluorene | thiophene-phenyl | 4 | 0 | 1 | —CH$_2$— |
| 143 | 1 | 2,7-disubstituted carbazole (NH) | phenyl | 3 | 0 | 0 | — |
| 144 | 1 | 2,7-disubstituted carbazole (NH) | phenyl | 4 | 0 | 0 | — |
| 145 | 1 | 2,7-disubstituted carbazole (NH) | phenyl | 4 | 0 | 1 | —CH$_2$CH$_2$— |

TABLE 23

| Structure | k | X | Ar | Bonding Point | i | j | T |
|---|---|---|---|---|---|---|---|
| 146 | 1 | 2,7-disubstituted carbazole (NH) | —C$_6$H$_4$—CH$_3$ | 4 | 1 | 0 | — |
| 147 | 1 | 2,7-disubstituted carbazole (NH) | dimethylphenyl | 4 | 0 | 1 | —CH$_2$— |
| 148 | 1 | 2,7-disubstituted carbazole (NH) | —C$_6$H$_4$—OCH$_3$ | 4 | 0 | 1 | —CH$_2$—C(CH$_3$)$_2$—CH$_2$— |
| 149 | 1 | 2,7-disubstituted carbazole (NH) | biphenyl | 4 | 0 | 1 | —CH$_2$CH$_2$— |
| 150 | 1 | 2,7-disubstituted carbazole (NH) | terphenyl | 4 | 0 | 1 | —CH$_2$CH$_2$— |
| 151 | 1 | 2,7-disubstituted carbazole (NH) | naphthyl | 4 | 0 | 1 | —CH$_2$CH$_2$— |

TABLE 24
| Structure | k | X | Ar | Bonding Point | i | j | T |
|---|---|---|---|---|---|---|---|
| 152 | 1 | 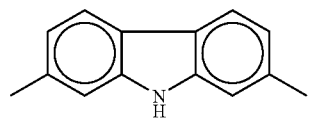 | 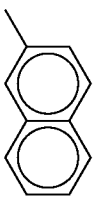 | 4 | 0 | 1 | —CH₂CH₂— |
| 153 | 1 | 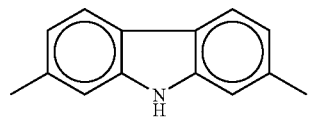 | 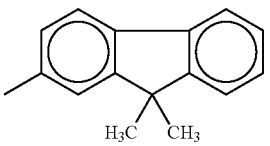 | 4 | 0 | 1 | —CH₂CH₂— |
| 154 | 1 | 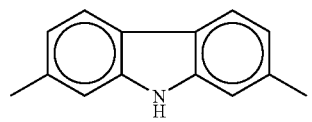 | 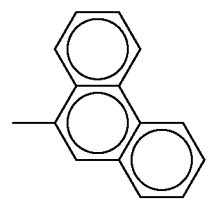 | 4 | 0 | 1 | —CH₂CH₂— |
| 155 | 1 | 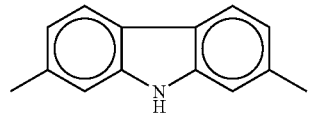 | 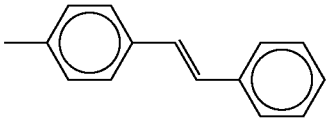 | 4 | 0 | 1 | —CH₂CH₂— |
| 156 | 1 | 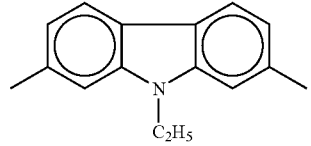 | 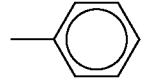 | 4 | 0 | 1 | —CH₂CH₂— |
| 157 | 1 | 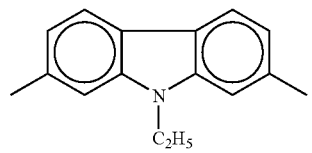 | 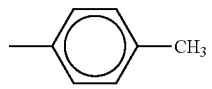 | 4 | 0 | 1 | —CH₂CH₂— |
TABLE 25
| Structure | k | X | Ar | Bonding Point | i | j | T |
|---|---|---|---|---|---|---|---|
| 158 | 1 | 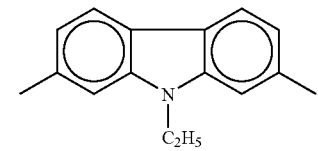 | 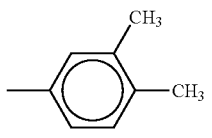 | 4 | 0 | 1 | —CH₂CH₂— |
| 159 | 1 | 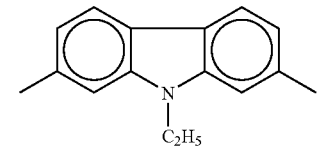 | 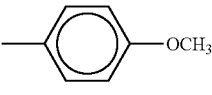 | 4 | 0 | 1 | —CH₂CH₂— |

TABLE 25-continued
| Structure | k | X | Ar | Bonding Point | i | j | T |
|---|---|---|---|---|---|---|---|
| 160 | 1 | 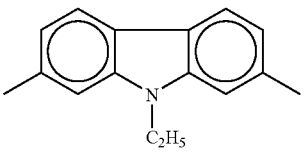 | 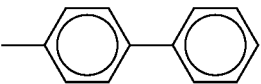 | 4 | 0 | 1 | —CH$_2$CH$_2$— |
| 161 | 1 | 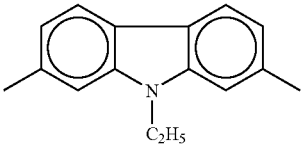 | 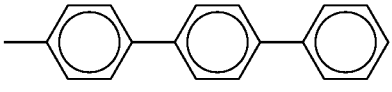 | 4 | 0 | 1 | —CH$_2$CH$_2$— |
| 162 | 1 | 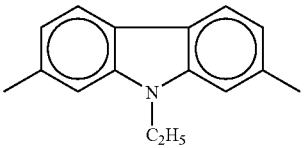 | 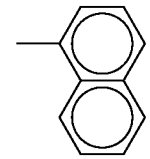 | 4 | 0 | 1 | —CH$_2$CH$_2$— |
| 163 | 1 | 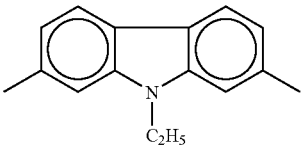 | 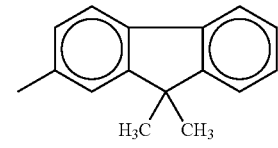 | 4 | 0 | 1 | —CH$_2$CH$_2$— |
TABLE 26
| Structure | k | X | Ar | Bonding Point | i | j | T |
|---|---|---|---|---|---|---|---|
| 164 | 1 | 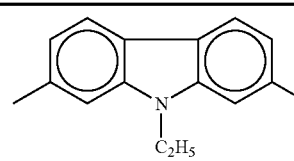 | 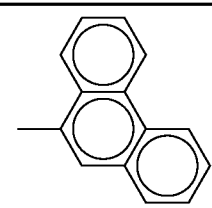 | 4 | 0 | 1 | —CH$_2$CH$_2$— |
| 165 | 1 | 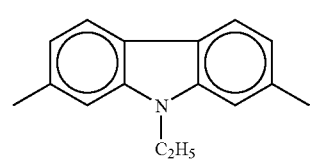 | 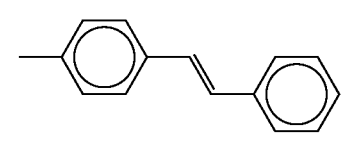 | 4 | 0 | 1 | —CH$_2$CH$_2$— |
| 166 | 1 | 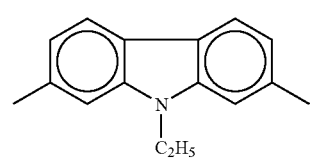 | 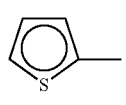 | 4 | 0 | 1 | —CH$_2$CH$_2$— |
| 167 | 1 | 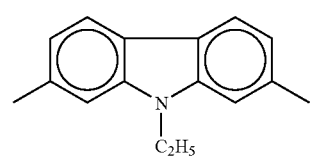 | 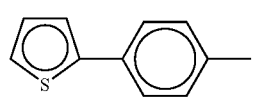 | 4 | 0 | 1 | —CH$_2$CH$_2$— |

TABLE 26-continued
| Structure | k | X | Ar | Bonding Point | i | j | T |
|---|---|---|---|---|---|---|---|
| 168 | 1 | 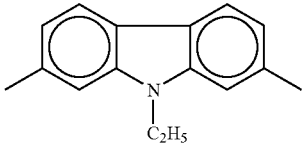 | 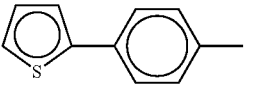 | 4 | 0 | 1 | —CH$_2$CH$_2$— |
| 169 | 1 | 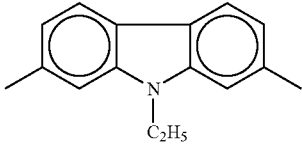 | 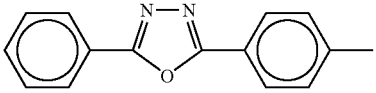 | 4 | 0 | 1 | —CH$_2$CH$_2$— |
TABLE 27
| Structure | k | X | Ar | Bonding Point | i | j | T |
|---|---|---|---|---|---|---|---|
| 170 | 1 | 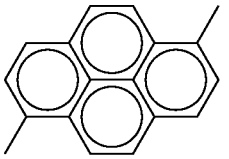 | 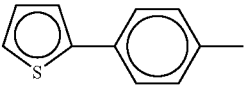 | 4 | 0 | 1 | —CH$_2$CH$_2$— |
| 171 | 1 | 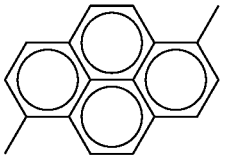 | 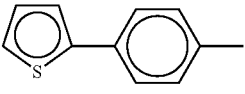 | 4 | 0 | 0 | — |
| 172 | 1 | 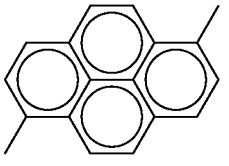 | 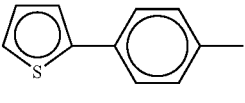 | 4 | 0 | 1 | —CH$_2$— |
| 173 | 1 |  | 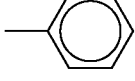 | 4 | 0 | 0 | — |
| 174 | 1 |  |  | 4 | 1 | 0 | — |
| 175 | 1 |  | 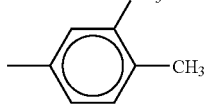 | 4 | 0 | 1 | —CH$_2$CH$_2$— |
| 176 | 1 |  | 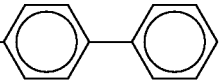 | 4 | 0 | 1 | —CH$_2$CH$_2$— |

TABLE 28
| Structure | k | X | Ar |
|---|---|---|---|
| 177 | 1 | 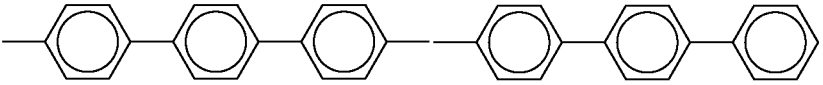 | 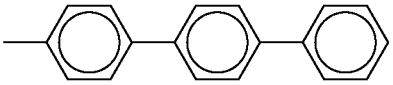 |
| 178 | 1 |  | 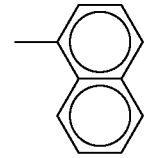 |
| 179 | 1 |  | 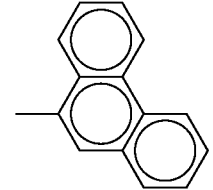 |
| 180 | 1 |  | 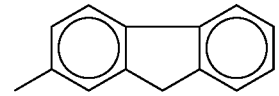 |
| 181 | 1 |  | 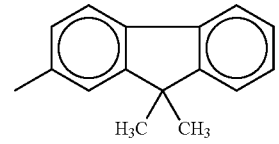 |
| 182 | 1 |  | 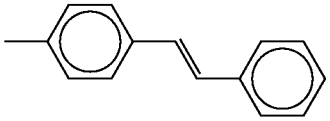 |
| Structure | Bond-Point | i | j | T |
|---|---|---|---|---|
| 177 | 4 | 0 | 1 | —CH$_2$CH$_2$— |
| 178 | 4 | 0 | 1 | —CH$_2$CH$_2$— |
| 179 | 4 | 0 | 1 | —CH$_2$CH$_2$— |
| 180 | 4 | 0 | 1 | —CH$_2$CH$_2$— |
| 181 | 4 | 0 | 1 | —CH$_2$CH$_2$— |
| 182 | 4 | 0 | 1 | —CH$_2$CH$_2$— |
TABLE 29
| Structure | k | X | Ar | Bonding Point | i | j | T |
|---|---|---|---|---|---|---|---|
| 183 | 1 |  | 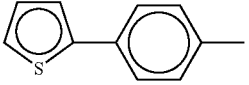 | 4 | 0 | 1 | —CH$_2$CH$_2$— |
| 184 | 1 | 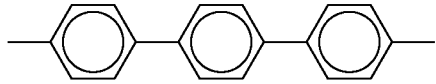 | 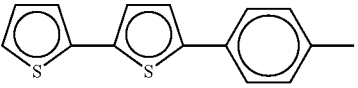 | 4 | 0 | 1 | —CH$_2$CH$_2$— |
| 185 | 1 | 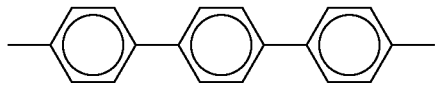 | 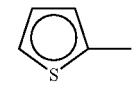 | 4 | 0 | 1 | —CH$_2$— |

TABLE 29-continued

| Structure | k | X | Ar | Bonding Point | i | j | T |
|---|---|---|---|---|---|---|---|
| 186 | 1 | (triphenyl) | (thiophene) | 4 | 0 | 1 | —CH$_2$CH$_2$— |
| 187 | 1 | (triphenyl) | (bithiophene) | 4 | 0 | 1 | —CH$_2$CH$_2$— |
| 188 | 1 | (triphenyl) | (phenyl-oxadiazole-phenyl) | 4 | 0 | 1 | —CH$_2$CH$_2$— |
| 189 | 1 | (triphenyl) | (bithiophene) | 4 | 0 | 0 | — |

TABLE 30

| Structure | k | X | Ar |
|---|---|---|---|
| 190 | 1 | (triphenyl) | (bithiophene) |
| 191 | 1 | (phenyl-thiophene-phenyl) | (phenyl) |
| 192 | 1 | (phenyl-thiophene-phenyl) | (dimethylphenyl, CH$_3$, CH$_3$) |
| 193 | 1 | (phenyl-thiophene-phenyl) | (biphenyl) |
| 194 | 1 | (phenyl-thiophene-phenyl) | (terphenyl) |
| 195 | 1 | (phenyl-thiophene-phenyl) | (naphthyl) |

TABLE 30-continued
| | | | | | | |
|---|---|---|---|---|---|---|
| 196 | 1 | 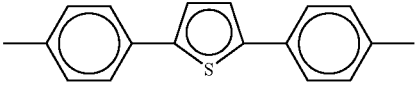 | | 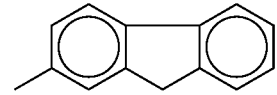 | | |
| Structure | Bonding Point | i | j | T |
|---|---|---|---|---|
| 190 | 4 | 0 | 1 | —CH$_2$— |
| 191 | 4 | 0 | 1 | —CH$_2$— |
| 192 | 4 | 0 | 1 | —CHCH$_2$— |
| 193 | 4 | 0 | 1 | —CH$_2$—C(CH$_3$)(CH$_3$)—CH$_2$— |
| 194 | 4 | 0 | 1 | —CH$_2$CH$_2$— |
| 195 | 4 | 0 | 1 | —CH$_2$CH$_2$— |
| 196 | 4 | 0 | 1 | —CH$_2$CH$_2$— |
TABLE 31
| Structure | k | X | Ar | Bonding Point | i | j | T |
|---|---|---|---|---|---|---|---|
| 197 | 1 | 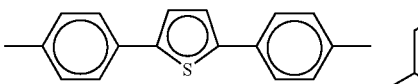 | 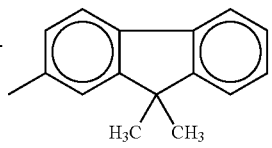 | 4 | 0 | 1 | —CH$_2$CH$_2$— |
| 198 | 1 | 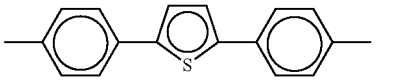 | 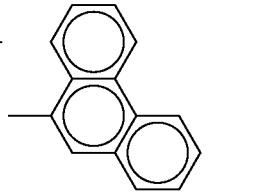 | 4 | 0 | 1 | —CH$_2$CH$_2$— |
| 199 | 1 | 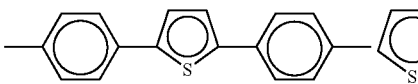 | | 4 | 0 | 1 | —CH$_2$CH$_2$— |
| 200 | 1 | 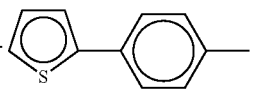 | | 4 | 0 | 1 | —CH$_2$CH$_2$— |
| 201 | 1 | 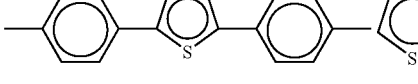 | | 4 | 0 | 1 | —CH$_2$CH$_2$— |
| 202 | 1 | 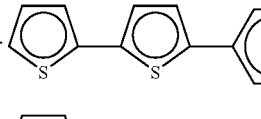 | | 4 | 0 | 1 | —(CH$_2$)$_3$— |
TABLE 32
| Structure | k | X | Ar | Bonding Point | i | j | T |
|---|---|---|---|---|---|---|---|
| 203 | 1 | 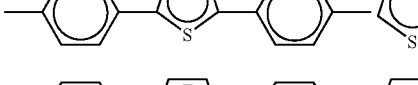 | | 4 | 0 | 1 | —CH$_2$CH$_2$— |

TABLE 32-continued
| Structure | k | X | Ar | Bonding Point | i | j | T |
|---|---|---|---|---|---|---|---|
| 204 | 1 | 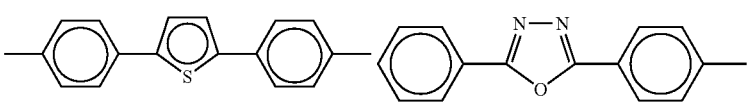 | 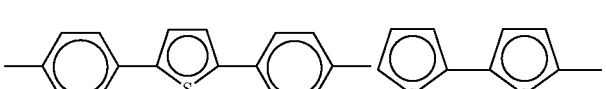 | 4 | 0 | 1 | —CH$_2$CH$_2$— |
| 205 | 1 | 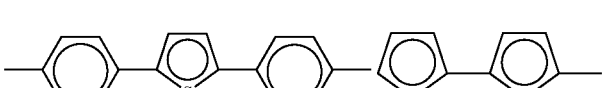 | | 4 | 0 | 0 | — |
| 206 | 1 | 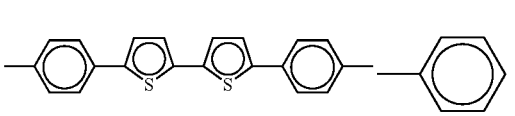 | | 4 | 0 | 1 | —CH$_2$— |
| 207 | 1 | 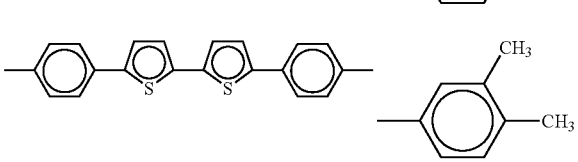 | 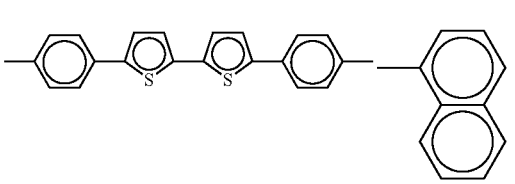 | 4 | 0 | 1 | —CH$_2$CH$_2$— |
| 208 | 1 | 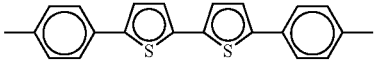 | 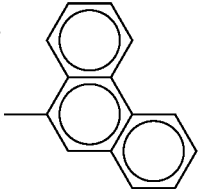 | 4 | 0 | 1 | —CH$_2$CH$_2$— |
| 209 | 1 | 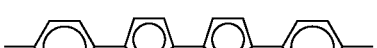 | 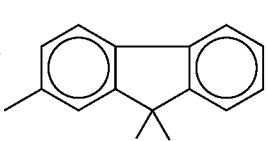 | 4 | 0 | 1 | —CH$_2$CH$_2$— |
TABLE 33
| Structure | k | X | Ar | Bonding Point | i | j | T |
|---|---|---|---|---|---|---|---|
| 210 | 1 | 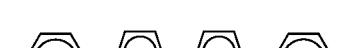 | | 4 | 0 | 1 | —CH$_2$CH$_2$— |
| 211 | 1 | 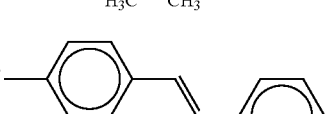 | | 4 | 0 | 1 | —CH$_2$CH$_2$— |
| 212 | 1 | 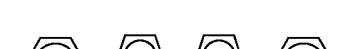 | | 4 | 0 | 1 | —CH$_2$CH$_2$— |
| 213 | 1 | 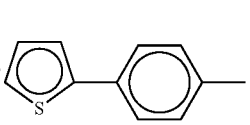 | | 4 | 0 | 1 | —CH$_2$CH$_2$— |

TABLE 33-continued

| Structure | k | X | Ar | Bonding Point | i | j | T |
|---|---|---|---|---|---|---|---|
| 214 | 1 | | (phenyl-thiophene-thiophene-phenyl-thiophene-thiophene-phenyl) | 4 | 0 | 1 | —CH₂CH₂— |
| 215 | 1 | | (phenyl-thiophene-thiophene-phenyl / thiophene) | 4 | 0 | 1 | —CH₂CH₂— |

TABLE 34

| Structure | k | X | Ar | Bonding Point | i | j | T |
|---|---|---|---|---|---|---|---|
| 216 | 1 | | (phenyl-thiophene-thiophene-phenyl-thiophene-thiophene) | 4 | 0 | 1 | —CH₂CH₂— |
| 217 | 1 | | (phenyl-thiophene-thiophene-phenyl / phenyl-oxadiazole-phenyl) | 4 | 0 | 1 | —CH₂CH₂— |
| 218 | 1 | | (phenyl-thiophene-thiophene-phenyl-thiophene-thiophene-phenyl) | 4 | 0 | 0 | — |
| 219 | 1 | | (phenyl-thiophene-thiophene-phenyl-thiophene-thiophene-phenyl) | 4 | 0 | 1 | —CH₂— |
| 220 | 1 | | (phenyl-oxadiazole-phenyl / phenyl) | 4 | 0 | 1 | —CH₂— |
| 221 | 1 | | (phenyl-oxadiazole-phenyl / dimethylphenyl) | 4 | 0 | 1 | —CH₂— |
| 222 | 1 | | (phenyl-oxadiazole-phenyl / naphthyl) | 4 | 0 | 0 | — |

TABLE 35

| Structure | k | X | Ar | Bonding Point | i | j | T |
|---|---|---|---|---|---|---|---|
| 223 | 1 | | (phenyl-oxadiazole-phenyl / phenanthryl) | 4 | 0 | 1 | —(CH₂)₃— |

TABLE 35-continued

| Structure | k | X | Ar | Bonding Point | i | j | T |
|---|---|---|---|---|---|---|---|
| 224 | 1 | (phenyl-oxadiazole-phenyl) | (9,9-dimethylfluorene, methyl-substituted) | 4 | 0 | 1 | —CH₂CH₂— |
| 225 | 1 | (phenyl-oxadiazole-phenyl) | (thiophene-phenyl) | 4 | 0 | 1 | —CH₂CH₂— |
| 226 | 1 | (phenyl-oxadiazole-phenyl) | (bithiophene-phenyl) | 4 | 0 | 1 | —CH₂CH₂— |
| 227 | 1 | (phenyl-oxadiazole-phenyl) | (thiophene) | 4 | 0 | 1 | —CH₂CH₂— |
| 228 | 1 | (phenyl-oxadiazole-phenyl) | (bithiophene) | 4 | 0 | 1 | —CH₂— |

TABLE 36

| Structure | k | X | Ar | Bonding Point | i | j | T |
|---|---|---|---|---|---|---|---|
| 229 | 1 | (phenyl-oxadiazole-phenyl) | (bithiophene) | 4 | 0 | 1 | —(CH₂)₃— |
| 230 | 1 | (phenyl-oxadiazole-phenyl) | (bithiophene) | 4 | 0 | 0 | — |
| 231 | 1 | (phenyl-oxadiazole-phenyl) | (bithiophene) | 4 | 0 | 1 | —CH₂— |
| 232 | 1 | (phenyl-CH=CH-phenyl) | (phenyl) | 4 | 0 | 1 | —CH₂CH₂— |
| 233 | 1 | (phenyl-CH=CH-phenyl) | (phenyl) | 4 | 0 | 1 | —CH₂— |
| 234 | 1 | (phenyl-CH=CH-phenyl) | (3,4-dimethylphenyl) | 4 | 0 | 1 | —CH₂— |

TABLE 36-continued
| Structure | k | X | Ar | Bonding Point | i | j | T |
|---|---|---|---|---|---|---|---|
| 235 | 1 |  |  | 4 | 0 | 1 | —CH$_2$— |
TABLE 37
| Structure | k | X | Ar | Bonding Point | i | j | T |
|---|---|---|---|---|---|---|---|
| 236 | 1 | 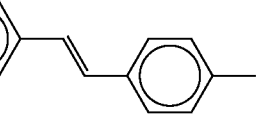 | 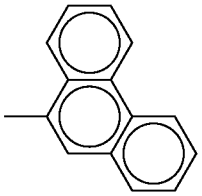 | 4 | 0 | 1 | —CH$_2$CH$_2$— |
| 237 | 1 | 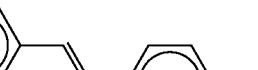 | 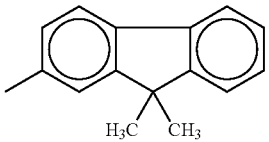 | 4 | 0 | 1 | —CH$_2$— |
| 238 | 1 |  | 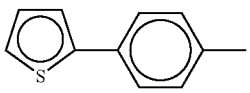 | 4 | 0 | 1 | —CH$_2$CH$_2$— |
| 239 | 1 |  | 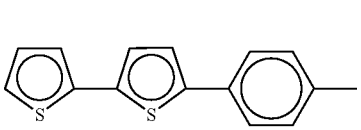 | 4 | 0 | 1 | —CH$_2$CH$_2$— |
| 240 | 1 |  | 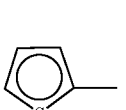 | 4 | 0 | 1 | —CH$_2$CH$_2$— |
| 241 | 1 |  | 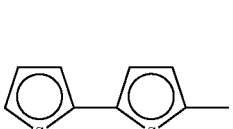 | 4 | 0 | 1 | —CH$_2$— |
TABLE 38
| Structure | k | X | Ar | Bonding Point | i | j | T |
|---|---|---|---|---|---|---|---|
| 242 | 1 |  |  | 4 | 0 | 1 | —(CH$_2$)$_3$— |

TABLE 38-continued
| Structure | k | X | Ar | Bonding Point | i | j | T |
|---|---|---|---|---|---|---|---|
| 243 | 1 | 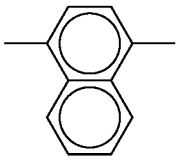 | 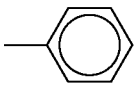 | 4 | 0 | 1 | —CH$_2$CH$_2$— |
| 244 | 1 | 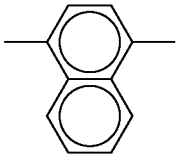 | 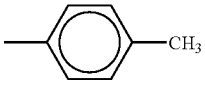 | 4 | 0 | 1 | —CH$_2$— |
| 245 | 1 | 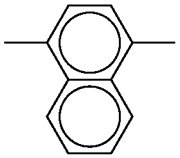 | 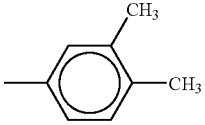 | 4 | 0 | 1 | —CH$_2$— |
| 246 | 1 | 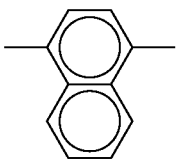 | 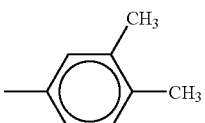 | 4 | 0 | 1 | —CH$_2$— |
| 247 | 1 | 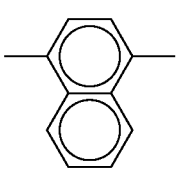 | 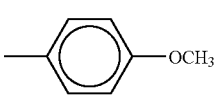 | 4 | 0 | 1 | —CH$_2$CH$_2$— |
TABLE 39
| Structure | k | X | Ar | Bonding Point | i | j | T |
|---|---|---|---|---|---|---|---|
| 248 | 1 | 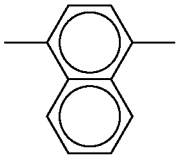 |  | 4 | 0 | 1 | —CH$_2$— |
| 249 | 1 | 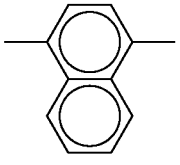 |  | 4 | 0 | 1 | —CH$_2$— |
| 250 | 1 | 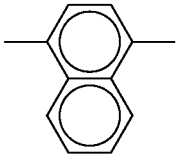 | 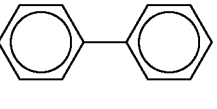 | 4 | 0 | 1 | —CH$_2$— |

TABLE 39-continued
| Structure | k | X | Ar | Bonding Point | i | j | T |
|---|---|---|---|---|---|---|---|
| 251 | 1 | 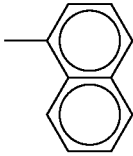 | 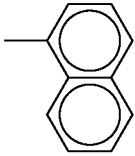 | 4 | 0 | 1 | —CH$_2$CH$_2$— |
| 252 | 1 | 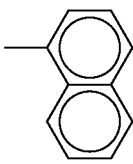 | 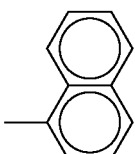 | 4 | 0 | 1 | —CH$_2$— |
TABLE 40
| Structure | k | X | Ar | Bonding Point | i | j | T |
|---|---|---|---|---|---|---|---|
| 253 | 1 | 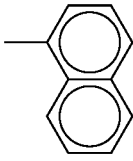 | 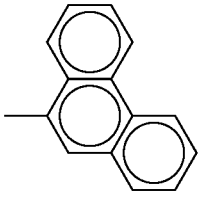 | 4 | 0 | 1 | —CH$_2$— |
| 254 | 1 | 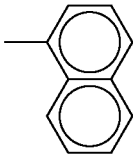 | 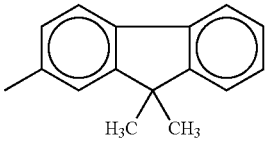 | 4 | 0 | 1 | —CH$_2$— |
| 255 | 1 | 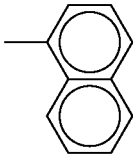 | 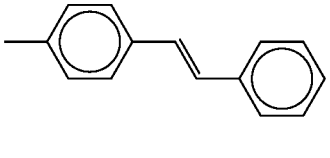 | 4 | 0 | 1 | —CH$_2$CH$_2$— |
| 256 | 1 | 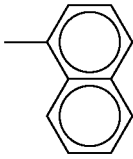 | 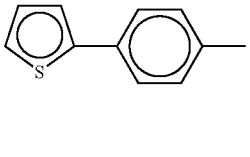 | 4 | 1 | 1 | —CH$_2$— |
| 257 | 1 | 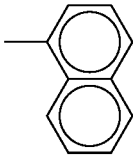 | 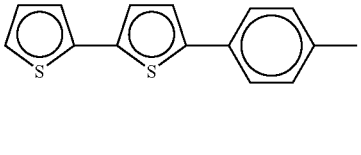 | 4 | 0 | 1 | —CH$_2$— |

TABLE 40-continued

| Structure | k | X | Ar | Bonding Point | i | j | T |
|---|---|---|---|---|---|---|---|
| 258 | 1 | naphthalene | thiophene | 4 | 0 | 1 | —CH₂CH₂— |

TABLE 41

| Structure | k | X | Ar | Bonding Point | i | j | T |
|---|---|---|---|---|---|---|---|
| 259 | 1 | naphthalene | bithiophene | 4 | 0 | 1 | —CH₂— |
| 260 | 1 | naphthalene | phenyl-oxadiazole-phenyl | 4 | 0 | 1 | —CH₂CH₂— |
| 261 | 1 | naphthalene | bithiophene-phenyl | 4 | 0 | 1 | —(CH₂)₃— |
| 262 | 1 | anthracene | phenyl | 4 | 0 | 1 | —CH₂CH₂— |
| 263 | 1 | anthracene | p-tolyl (—C₆H₄—CH₃) | 4 | 0 | 1 | —CH₂CH₂— |

TABLE 42
| Structure | k | X | Ar | Bonding Point | i | j | T |
|---|---|---|---|---|---|---|---|
| 264 | 1 | 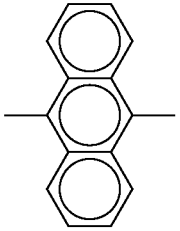 | 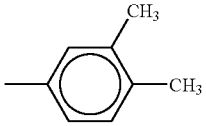 | 4 | 0 | 1 | —CH$_2$— |
| 265 | 1 | 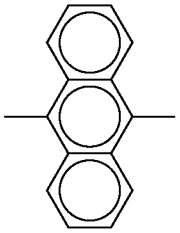 | 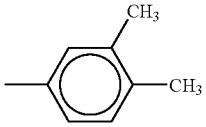 | 4 | 0 | 1 | —CH$_2$CH$_2$— |
| 266 | 1 | 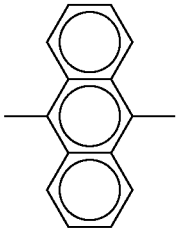 | 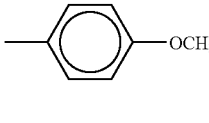 | 4 | 0 | 1 | —CH$_2$— |
| 267 | 1 | 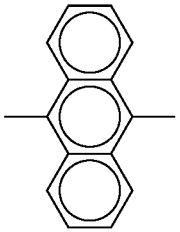 | 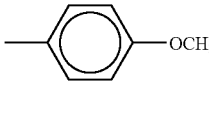 | 4 | 0 | 1 | —CH$_2$CH$_2$— |
| 268 | 1 | 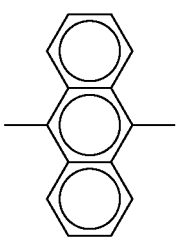 | 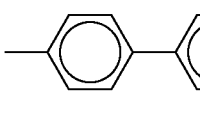 | 4 | 0 | 1 | —CH$_2$— |

TABLE 43
| Structure | k | X | Ar | Bonding Point | i | j | T |
|---|---|---|---|---|---|---|---|
| 269 | 1 | 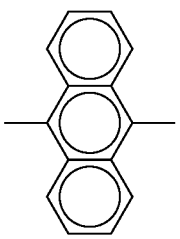 | 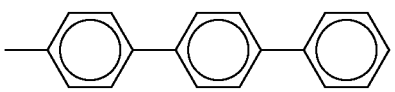 | 4 | 0 | 1 | —CH$_2$CH$_2$— |
| 270 | 1 | 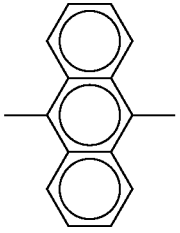 | 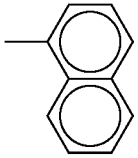 | 4 | 0 | 1 | —CH$_2$CH$_2$— |
| 271 | 1 | 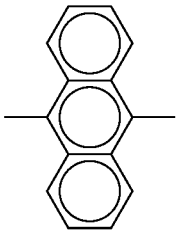 | 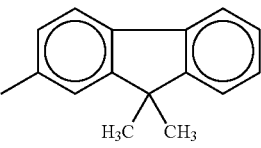 | 4 | 0 | 1 | —CH$_2$CH$_2$— |
| 272 | 1 | 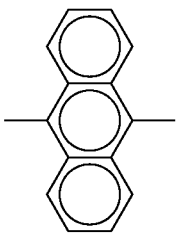 | 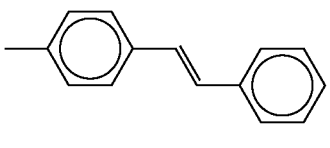 | 4 | 0 | 1 | —CH$_2$CH$_2$— |
| 273 | 1 | 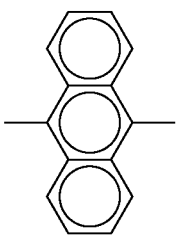 | 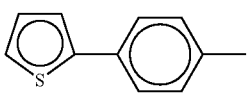 | 4 | 0 | 1 | —CH$_2$CH$_2$— |

TABLE 44
| Structure | k | X | Ar | Bonding Point | i | j | T |
|---|---|---|---|---|---|---|---|
| 274 | 1 | 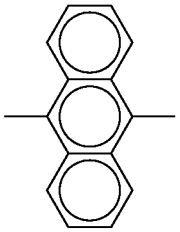 | 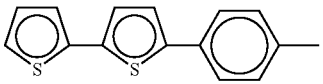 | 4 | 0 | 1 | —CH$_2$CH$_2$— |
| 275 | 1 | 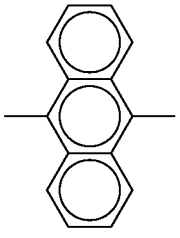 | 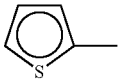 | 4 | 0 | 1 | —CH$_2$CH$_2$— |
| 276 | 1 | 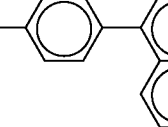 |  | 4 | 0 | 1 | —CH$_2$— |
| 277 | 1 | 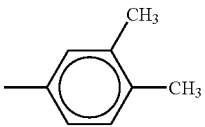 | 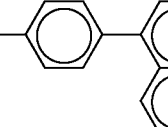 | 4 | 0 | 1 | —CH$_2$— |
| 278 | 1 | 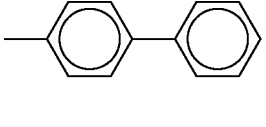 | 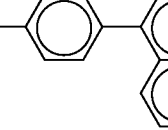 | 4 | 0 | 1 | —CH$_2$CH$_2$— |
TABLE 45
| Structure | k | X | Ar | Bonding Point | i | j | T |
|---|---|---|---|---|---|---|---|
| 279 | 1 | 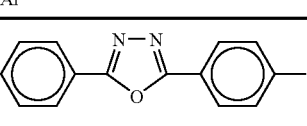 | 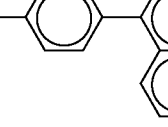 | 4 | 0 | 1 | —CH$_2$— |
| 280 | 1 | 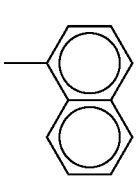 | | 4 | 0 | 1 | —CH$_2$CH$_2$— |

TABLE 45-continued
| Structure | k | X | Ar | Bonding Point | i | j | T |
|---|---|---|---|---|---|---|---|
| 281 | 1 | 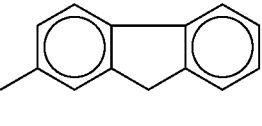 | 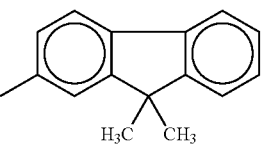 | 4 | 0 | 1 | —CH$_2$CH$_2$— |
| 282 | 1 | 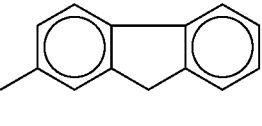 | 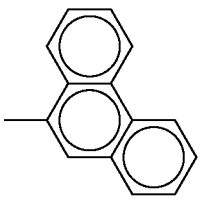 | 4 | 0 | 1 | —CH$_2$CH$_2$— |
| 283 | 1 | 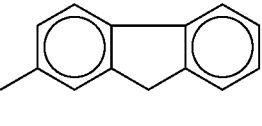 | 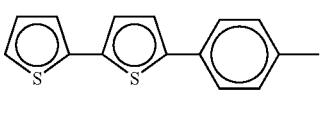 | 4 | 0 | 1 | —CH$_2$CH$_2$— |
| 284 | 1 | 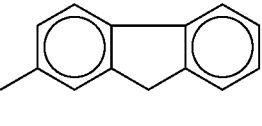 | 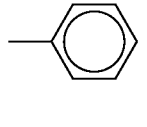 | 4 | 0 | 1 | —CH$_2$CH$_2$— |
TABLE 46
| Structure | k | X | Ar | Bonding Point | i | j | T |
|---|---|---|---|---|---|---|---|
| 285 | 1 | 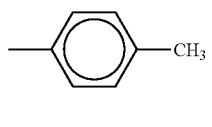 | 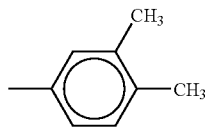 | 4 | 0 | 1 | —CH$_2$CH$_2$— |
| 286 | 1 | 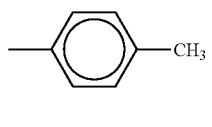 | 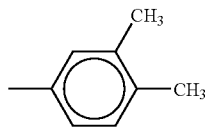 | 4 | 0 | 1 | —CH$_2$CH$_2$— |
| 287 | 1 | 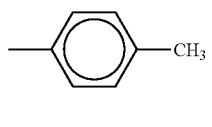 | 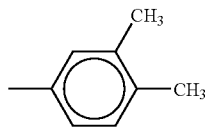 | 4 | 0 | 1 | —CH$_2$CH$_2$— |

TABLE 46-continued
| Structure | k | X | Ar | Bonding Point | i | j | T |
|---|---|---|---|---|---|---|---|
| 288 | 1 | 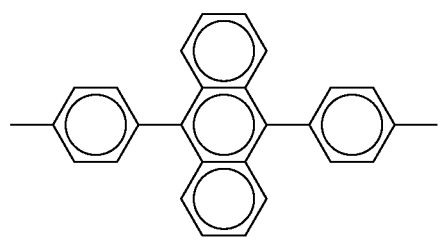 | 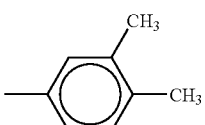 | 4 | 0 | 1 | —CH$_2$CH$_2$— |
| 289 | 1 | 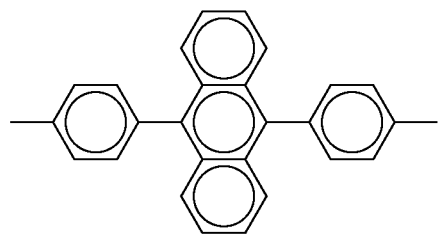 | 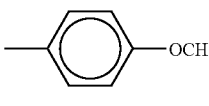 | 4 | 0 | 1 | —CH$_2$— |
TABLE 47
| Structure | k | X | Ar | Bonding Point | i | j | T |
|---|---|---|---|---|---|---|---|
| 290 | 1 | 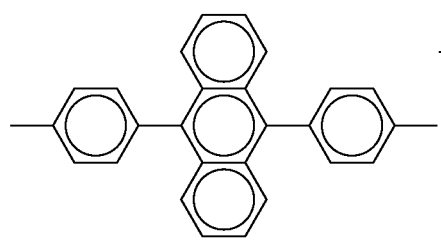 | 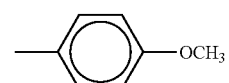 | 4 | 0 | 1 | —(CH$_2$)$_3$— |
| 291 | 1 | 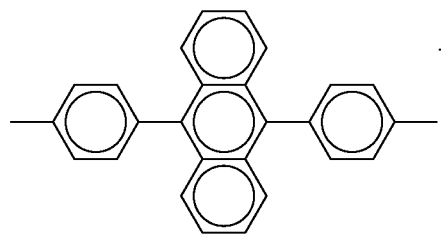 | 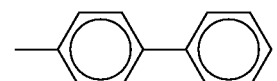 | 4 | 0 | 1 | —CH$_2$CH$_2$— |
| 292 | 1 | 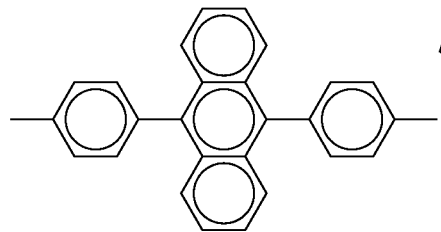 | 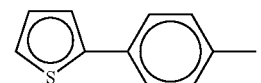 | 4 | 0 | 1 | —CH$_2$CH$_2$— |

TABLE 47-continued
| Structure | k | X | Ar | Bonding Point | i | j | T |
|---|---|---|---|---|---|---|---|
| 293 | 1 | 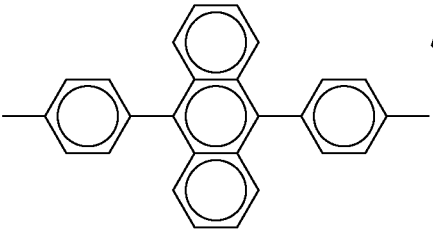 | 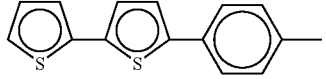 | 4 | 0 | 1 | —CH$_2$CH$_2$— |
| 294 | 1 | 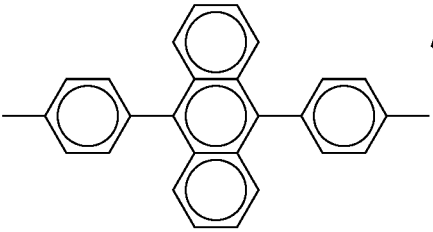 | 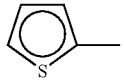 | 4 | 0 | 1 | —CH$_2$— |
TABLE 48
| Structure | k | X | Ar | Bonding Point | i | j | T |
|---|---|---|---|---|---|---|---|
| 295 | 1 | 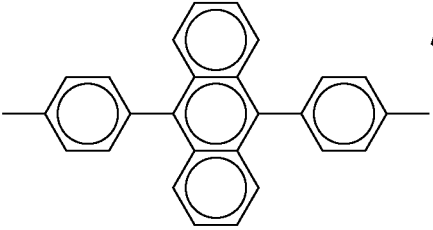 | 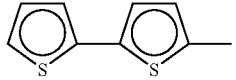 | 4 | 0 | 1 | —CH$_2$— |
| 296 | 1 | 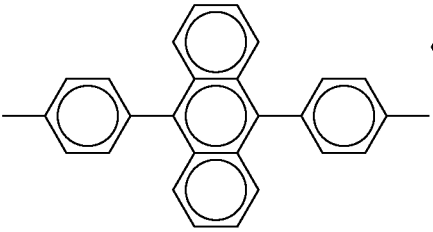 | 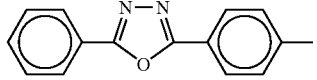 | 4 | 0 | 1 | —CH$_2$— |
| 297 | 1 | 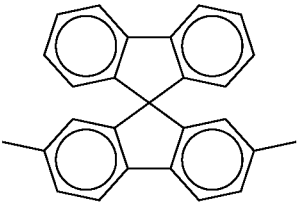 | 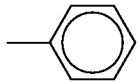 | 4 | 0 | 1 | —CH$_2$CH$_2$— |
| 298 | 1 | 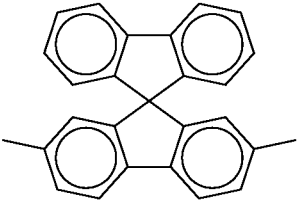 | 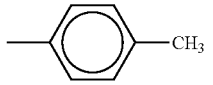 | 4 | 0 | 1 | —CH$_2$CH$_2$— |

TABLE 48-continued
| Structure | k | X | Ar | Bonding Point | i | j | T |
|---|---|---|---|---|---|---|---|
| 299 | 1 | 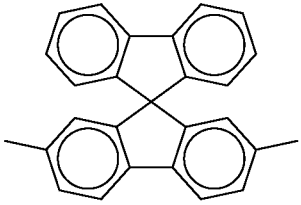 | 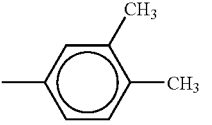 | 4 | 0 | 1 | —CH$_2$— |
TABLE 49
| Structure | k | X | Ar | Bonding Point | i | j | T |
|---|---|---|---|---|---|---|---|
| 300 | 1 | 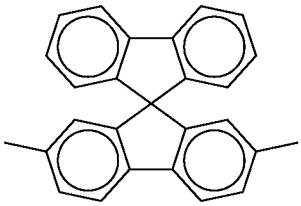 | 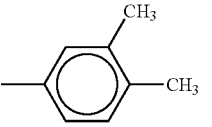 | 4 | 0 | 1 | —(CH$_2$)$_3$— |
| 301 | 1 | 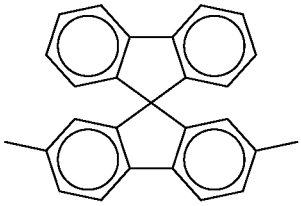 | 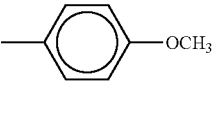 | 4 | 0 | 1 | —CH$_2$CH$_2$— |
| 302 | 1 | 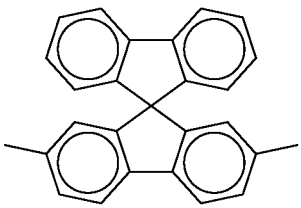 | 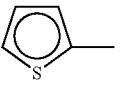 | 4 | 0 | 1 | —CH$_2$CH$_2$— |
TABLE 50
| Structure | k | X | Ar | Bonding Point | i | j | T |
|---|---|---|---|---|---|---|---|
| 303 | 0 | 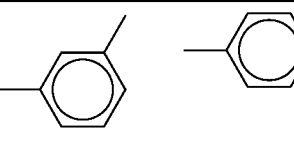 | 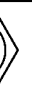 | 4, 4' | 0 | 0 | — |
| 304 | 0 | 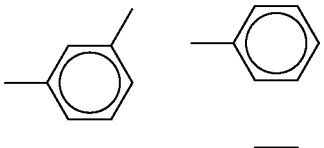 |  | 4, 4' | 1 | 1 | —CH$_2$CH$_2$— |
| 305 | 0 | 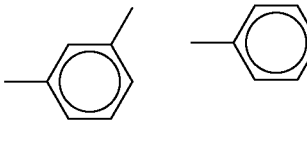 |  | 4, 4' | 0 | 1 | —CH$_2$CH$_2$— |

TABLE 50-continued
| Structure | k | X | Ar | Bonding Point | i | j | T |
|---|---|---|---|---|---|---|---|
| 306 | 0 | 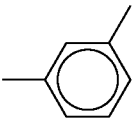 |  | 4, 4' | 0 | 1 | 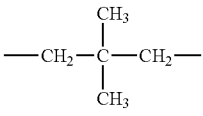 |
| 307 | 0 | 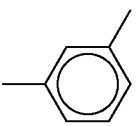 | 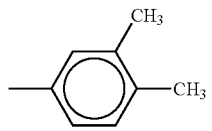 | 4, 4' | 0 | 1 | —CH$_2$CH$_2$— |
| 308 | 0 | 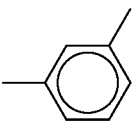 |  | 4, 4' | 0 | 1 | 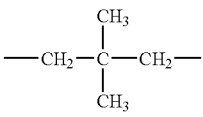 |
| 309 | 0 | 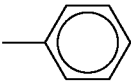 |  | 4, 4' | 0 | 1 | —CH$_2$CH$_2$— |
| 310 | 0 | 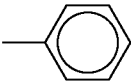 | 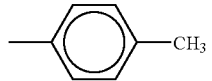 | 4, 4' | 0 | 1 | —CH$_2$— |
TABLE 51
| Structure | k | X | Ar | Bonding Point | i | j | T |
|---|---|---|---|---|---|---|---|
| 311 | 0 | 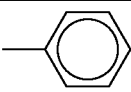 | 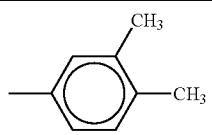 | 4, 4' | 0 | 1 | —CH$_2$CH$_2$— |
| 312 | 0 | 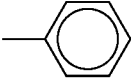 | 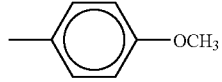 | 4, 4' | 0 | 1 | —CH$_2$CH$_2$— |
| 313 | 0 | 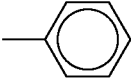 |  | 4, 4' | 0 | 1 | —CH$_2$— |
| 314 | 0 | 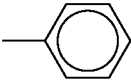 | 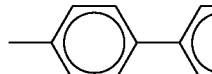 | 4, 4' | 0 | 1 | —CH$_2$CH$_2$— |
| 315 | 0 | 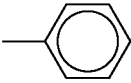 | 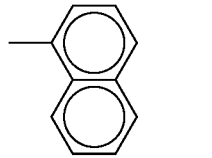 | 4, 4' | 0 | 1 | 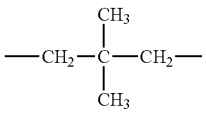 |

TABLE 51-continued
| Structure | k | X | Ar | Bonding Point | i | j | T |
|---|---|---|---|---|---|---|---|
| 316 | 0 | 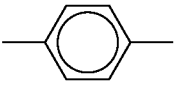 | 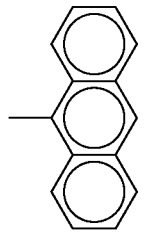 | 4, 4' | 0 | 1 | —CH$_2$— |
| 317 | 0 |  | 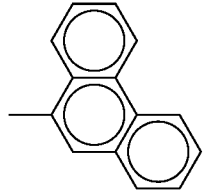 | 4, 4' | 0 | 1 | —CH$_2$CH$_2$— |
TABLE 52
| Structure | k | X | Ar | Bonding Point | i | j | T |
|---|---|---|---|---|---|---|---|
| 318 | 0 | 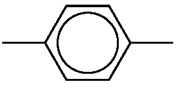 | 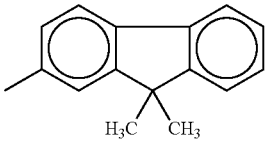 | 4, 4' | 0 | 1 | —CH$_2$CH$_2$— |
| 319 | 0 |  | 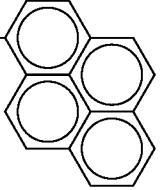 | 4, 4' | 0 | 1 | —CH$_2$CH$_2$— |
| 320 | 0 | 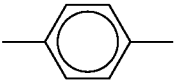 | 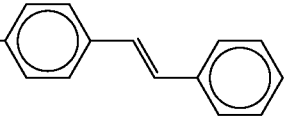 | 4, 4' | 0 | 1 | —CH$_2$CH$_2$— |
| 321 | 0 | 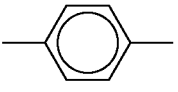 | 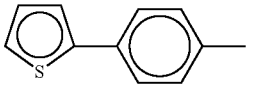 | 4, 4' | 0 | 1 | —CH$_2$CH$_2$— |
| 322 | 0 | 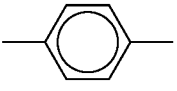 | 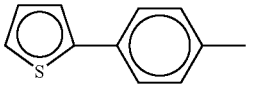 | 4, 4' | 0 | 1 | 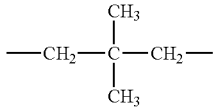 |
| 323 | 0 | 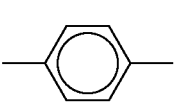 | 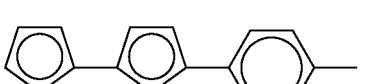 | 4, 4' | 0 | 1 | —CH$_2$CH$_2$— |
| 324 | 0 | 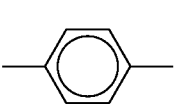 | 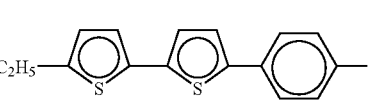 | 4, 4' | 0 | 1 | —CH$_2$CH$_2$— |

TABLE 53

| Structure | k | X | Ar | Bonding Point | i | j | T |
|---|---|---|---|---|---|---|---|
| 325 | 0 | phenyl | thiophene | 4, 4' | 0 | 1 | —CH$_2$— |
| 326 | 0 | phenyl | thiophene | 4, 4' | 0 | 0 | — |
| 327 | 0 | phenyl | bithiophene | 4, 4' | 1 | 0 | — |
| 328 | 0 | phenyl | bithiophene | 4, 4' | 0 | 1 | —CH$_2$CH$_2$— |
| 329 | 0 | phenyl | bithiophene | 4, 4' | 1 | 0 | —(CH$_2$)$_4$— |
| 330 | 0 | phenyl | thiophene-phenyl | 4, 4' | 0 | 0 | — |
| 331 | 0 | phenyl | thiophene-phenyl | 4, 4' | 0 | 0 | — |
| 332 | 0 | phenyl | C$_2$H$_5$-bithiophene-phenyl | 4, 4' | 0 | 0 | — |

TABLE 54

| Structure | k | X | Ar | Bonding Point | i | j | T |
|---|---|---|---|---|---|---|---|
| 333 | 0 | phenyl | bithiophene | 4, 4' | 0 | 0 | — |
| 334 | 0 | phenyl | thiophene-phenyl | 4, 4' | 0 | 0 | —CH$_2$CH$_2$— |
| 335 | 0 | phenyl | thiophene-phenyl | 4, 4' | 0 | 0 | —CH$_2$— |
| 336 | 0 | phenyl | thiophene-phenyl | 4, 4' | 0 | 0 | —CH$_2$CH$_2$— |
| 337 | 0 | phenyl | C$_2$H$_5$-bithiophene-phenyl | 4, 4' | 0 | 0 | —CH$_2$— |

TABLE 54-continued
| Structure | k | X | Ar | Bonding Point | i | j | T |
|---|---|---|---|---|---|---|---|
| 338 | 0 |  | 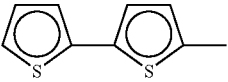 | 4, 4' | 1 | 1 | —CH$_2$— |
| 339 | 1 | 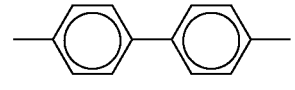 |  | 4, 4' | 1 | 1 | —CH$_2$CH$_2$— |
| 340 | 1 | 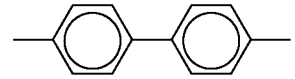 | 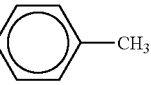 | 4, 4' | 1 | 1 | —CH$_2$CH$_2$— |
TABLE 55
| Structure | k | X | Ar | Bonding Point | i | j | T |
|---|---|---|---|---|---|---|---|
| 341 | 1 | 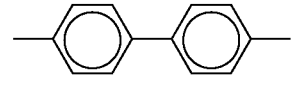 | 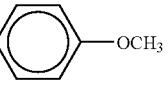 | 4, 4' | 0 | 1 | —CH$_2$CH$_2$— |
| 342 | 1 | 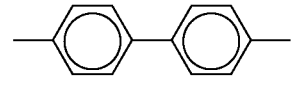 | 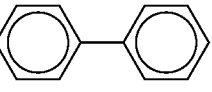 | 4, 4' | 0 | 1 | —CH$_2$CH$_2$— |
| 343 | 1 | 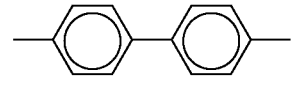 | 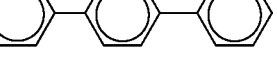 | 4, 4' | 0 | 1 | —CH$_2$CH$_2$— |
| 344 | 1 | 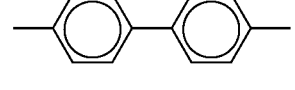 |  | 4, 4' | 0 | 1 | —CH$_2$CH$_2$— |
| 345 | 1 | 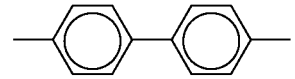 | 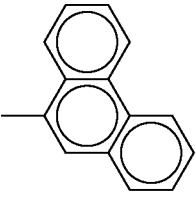 | 4, 4' | 0 | 1 | —CH$_2$— |
| 346 | 1 | 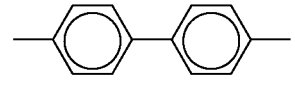 | 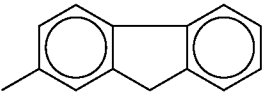 | 4, 4' | 0 | 1 | 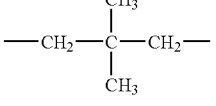 |
| 347 | 1 | 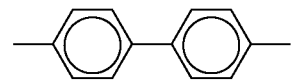 | 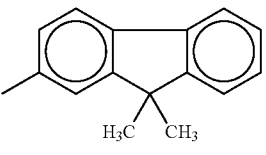 | 4, 4' | 0 | 1 | 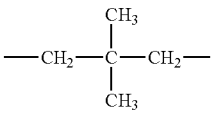 |

TABLE 56

| Structure | k | X | Ar | Bonding Point | i | j | T |
|---|---|---|---|---|---|---|---|
| 348 | 1 | biphenyl | stilbene | 4, 4' | 0 | 1 | —CH₂CH₂— |
| 349 | 1 | biphenyl | phenyl-C≡C-phenyl | 4, 4' | 0 | 1 | —CH₂CH₂— |
| 350 | 1 | biphenyl | anthracenyl | 4, 4' | 0 | 1 | —CH₂CH₂— |
| 351 | 1 | biphenyl | pyrenyl | 4, 4' | 0 | 1 | —CH₂CH₂— |
| 352 | 1 | biphenyl | thiophene-phenyl | 4, 4' | 0 | 1 | —CH₂CH₂— |
| 353 | 1 | biphenyl | thiophene-phenyl | 4, 4' | 0 | 1 | —(CH₂)₄— |
| 354 | 1 | biphenyl | thiophene-phenyl | 4, 4' | 0 | 1 | —CH₂—C(CH₃)₂—CH₂— |

TABLE 57
| Structure | k | X | Ar | Bonding Point | i | j | T |
|---|---|---|---|---|---|---|---|
| 355 | 1 | 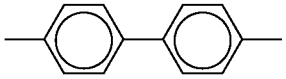 | 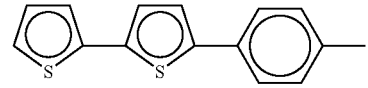 | 4, 4' | 0 | 1 | —CH$_2$CH$_2$— |
| 356 | 1 | 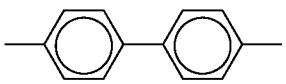 | 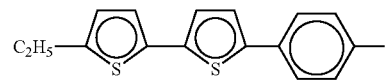 | 4, 4' | 0 | 1 | —CH$_2$CH$_2$— |
| 357 | 1 | 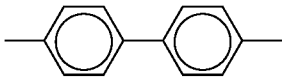 | 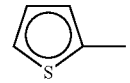 | 4, 4' | 0 | 1 | —CH$_2$CH$_2$— |
| 358 | 1 | 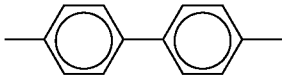 | 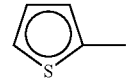 | 4, 4' | 0 | 1 | 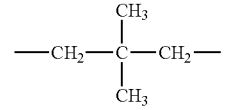 |
| 359 | 1 | 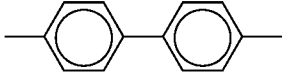 | 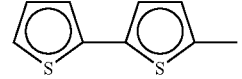 | 4, 4' | 0 | 1 | —CH$_2$CH$_2$— |
| 360 | 1 | 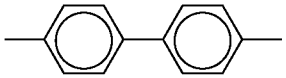 | 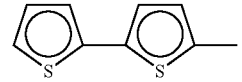 | 4, 4' | 0 | 1 | —(CH$_2$)$_3$— |
| 361 | 1 | 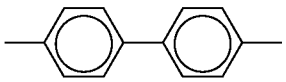 | 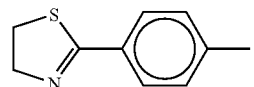 | 4, 4' | 0 | 1 | 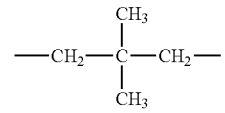 |
| 362 | 1 | 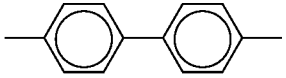 | 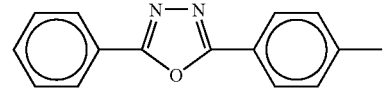 | 4, 4' | 0 | 1 | —CH$_2$CH$_2$— |

TABLE 58
| Structure | k | X | Ar | Bonding Point | i | j | T |
|---|---|---|---|---|---|---|---|
| 363 | 1 |  |  | 4,4' | 0 | 1 | 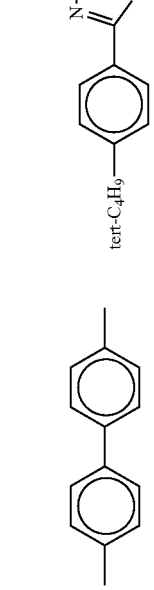 |
| 364 | 1 |  | 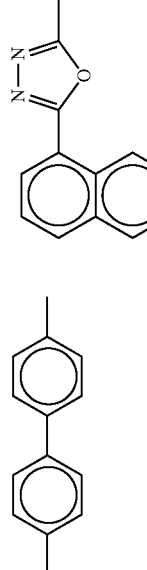 | 4,4' | 0 | 1 | —CH$_2$CH$_2$— |
| 365 | 1 |  | 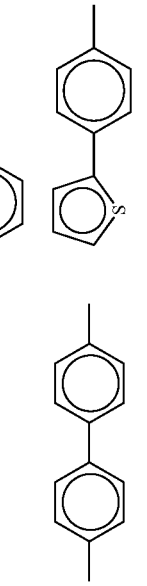 | 4,4' | 0 | 1 | —CH$_2$CH$_2$— |
| 366 | 1 | 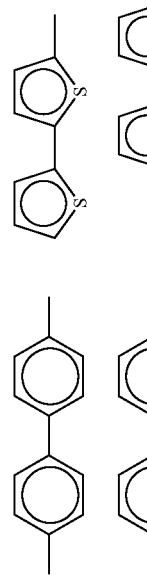 |  | 4,4' | 0 | 0 | — |
| 367 | 1 | 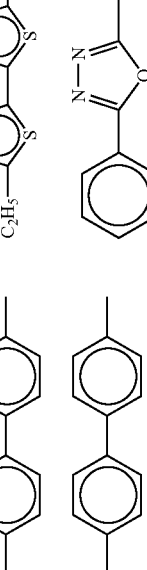 |  | 4,4' | 0 | 1 | —CH$_2$CH$_2$— |
| 368 | 1 | 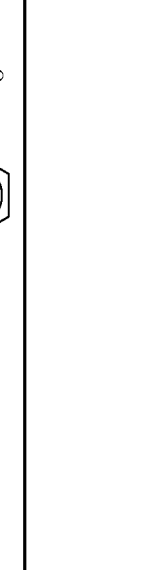 |  | 4,4' | 0 | 1 | —CH$_2$CH$_2$— |
| 369 | 1 | | | 4,4' | 0 | 1 | —CH$_2$CH$_2$— |

TABLE 59
| Structure | k | X | Ar | Bonding Point | i | j | T |
|---|---|---|---|---|---|---|---|
| 370 | 1 | 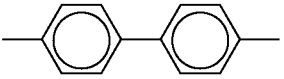 | 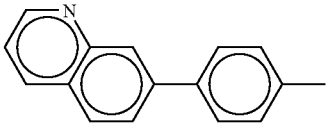 | 4, 4' | 0 | 0 | — |
| 371 | 1 | 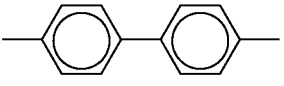 | 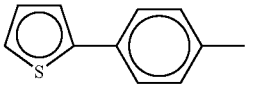 | 4, 4' | 0 | 1 | —CH$_2$— |
| 372 | 1 | 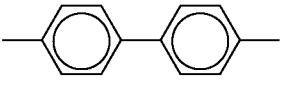 | 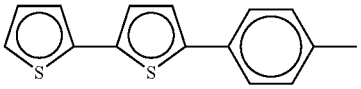 | 4, 4' | 0 | 1 | —CH$_2$— |
| 373 | 1 | 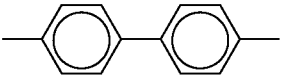 | 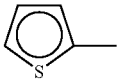 | 4, 4' | 0 | 1 | —CH$_2$— |
| 374 | 1 | 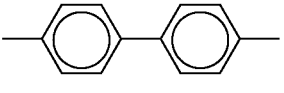 | 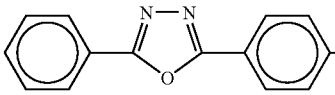 | 4, 4' | 0 | 1 | —CH$_2$— |
| 375 | 1 | 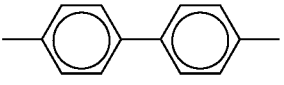 |  | 4, 4' | 0 | 1 | —CH$_2$— |
| 376 | 1 | 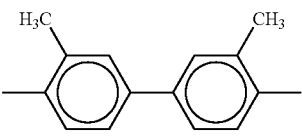 | 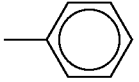 | 4, 4' | 0 | 1 | —CH$_2$CH$_2$— |
| 377 | 1 | 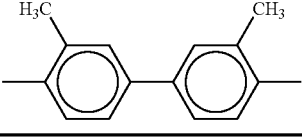 | 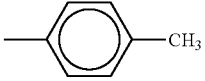 | 4, 4' | 0 | 1 | —CH$_2$CH$_2$— |
TABLE 60
| Structure | k | X | Ar | Bonding Point | i | j | T |
|---|---|---|---|---|---|---|---|
| 378 | 1 | 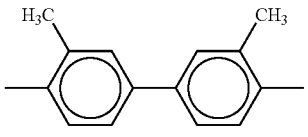 | 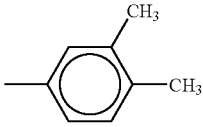 | 4, 4' | 1 | 1 | —CH$_2$CH$_2$— |
| 379 | 1 | 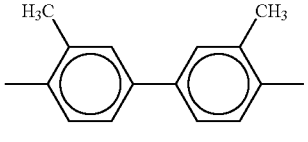 | 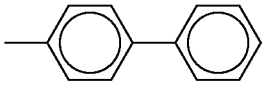 | 4, 4' | 0 | 1 | —CH$_2$CH$_2$— |
| 380 | 1 | 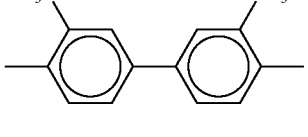 | 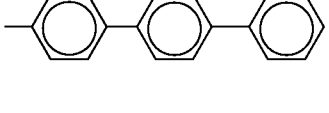 | 4, 4' | 0 | 1 | —CH$_2$CH$_2$— |

TABLE 60-continued

| Structure | k | X | Ar | Bonding Point | i | j | T |
|---|---|---|---|---|---|---|---|
| 381 | 1 | 3,3'-dimethylbiphenyl | naphthyl | 4, 4' | 0 | 1 | —CH₂CH₂— |
| 382 | 1 | 3,3'-dimethylbiphenyl | fluorenyl | 4, 4' | 0 | 1 | —CH₂CH₂— |
| 383 | 1 | 3,3'-dimethylbiphenyl | phenanthryl | 4, 4' | 0 | 1 | —CH₂CH₂— |
| 384 | 1 | 3,3'-dimethylbiphenyl | stilbenyl | 4, 4' | 0 | 1 | —CH₂CH₂— |

TABLE 61

| Structure | k | X | Ar | Bonding Point | i | j | T |
|---|---|---|---|---|---|---|---|
| 385 | 1 | 3,3'-dimethylbiphenyl | diphenylacetylene | 4, 4' | 0 | 1 | —CH₂CH₂— |
| 386 | 1 | 3,3'-dimethylbiphenyl | thienyl-phenyl | 4, 4' | 0 | 1 | —CH₂CH₂— |
| 387 | 1 | 3,3'-dimethylbiphenyl | thienyl-phenyl | 4, 4' | 0 | 1 | —(CH₂)₄— |
| 388 | 1 | 3,3'-dimethylbiphenyl | thienyl-phenyl | 4, 4' | 0 | 1 | —CH₂—C(CH₃)₂—CH₂— |
| 389 | 1 | 3,3'-dimethylbiphenyl | bithienyl-phenyl | 4, 4' | 0 | 1 | —CH₂CH₂— |

TABLE 61-continued
| Structure | k | X | Ar | Bonding Point | i | j | T |
|---|---|---|---|---|---|---|---|
| 390 | 1 | 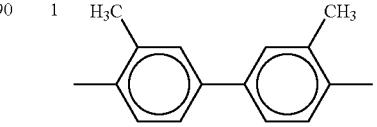 | 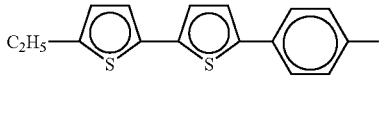 | 4, 4' | 0 | 1 | —CH$_2$— |
| 391 | 1 | 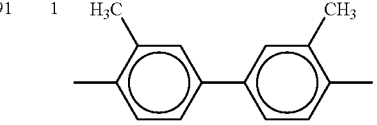 | 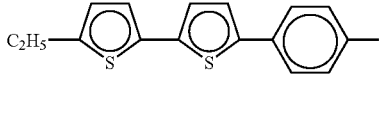 | 4, 4' | 0 | 1 | —CH$_2$CH$_2$— |
| 392 | 1 | 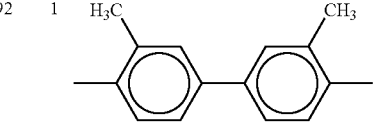 | 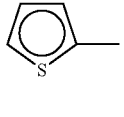 | 4, 4' | 0 | 1 | —CH$_2$CH$_2$— |
TABLE 62
| Structure | k | X | Ar |
|---|---|---|---|
| 393 | 1 | 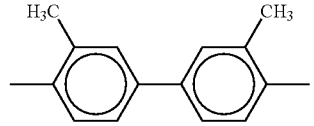 | 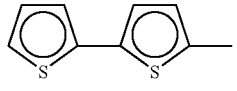 |
| 394 | 1 | 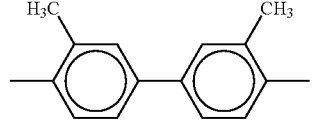 | 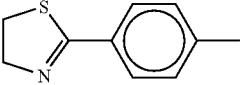 |
| 395 | 1 | 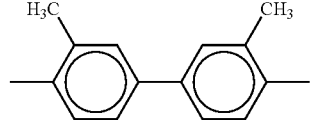 | 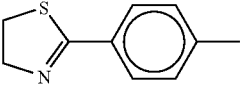 |
| 396 | 1 | 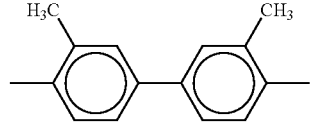 | 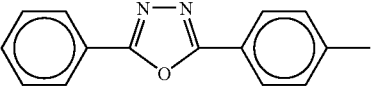 |
| 307 | 1 | 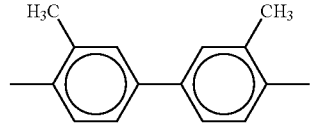 | 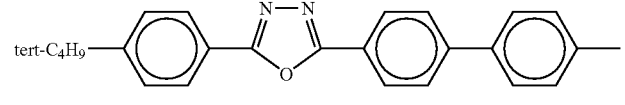 |
| 398 | 1 | 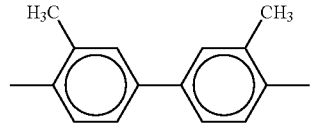 | 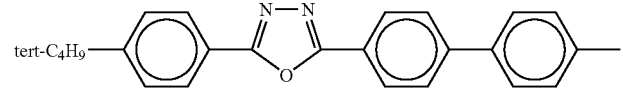 |
| 399 | 1 | 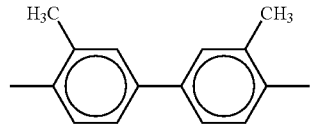 | 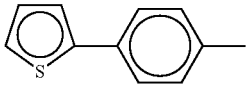 |

TABLE 62-continued

| Structure | Bonding Point | i | j | T |
|---|---|---|---|---|
| 393 | 4,4' | 0 | 1 | —CH$_2$CH$_2$— |
| 394 | 4,4' | 0 | 1 | —CH$_2$CH$_2$— |
| 395 | 4,4' | 0 | 1 | —CH$_2$—C(CH$_3$)$_2$—CH$_2$— |
| 396 | 4,4' | 0 | 1 | —CH$_2$CH$_2$— |
| 397 | 4,4' | 0 | 1 | —CH$_2$— |
| 398 | 4,4' | 0 | 1 | —CH$_2$CH$_2$— |
| 399 | 4,4' | 0 | 1 | —CH$_2$CH$_2$— |
| 400 | 4,4' | 0 | 1 | —CH$_2$CH$_2$— |

(Structure 400, k=1: X = 3,3'-dimethyl-4,4'-biphenylene; Ar = bithienyl-phenylene)

TABLE 63

| Structure | k | X | Ar |
|---|---|---|---|
| 401 | 1 | 3,3'-dimethyl-4,4'-biphenylene | bithienyl |
| 402 | 1 | 3,3'-dimethyl-4,4'-biphenylene | 4,5-dihydrothiazol-2-yl-phenylene |
| 403 | 1 | 3,3'-dimethyl-4,4'-biphenylene | quinolinyl-phenylene |
| 404 | 1 | 3,3'-dimethyl-4,4'-biphenylene | thienyl-phenylene |
| 405 | 1 | 3,3'-dimethyl-4,4'-biphenylene | 5-ethyl-bithienyl-phenylene (C$_2$H$_5$-substituted) |
| 406 | 1 | 3,3'-dimethyl-4,4'-biphenylene | bithienyl |

TABLE 63-continued

| | | | | |
|---|---|---|---|---|
| 407 | 1 | (3,3'-dimethyl-4,4'-biphenyl with CH₃ groups) | (2-phenyl-5-phenyl-1,3,4-oxadiazole) | |
| 408 | 1 | (3,3'-dimethyl-4,4'-biphenyl with CH₃ groups) | tert-C₄H₉—(phenyl-oxadiazole-biphenyl) | |

| Structure | Bonding Point | i | j | T |
|---|---|---|---|---|
| 401 | 4,4' | 0 | 1 | —CH₂CH₂— |
| 402 | 4,4' | 0 | 1 | —CH₂CH₂— |
| 403 | 4,4' | 0 | 1 | —CH₂CH₂— |
| 404 | 4,4' | 0 | 1 | —CH₂— |
| 405 | 4,4' | 0 | 1 | —CH₂— |
| 406 | 4,4' | 0 | 1 | —CH₂— |
| 407 | 4,4' | 0 | 1 | —CH₂— |
| 408 | 4,4' | 0 | 1 | —CH₂— |

TABLE 64

| Structure | k | X | Ar | Bonding Point | i | j | T |
|---|---|---|---|---|---|---|---|
| 409 | 1 | (3,3'-dimethoxy-4,4'-biphenyl) | (thiophene) | 4,4' | 0 | 1 | —CH₂CH₂— |
| 410 | 1 | (3,3'-dimethoxy-4,4'-biphenyl) | (thiophene-phenyl) | 4,4' | 0 | 1 | —CH₂— |
| 411 | 1 | (3,3'-dimethoxy-4,4'-biphenyl) | (thiophene-phenyl) | 4,4' | 1 | 1 | —CH₂CH₂— |
| 412 | 1 | (3,3'-dimethoxy-4,4'-biphenyl) | (bithiophene-phenyl) | 4,4' | 0 | 1 | —CH₂CH₂— |
| 413 | 1 | (3,3'-dimethoxy-4,4'-biphenyl) | (bithiophene-phenyl) | 4,4' | 0 | 1 | —CH₂—C(CH₃)₂—CH₂— |
| 414 | 1 | (3,3'-dimethoxy-4,4'-biphenyl) | (bithiophene-phenyl) | 4,4' | 0 | 0 | — |

TABLE 64-continued
| Structure | k | X | Ar | Bonding Point | i | j | T |
|---|---|---|---|---|---|---|---|
| 415 | 1 | 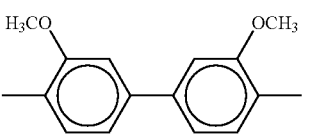 | 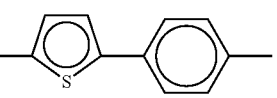 | 4,4' | 0 | 1 | —CH$_2$— |
| 416 | 1 | 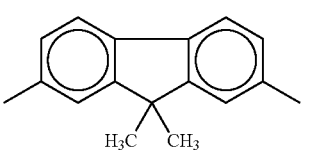 | 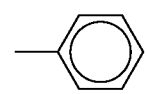 | 4,4' | 0 | 1 | —CH$_2$CH$_2$— |
TABLE 65
| Structure | k | X | Ar | Bonding Point | i | j | T |
|---|---|---|---|---|---|---|---|
| 417 | 1 | 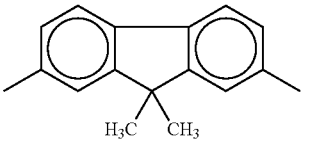 |  | 4,4' | 0 | 1 | —CH$_2$CH$_2$— |
| 418 | 1 | 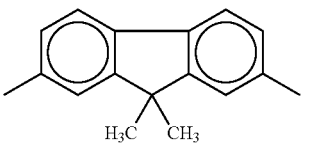 | 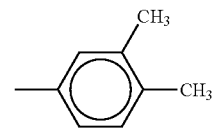 | 4,4' | 0 | 1 | —CH$_2$CH$_2$— |
| 419 | 1 | 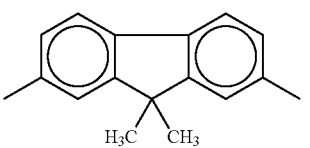 | 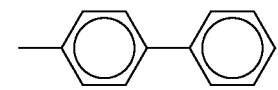 | 4,4' | 0 | 1 | —CH$_2$CH$_2$— |
| 420 | 1 | 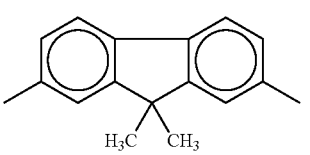 | 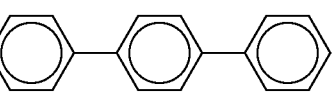 | 4,4' | 0 | 1 | —CH$_2$CH$_2$— |
| 421 | 1 | 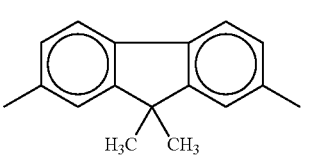 | 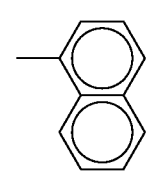 | 4,4' | 0 | 1 | —CH$_2$CH$_2$— |
| 422 | 1 | 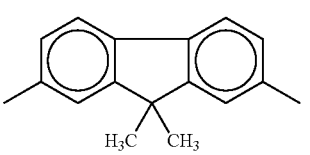 | 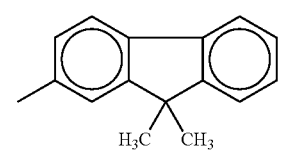 | 4,4' | 0 | 1 | —CH$_2$CH$_2$— |

TABLE 65-continued
| Structure | k | X | Ar | Bonding Point | i | j | T |
|---|---|---|---|---|---|---|---|
| 423 | 1 | 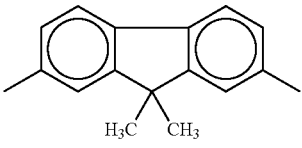 | 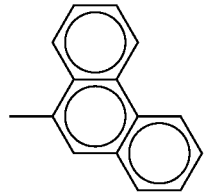 | 4,4' | 0 | 1 | —CH$_2$CH$_2$— |
TABLE 66
| Structure | k | X | Ar | Bonding Point | i | j | T |
|---|---|---|---|---|---|---|---|
| 424 | 1 | 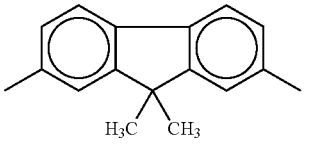 | 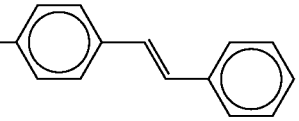 | 4,4' | 0 | 1 | —CH$_2$CH$_2$— |
| 425 | 1 | 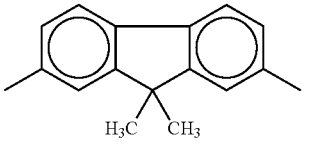 | 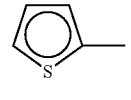 | 4,4' | 0 | 1 | —CH$_2$CH$_2$— |
| 426 | 1 | 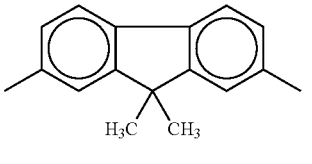 | 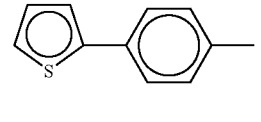 | 4,4' | 0 | 1 | —CH$_2$CH$_2$— |
| 427 | 1 | 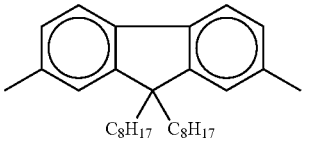 | 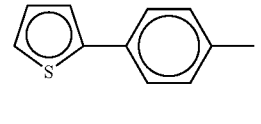 | 4,4' | 0 | 1 | —CH$_2$CH$_2$— |
| 428 | 1 | 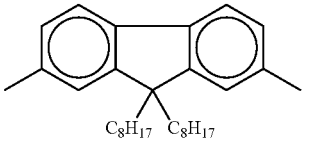 | 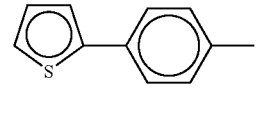 | 4,4' | 0 | 1 | 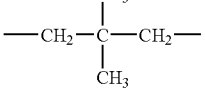 |
| 429 | 1 | 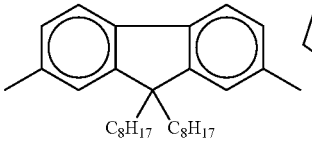 | 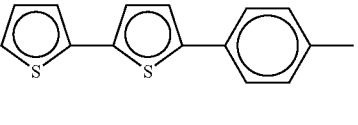 | 4,4' | 0 | 1 | —CH$_2$CH$_2$— |
| 430 | 1 | 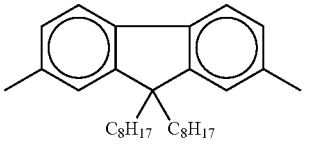 | 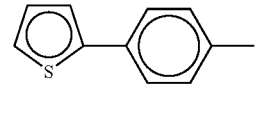 | 4,4' | 0 | 1 | —CH$_2$— |

TABLE 66-continued
| Structure | k | X | Ar | Bonding Point | i | j | T |
|---|---|---|---|---|---|---|---|
| 431 | 1 |  |  | 4,4' | 0 | 1 | —CH$_2$CH$_2$— |
TABLE 67
| Structure | k | X | Ar | Bonding Point | i | j | T |
|---|---|---|---|---|---|---|---|
| 432 | 1 | 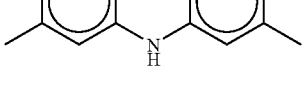 |  | 4,4' | 0 | 0 | — |
| 433 | 1 | 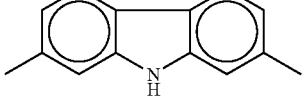 | 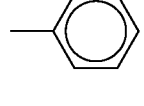 | 4,4' | 0 | 1 | —CH$_2$CH$_2$— |
| 434 | 1 | 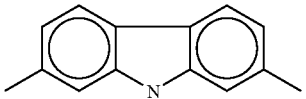 | 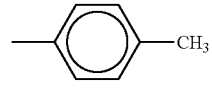 | 4,4' | 1 | 0 | — |
| 435 | 1 | 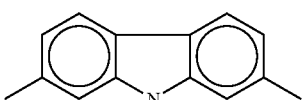 | 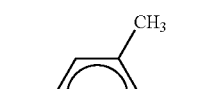 | 4,4' | 0 | 1 | —CH$_2$— |
| 436 | 1 | 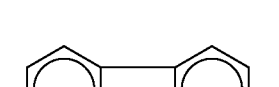 | 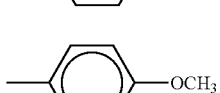 | 4,4' | 0 | 1 | 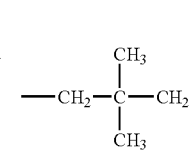 |
| 437 | 1 | 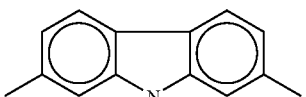 | 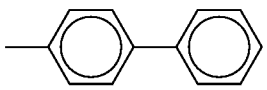 | 4,4' | 0 | 1 | —CH$_2$CH$_2$— |
| 438 | 1 | 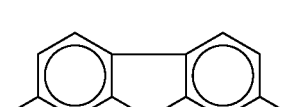 | 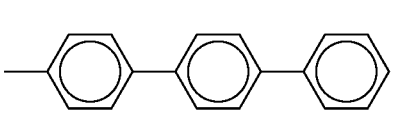 | 4,4' | 0 | 1 | —CH$_2$CH$_2$— |
| 439 | 1 | 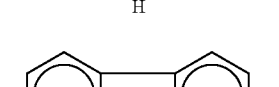 |  | 4,4' | 0 | 1 | —CH$_2$CH$_2$— |

TABLE 68

| Structure | k | X | Ar | Bonding Point | i | j | T |
|---|---|---|---|---|---|---|---|
| 440 | 1 | carbazole (NH) | naphthyl | 4,4' | 0 | 1 | —CH$_2$CH$_2$— |
| 441 | 1 | carbazole (NH) | 9,9-dimethylfluorenyl | 4,4' | 0 | 1 | —CH$_2$CH$_2$— |
| 442 | 1 | carbazole (NH) | phenanthryl | 4,4' | 0 | 1 | —CH$_2$CH$_2$— |
| 443 | 1 | carbazole (NH) | stilbenyl | 4,4' | 0 | 1 | —CH$_2$CH$_2$— |
| 444 | 1 | carbazole (N-C$_2$H$_5$) | phenyl | 4,4' | 0 | 1 | —CH$_2$CH$_2$— |
| 445 | 1 | carbazole (N-C$_2$H$_5$) | 4-methylphenyl | 4,4' | 0 | 1 | —CH$_2$CH$_2$— |
| 446 | 1 | carbazole (N-C$_2$H$_5$) | 3,4-dimethylphenyl | 4,4' | 0 | 1 | —CH$_2$CH$_2$— |

TABLE 69

| Structure | k | X | Ar | Bonding Point | i | j | T |
|---|---|---|---|---|---|---|---|
| 447 | 1 | carbazole (N-C$_2$H$_5$) | 4-methoxyphenyl | 4,4' | 0 | 1 | —CH$_2$CH$_2$— |

TABLE 69-continued

| Structure | k | X | Ar | Bonding Point | i | j | T |
|---|---|---|---|---|---|---|---|
| 448 | 1 | carbazole with N-C₂H₅ | biphenyl | 4,4' | 0 | 1 | —CH₂CH₂— |
| 449 | 1 | carbazole with N-C₂H₅ | terphenyl | 4,4' | 0 | 1 | —CH₂CH₂— |
| 450 | 1 | carbazole with N-C₂H₅ | naphthyl | 4,4' | 0 | 1 | —CH₂CH₂— |
| 451 | 1 | carbazole with N-C₂H₅ | 9,9-dimethylfluorenyl | 4,4' | 0 | 1 | —CH₂CH₂— |
| 452 | 1 | carbazole with N-C₂H₅ | phenanthrenyl | 4,4' | 0 | 1 | —(CH₂)₃— |
| 453 | 1 | carbazole with N-C₂H₅ | stilbenyl | 4,4' | 0 | 1 | —CH₂CH₂— |

TABLE 70

| Structure | k | X | Ar |
|---|---|---|---|
| 454 | 1 | carbazole with N-C₂H₅ | thienyl |
| 455 | 1 | carbazole with N-C₂H₅ | bithienyl |

TABLE 70-continued
| Structure | | | | | |
|---|---|---|---|---|---|
| 456 | 1 | 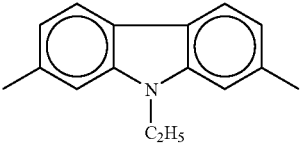 | | 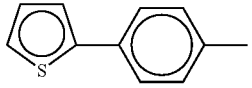 | |
| 457 | 1 | 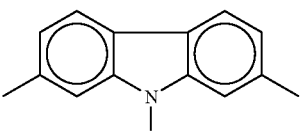 | | 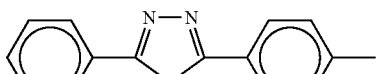 | |
| 458 | 1 | 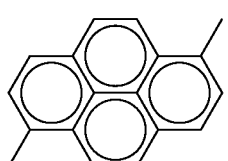 | |  | |
| 459 | 1 | 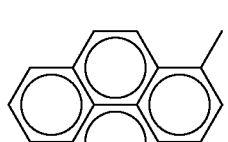 | | 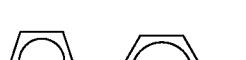 | |
| 460 | 1 | 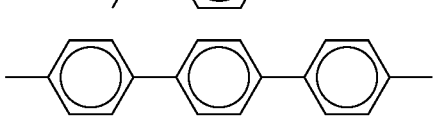 | | 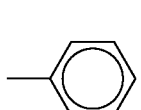 | |
| Structure | Bonding Point | i | j | T |
|---|---|---|---|---|
| 454 | 4,4' | 0 | 1 | —CH$_2$CH$_2$— |
| 455 | 4,4' | 0 | 1 | —CH$_2$CH$_2$— |
| 456 | 4,4' | 0 | 1 | —CH$_2$CH$_2$— |
| 457 | 4,4' | 0 | 1 | —CH$_2$CH$_2$— |
| 458 | 4,4' | 0 | 1 | —CH$_2$CH$_2$— |
| 459 | 4,4' | 0 | 1 | —CH$_2$— |
| 460 | 4,4' | 0 | 1 | —CH$_2$— |
TABLE 71
| Structure | k | X | Ar |
|---|---|---|---|
| 461 | 1 | | —CH$_3$ |
| 462 | 1 | | CH$_3$, CH$_3$ |
| 463 | 1 | | |

TABLE 71-continued

| Structure | Bonding Point | i | j | T |
|---|---|---|---|---|
| 461 | 4,4' | 1 | 0 | — |
| 462 | 4,4' | 0 | 1 | —CH$_2$CH$_2$— |
| 463 | 4,4' | 0 | 1 | —CH$_2$CH$_2$— |
| 464 | 4,4' | 0 | 1 | —CH$_2$CH$_2$— |
| 465 | 4,4' | 0 | 1 | —CH$_2$CH$_2$— |
| 466 | 4,4' | 0 | 1 | —CH$_2$CH$_2$— |
| 467 | 4,4' | 0 | 1 | —CH$_2$CH$_2$— |

TABLE 72

| Structure | k | X | Ar | Bonding Point | i | j | T |
|---|---|---|---|---|---|---|---|
| 468 | 1 | | | 4, 4' | 0 | 1 | —CH$_2$CH$_2$— |
| 469 | 1 | | | 4, 4' | 0 | 1 | —CH$_2$CH$_2$— |
| 470 | 1 | | | 4, 4' | 0 | 1 | —CH$_2$CH$_2$— |
| 471 | 1 | | | 4, 4' | 0 | 1 | —CH$_2$— |

TABLE 72-continued

| Structure | k | X | Ar | Bonding Point | i | j | T |
|---|---|---|---|---|---|---|---|
| 472 | 1 | (phenyl-phenyl-phenyl) | (thiophene) | 4, 4' | 0 | 1 | —CH₂CH₂— |
| 473 | 1 | (phenyl-phenyl-phenyl) | (bithiophene) | 4, 4' | 0 | 1 | —CH₂CH₂— |
| 474 | 1 | (phenyl-phenyl-phenyl) | (phenyl-oxadiazole-phenyl) | 4, 4' | 0 | 1 | —CH₂CH₂— |
| 475 | 1 | (phenyl-phenyl-phenyl) | (bithiophene) | 4, 4' | 0 | 0 | — |

TABLE 73

| Structure | k | X | Ar | Bonding Point | i | j | T |
|---|---|---|---|---|---|---|---|
| 476 | 1 | (phenyl-phenyl-phenyl) | (bithiophene) | 4, 4' | 0 | 1 | —CH₂— |
| 477 | 1 | (phenyl-thiophene-phenyl) | (phenyl) | 4, 4' | 0 | 1 | —CH₂— |
| 478 | 1 | (phenyl-thiophene-phenyl) | (dimethylphenyl) | 4, 4' | 0 | 1 | —CH₂CH₂— |
| 479 | 1 | (phenyl-thiophene-phenyl) | (biphenyl) | 4, 4' | 0 | 1 | —CH₂—C(CH₃)₂—CH₂— |
| 480 | 1 | (phenyl-thiophene-phenyl) | (terphenyl) | 4, 4' | 0 | 1 | —CH₂CH₂— |
| 481 | 1 | (phenyl-thiophene-phenyl) | (naphthyl) | 4, 4' | 0 | 1 | —CH₂CH₂— |
| 482 | 1 | (phenyl-thiophene-phenyl) | (fluorene) | 4, 4' | 0 | 1 | —CH₂CH₂— |
| 483 | 1 | (phenyl-thiophene-phenyl) | (9,9-dimethylfluorene) | 4, 4' | 0 | 1 | —CH₂CH₂— |

TABLE 74

| Structure | k | X | Ar | Bonding Point | i | j | T |
|---|---|---|---|---|---|---|---|
| 484 | 1 | (phenyl-thiophene-phenyl) | (phenanthrene) | 4, 4' | 0 | 1 | —CH$_2$CH$_2$— |
| 485 | 1 | (phenyl-thiophene-phenyl) | (thiophene-phenyl) | 4, 4' | 0 | 1 | —CH$_2$CH$_2$— |
| 486 | 1 | (phenyl-thiophene-phenyl) | (bithiophene-phenyl) | 4, 4' | 0 | 1 | —CH$_2$CH$_2$— |
| 487 | 1 | (phenyl-thiophene-phenyl) | (thiophene) | 4, 4' | 0 | 1 | —CH$_2$CH$_2$— |
| 488 | 1 | (phenyl-thiophene-phenyl) | (thiophene) | 4, 4' | 0 | 1 | —(CH$_2$)$_3$— |
| 489 | 1 | (phenyl-thiophene-phenyl) | (phenyl-bithiophene) | 4, 4' | 0 | 1 | —CH$_2$CH$_2$— |
| 490 | 1 | (phenyl-thiophene-phenyl) | (phenyl-oxadiazole-phenyl) | 4, 4' | 0 | 1 | —CH$_2$CH$_2$— |

TABLE 75

| Structure | k | X | Ar | Bonding Point | i | j | T |
|---|---|---|---|---|---|---|---|
| 491 | 1 | (phenyl-thiophene-phenyl) | (bithiophene) | 4, 4' | 0 | 0 | — |
| 492 | 1 | (phenyl-thiophene-phenyl) | (bithiophene) | 4, 4' | 0 | 1 | —CH$_2$— |
| 493 | 1 | (phenyl-bithiophene-phenyl) | (phenyl) | 4, 4' | 0 | 1 | —CH$_2$CH$_2$— |
| 494 | 1 | (phenyl-bithiophene-phenyl) | (dimethylphenyl) | 4, 4' | 0 | 1 | —CH$_2$CH$_2$— |

TABLE 75-continued

| Structure | k | X | Ar | Bonding Point | i | j | T |
|---|---|---|---|---|---|---|---|
| 495 | 1 | (phenyl-thiophene-thiophene-phenyl) | (naphthyl) | 4, 4' | 0 | 1 | —CH$_2$CH$_2$— |
| 496 | 1 | (phenyl-thiophene-thiophene-phenyl) | (phenanthryl) | 4, 4' | 0 | 1 | —CH$_2$CH$_2$— |
| 497 | 1 | (phenyl-thiophene-thiophene-phenyl) | (9,9-dimethylfluorenyl) | 4, 4' | 0 | 1 | —CH$_2$CH$_2$— |

TABLE 76

| Structure | k | X | Ar | Bonding Point | i | j | T |
|---|---|---|---|---|---|---|---|
| 498 | 1 | (phenyl-thiophene-thiophene-phenyl) | (stilbenyl) | 4, 4' | 0 | 1 | —CH$_2$CH$_2$— |
| 499 | 1 | (phenyl-thiophene-thiophene-phenyl) | (thiophene-phenyl) | 4, 4' | 0 | 1 | —CH$_2$CH$_2$— |
| 500 | 1 | (phenyl-thiophene-thiophene-phenyl) | (thiophene-thiophene-phenyl) | 4, 4' | 0 | 1 | —CH$_2$CH$_2$— |
| 501 | 1 | (phenyl-thiophene-thiophene-phenyl) | (thiophene) | 4, 4' | 0 | 1 | —CH$_2$CH$_2$— |
| 502 | 1 | (phenyl-thiophene-thiophene-phenyl) | (thiophene-thiophene) | 4, 4' | 0 | 1 | —CH$_2$CH$_2$— |
| 503 | 1 | (phenyl-thiophene-thiophene-phenyl) | (phenyl-oxadiazole-phenyl) | 4, 4' | 0 | 1 | —CH$_2$CH$_2$— |
| 504 | 1 | (phenyl-thiophene-thiophene-phenyl) | (thiophene-thiophene-phenyl) | 4, 4' | 0 | 0 | — |
| 505 | 1 | (phenyl-thiophene-thiophene-phenyl) | (thiophene-thiophene-phenyl) | 4, 4' | 0 | 1 | —CH$_2$— |

TABLE 77
| Structure | k | X | Ar | Bonding Point | i | j | T |
|---|---|---|---|---|---|---|---|
| 506 | 1 | 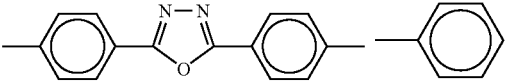 | 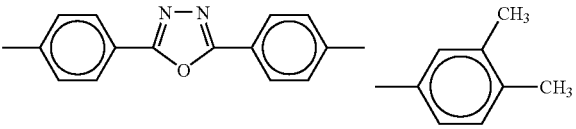 | 4, 4' | 0 | 1 | —CH$_2$— |
| 507 | 1 | 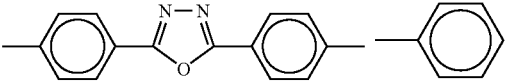 | 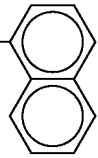 | 4, 4' | 0 | 1 | —CH$_2$— |
| 508 | 1 | 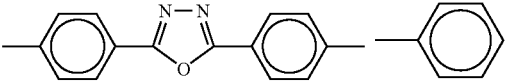 | 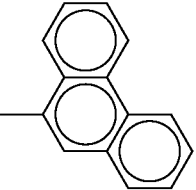 | 4, 4' | 0 | 0 | — |
| 509 | 1 | 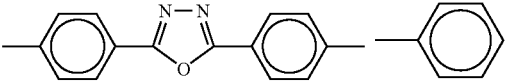 | 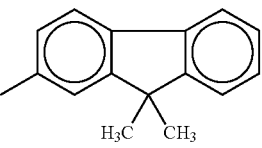 | 4, 4' | 0 | 1 | —(CH$_2$)$_3$— |
| 510 | 1 | 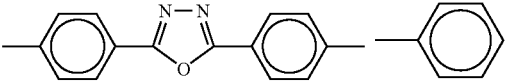 | 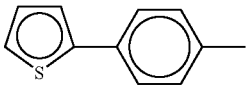 | 4, 4' | 0 | 1 | —CH$_2$CH$_2$— |
| 511 | 1 | 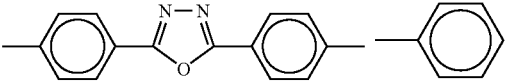 | 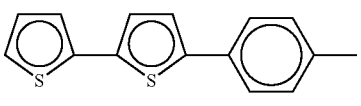 | 4, 4' | 0 | 1 | —CH$_2$CH$_2$— |
| 512 | 1 | 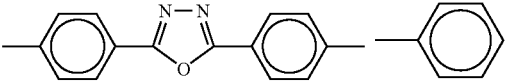 | 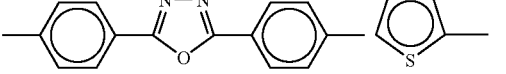 | 4, 4' | 0 | 1 | —(CH$_2$)$_3$— |
TABLE 78
| Structure | k | X | Ar | Bonding Point | i | j | T |
|---|---|---|---|---|---|---|---|
| 513 | 1 | 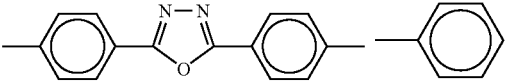 | 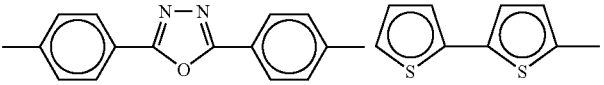 | 4, 4' | 0 | 1 | —CH$_2$CH$_2$— |
| 514 | 1 | 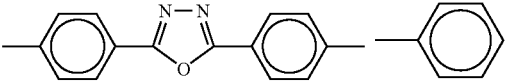 | 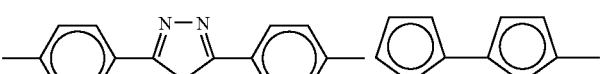 | 4, 4' | 0 | 1 | —CH$_2$— |
| 515 | 1 | 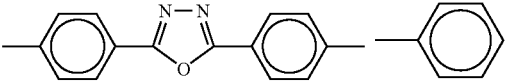 | 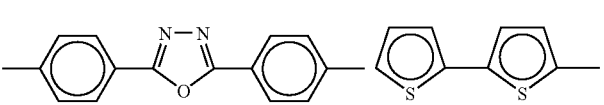 | 4, 4' | 0 | 1 | —(CH$_2$)$_3$— |
| 516 | 1 | 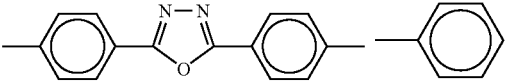 | 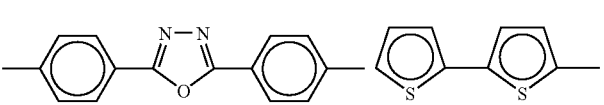 | 4, 4' | 0 | 0 | — |

TABLE 78-continued
| Structure | k | X | Ar | Bonding Point | i | j | T |
|---|---|---|---|---|---|---|---|
| 517 | 1 | 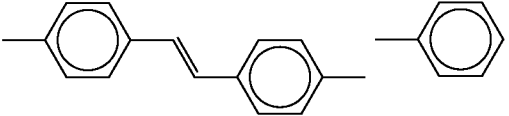 | 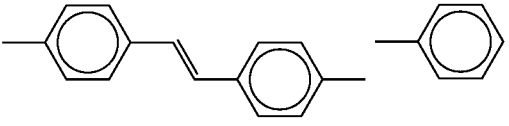 | 4, 4' | 0 | 1 | —CH$_2$— |
| 518 | 1 | 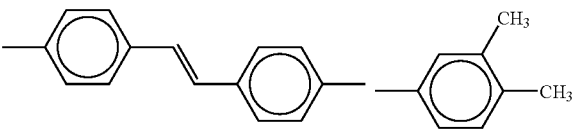 | 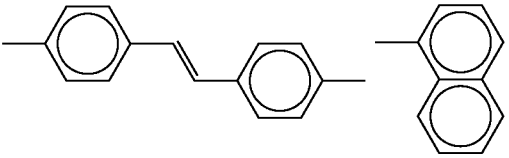 | 4, 4' | 0 | 1 | —CH$_2$CH$_2$— |
| 519 | 1 | 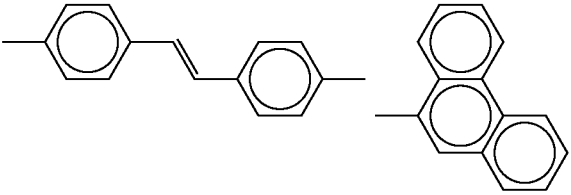 | 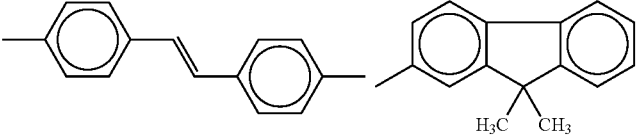 | 4, 4' | 0 | 1 | —CH$_2$CH$_2$— |
| 520 | 1 | 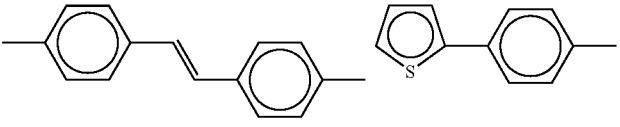 | 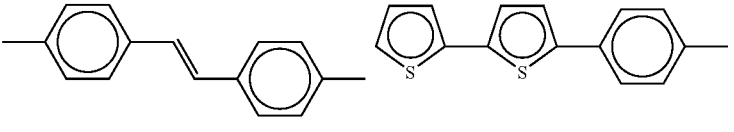 | 4, 4' | 0 | 1 | —CH$_2$CH$_2$— |
TABLE 79
| Structure | k | X | Ar | Bonding Point | i | j | T |
|---|---|---|---|---|---|---|---|
| 521 | 1 | | | 4, 4' | 0 | 1 | —(CH$_2$)$_3$— |
| 522 | 1 | | | 4, 4' | 0 | 1 | —CH$_2$— |
| 523 | 1 | | | 4, 4' | 0 | 1 | —CH$_2$CH$_2$— |
| 524 | 1 | | | 4, 4' | 0 | 1 | —CH$_2$CH$_2$— |
| 525 | 1 | | | 4, 4' | 0 | 1 | —CH$_2$CH$_2$— |
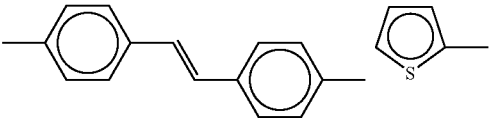

TABLE 79-continued

| Structure | k | X | Ar | Bonding Point | i | j | T |
|---|---|---|---|---|---|---|---|
| 526 | 1 | (phenyl-CH=CH-phenyl) | (bithiophene) | 4, 4' | 0 | 1 | —CH₂— |
| 527 | 1 | (phenyl-CH=CH-phenyl) | (phenyl-oxadiazole-phenyl) | 4, 4' | 0 | 1 | —(CH₂)₃— |

TABLE 80

| Structure | k | X | Ar | Bonding Point | i | j | T |
|---|---|---|---|---|---|---|---|
| 528 | 1 | (naphthyl) | (phenyl) | 4, 4' | 0 | 1 | —CH₂CH₂— |
| 529 | 1 | (naphthyl) | (phenyl-CH₃) | 4, 4' | 0 | 1 | —CH₂— |
| 530 | 1 | (naphthyl) | (dimethylphenyl) | 4, 4' | 0 | 1 | —CH₂— |
| 531 | 1 | (naphthyl) | (phenyl-OCH₃) | 4, 4' | 0 | 1 | —CH₂— |
| 532 | 1 | (naphthyl) | (phenyl-OCH₃) | 4, 4' | 0 | 1 | —CH₂CH₂— |
| 533 | 1 | (naphthyl) | (biphenyl) | 4, 4' | 0 | 1 | —CH₂CH₂— |

TABLE 80-continued
| Structure | k | X | Ar | Bonding Point | i | j | T |
|---|---|---|---|---|---|---|---|
| 534 | 1 | 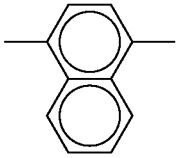 | 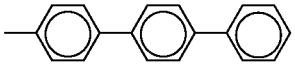 | 4, 4' | 0 | 1 | —CH$_2$— |
TABLE 81
| Structure | k | X | Ar | Bonding Point | i | j | T |
|---|---|---|---|---|---|---|---|
| 535 | 1 | 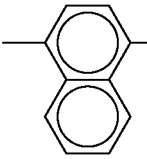 | 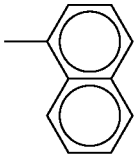 | 4, 4' | 0 | 1 | —CH$_2$CH$_2$— |
| 536 | 1 | 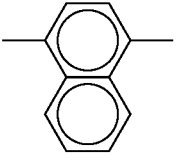 | 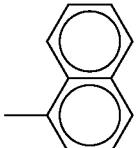 | 4, 4' | 0 | 1 | —CH$_2$— |
| 537 | 1 | 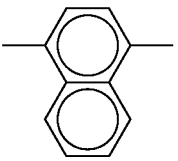 | 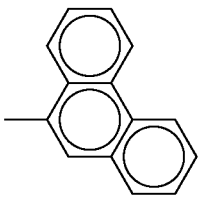 | 4, 4' | 0 | 1 | —CH$_2$— |
| 538 | 1 | 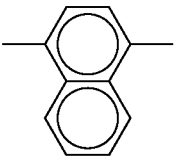 | 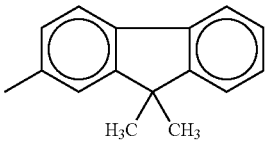 | 4, 4' | 0 | 1 | —CH$_2$— |
| 539 | 1 | 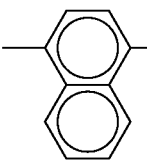 | 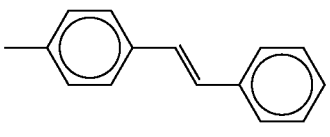 | 4, 4' | 0 | 1 | —CH$_2$CH$_2$— |
| 540 | 1 | 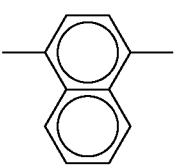 | 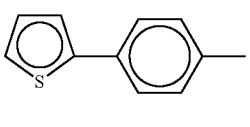 | 4, 4' | 0 | 1 | —CH$_2$— |

TABLE 81-continued
| Structure | k | X | Ar | Bonding Point | i | j | T |
|---|---|---|---|---|---|---|---|
| 541 | 1 | 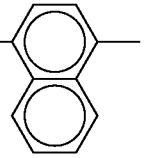 | 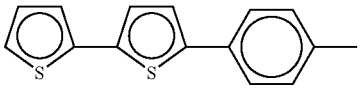 | 4, 4' | 0 | 1 | —CH$_2$— |
TABLE 82
| Structure | k | X | Ar | Bonding Point | i | j | T |
|---|---|---|---|---|---|---|---|
| 542 | 1 | 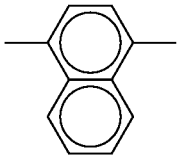 | 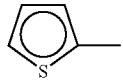 | 4,4' | 0 | 1 | —CH$_2$CH$_2$— |
| 543 | 1 | 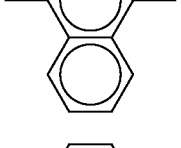 | 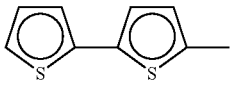 | 4,4' | 0 | 1 | —CH$_2$— |
| 544 | 1 | 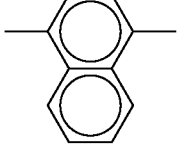 | 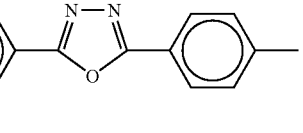 | 4,4' | 0 | 1 | —CH$_2$CH$_2$— |
| 545 | 1 | 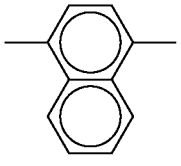 | 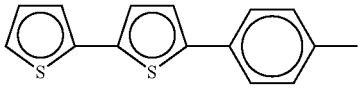 | 4,4' | 0 | 1 | —(CH$_2$)$_3$— |
| 546 | 1 | 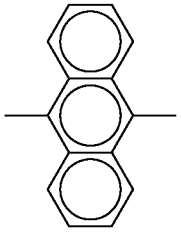 | 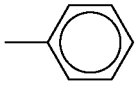 | 4,4' | 0 | 1 | —CH$_2$CH$_2$— |
| 547 | 1 | 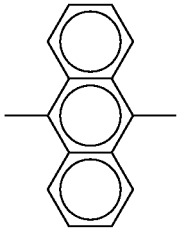 |  | 4,4' | 0 | 1 | —CH$_2$CH$_2$— |

TABLE 82-continued

| Structure | k | X | Ar | Bonding Point | i | j | T |
|---|---|---|---|---|---|---|---|
| 548 | 1 | anthracenyl | 2,3-dimethylphenyl | 4,4' | 0 | 1 | —$CH_2$— |

TABLE 83

| Structure | k | X | Ar | Bonding Point | i | j | T |
|---|---|---|---|---|---|---|---|
| 549 | 1 | anthracenyl | 2,3-dimethylphenyl | 4,4' | 0 | 1 | —$CH_2CH_2$— |
| 550 | 1 | anthracenyl | 4-methoxyphenyl | 4,4' | 0 | 1 | —$CH_2$— |
| 551 | 1 | anthracenyl | 4-methoxyphenyl | 4,4' | 0 | 1 | —$CH_2CH_2$— |
| 552 | 1 | anthracenyl | biphenyl | 4,4' | 0 | 1 | —$CH_2$— |
| 553 | 1 | anthracenyl | terphenyl | 4,4' | 0 | 1 | —$CH_2CH_2$— |

TABLE 83-continued
| Structure | k | X | Ar | Bonding Point | i | j | T |
|---|---|---|---|---|---|---|---|
| 554 | 1 | 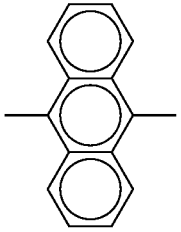 | 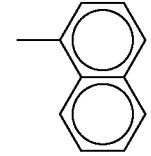 | 4,4' | 0 | 1 | —CH$_2$CH$_2$— |
TABLE 84
| Structure | k | X | Ar | Bonding Point | i | j | T |
|---|---|---|---|---|---|---|---|
| 555 | 1 | 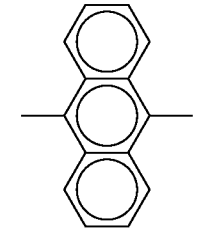 | 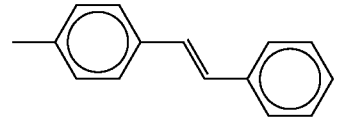 | 4,4' | 0 | 1 | —CH$_2$CH$_2$— |
| 556 | 1 | 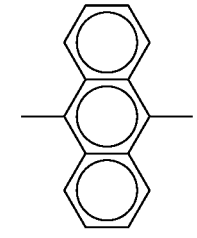 | 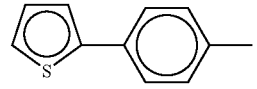 | 4,4' | 0 | 1 | —CH$_2$CH$_2$— |
| 557 | 1 | 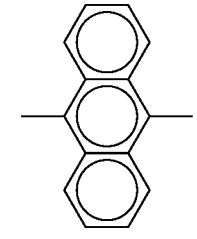 | 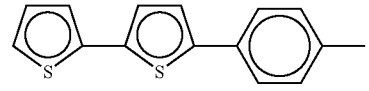 | 4,4' | 0 | 1 | —CH$_2$CH$_2$— |
| 558 | 1 | 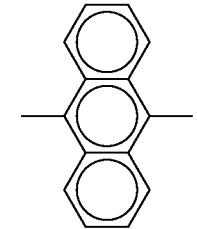 | 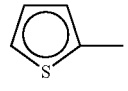 | 4,4' | 0 | 1 | —CH$_2$CH$_2$— |
| 559 | 1 | 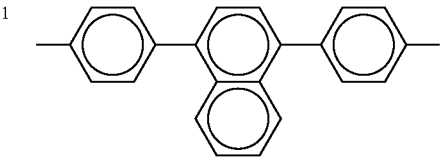 | 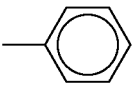 | 4,4' | 0 | 1 | —CH$_2$— |

TABLE 84-continued
| Structure | k | X | Ar | Bonding Point | i | j | T |
|---|---|---|---|---|---|---|---|
| 560 | 1 | 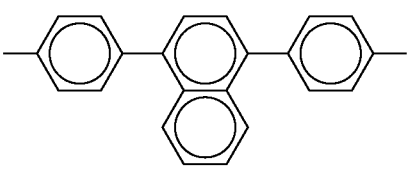 | 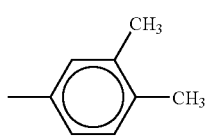 | 4,4' | 0 | 1 | —CH$_2$— |
TABLE 85
| Structure | k | X | Ar | Bonding Point | i | j | T |
|---|---|---|---|---|---|---|---|
| 561 | 1 | 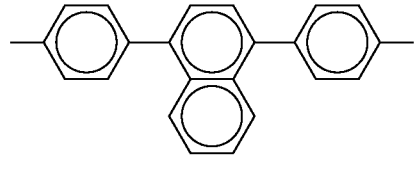 | 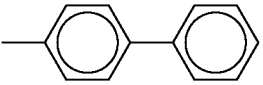 | 4,4' | 0 | 1 | —CH$_2$CH$_2$— |
| 562 | 1 | 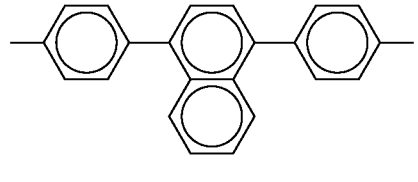 | 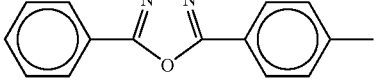 | 4,4' | 0 | 1 | —CH$_2$— |
| 563 | 1 | 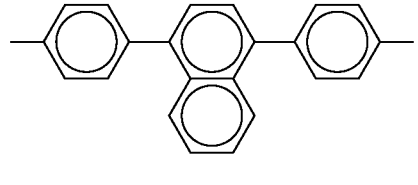 | 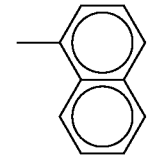 | 4,4' | 0 | 1 | —CH$_2$CH$_2$— |
| 564 | 1 | 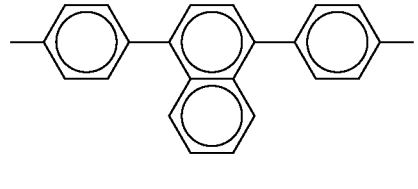 | 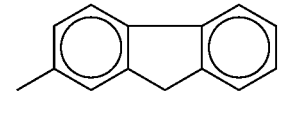 | 4,4' | 0 | 1 | —CH$_2$CH$_2$— |
| 565 | 1 | 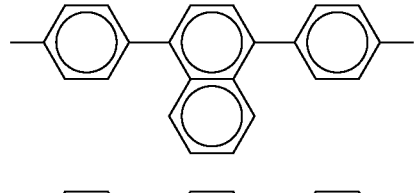 | 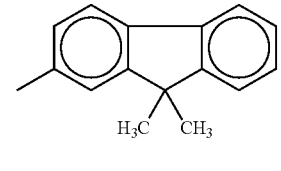 | 4,4' | 0 | 1 | —CH$_2$CH$_2$— |
| 566 | 1 | 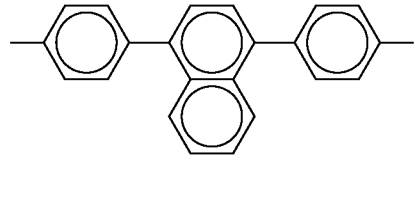 | 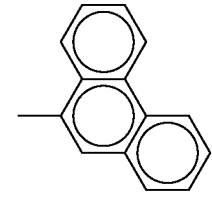 | 4,4' | 0 | 1 | —CH$_2$CH$_2$— |

TABLE 85-continued
| Structure | k | X | Ar | Bonding Point | i | j | T |
|---|---|---|---|---|---|---|---|
| 567 | 1 | 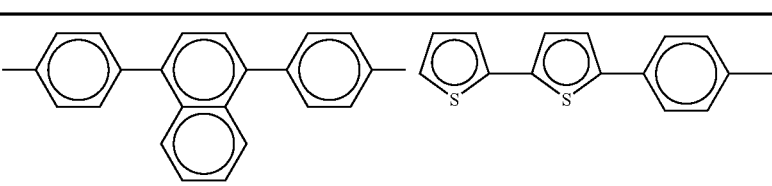 | 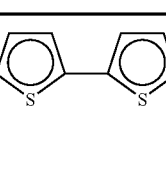 | 4,4' | 0 | 1 | —(CH$_2$)$_3$— |
TABLE 86
| Structure | k | X | Ar | Bonding Point | i | j | T |
|---|---|---|---|---|---|---|---|
| 568 | 1 | 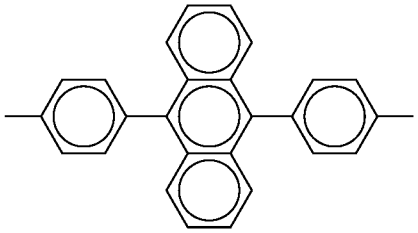 | 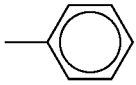 | 4,4' | 0 | 1 | —CH$_2$CH$_2$— |
| 569 | 1 | 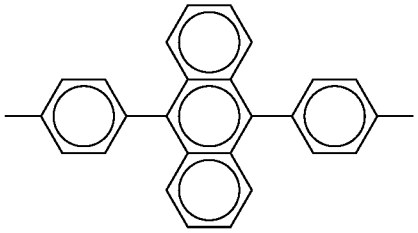 |  | 4,4' | 0 | 1 | —CH$_2$CH$_2$— |
| 570 | 1 | 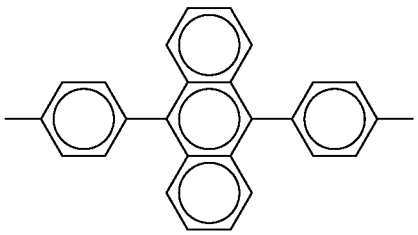 | 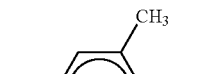 | 4,4' | 0 | 1 | —CH$_2$CH$_2$— |
| 571 | 1 | 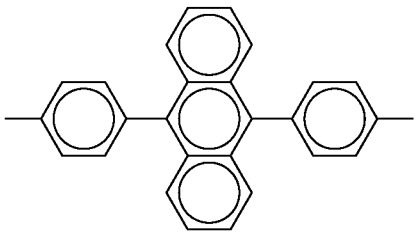 | 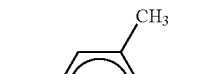 | 4,4' | 0 | 1 | —CH$_2$CH$_2$— |
| 572 | 1 | 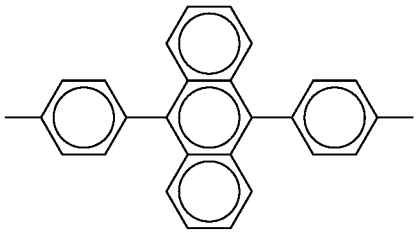 | 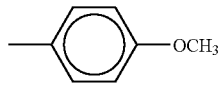 | 4,4' | 0 | 1 | —CH$_2$— |

TABLE 86-continued
| Structure | k | X | Ar | Bonding Point | i | j | T |
|---|---|---|---|---|---|---|---|
| 573 | 1 | 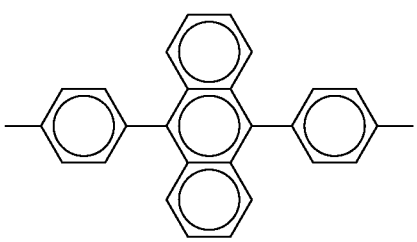 | 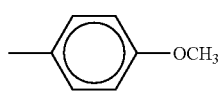 | 4,4' | 0 | 1 | —(CH$_2$)$_3$— |
TABLE 87
| Structure | k | X | Ar | Bonding Point | i | j | T |
|---|---|---|---|---|---|---|---|
| 574 | 1 | 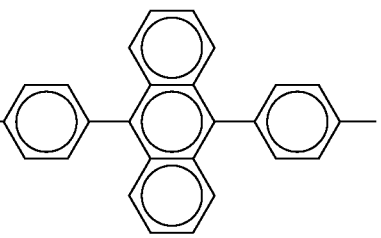 | 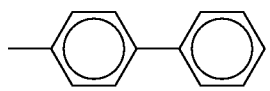 | 4,4' | 0 | 1 | —CH$_2$CH$_2$— |
| 575 | 1 | 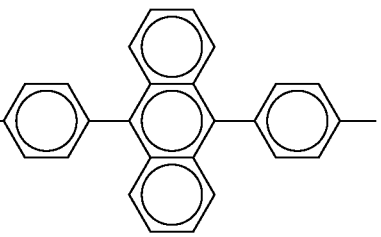 | 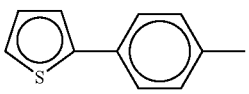 | 4,4' | 0 | 1 | —CH$_2$CH$_2$— |
| 576 | 1 | 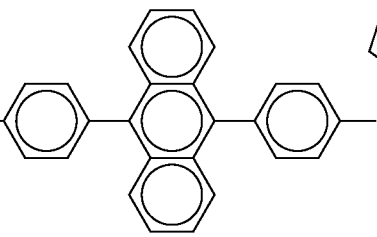 | 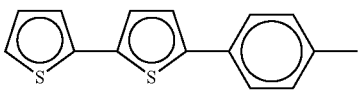 | 4,4' | 0 | 1 | —(CH$_2$)$_3$— |
| 577 | 1 | 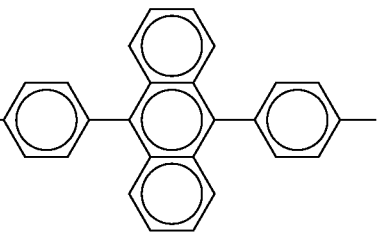 | 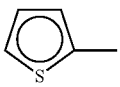 | 4,4' | 0 | 1 | —CH$_2$— |

TABLE 87-continued

| Structure | k | X | Ar | Bonding Point | i | j | T |
|---|---|---|---|---|---|---|---|
| 578 | 1 | (anthracene with two phenyl substituents) | (bithiophene) | 4,4' | 0 | 1 | —(CH$_2$)$_3$— |
| 579 | 1 | (anthracene with two phenyl substituents) | (1,3,4-oxadiazole with two phenyl groups) | 4,4' | 0 | 1 | —CH$_2$— |

TABLE 88

| Structure | k | X | Ar | Bonding Point | i | j | T |
|---|---|---|---|---|---|---|---|
| 580 | 1 | (spirobifluorene) | (phenyl) | 4,4' | 0 | 1 | —CH$_2$CH$_2$— |
| 581 | 1 | (spirobifluorene) | (methylphenyl) | 4,4' | 0 | 1 | —CH$_2$CH$_2$— |
| 582 | 1 | (spirobifluorene) | (dimethylphenyl) | 4,4' | 0 | 1 | —CH$_2$— |
| 583 | 1 | (spirobifluorene) | (dimethylphenyl) | 4,4' | 0 | 1 | —(CH$_2$)$_3$— |

TABLE 88-continued

| Structure | k | X | Ar | Bonding Point | i | j | T |
|---|---|---|---|---|---|---|---|
| 584 | 1 | (fluorene-spiro-fluorene structure) | —⟨phenyl⟩—OCH₃ | 4,4' | 0 | 1 | —CH₂CH₂— |

A non-conjugated polymer comprising a repetition unit at least one partial structure selected from the group consisting of the general formulas (I-1) and (I-2) is not particularly limited, but a polyester represented by the following formula (II-1) or (II-2), a polyether represented by the following general formula (III-1), and a polyurethane represented by the following general formula (IV-1) or (IV-2) are suitable.

selected from the structures represented by the general formulas (I-1) and (I-2), and two or more structures may be used, if necessary.

In addition, in the non-conjugated polymer used in the invention as explained above, at least one of terminal groups has a fluorescent substance emitting fluorescence in a solid state. Such a fluorescent substance may be an inorganic fluo-

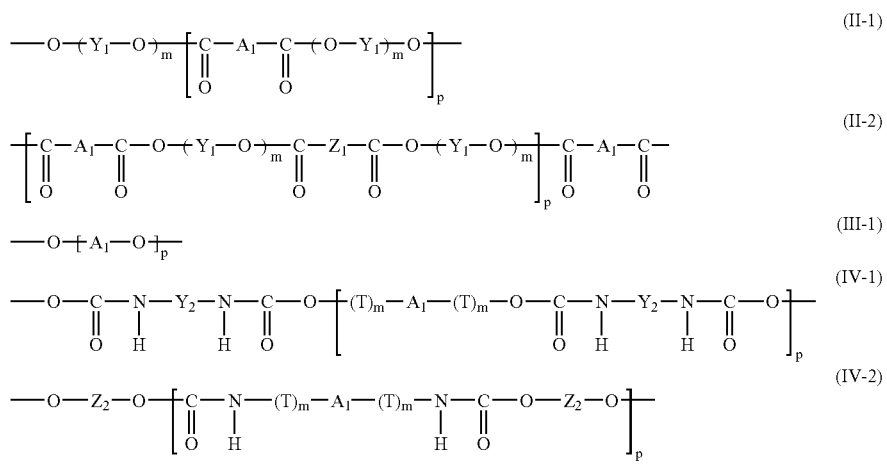

In the general formulas (II-1) and (II-2), $A_1$ represents at least one selected from the structures represented by the above general formulas (I-1) and (I-2), $Y_1$ represents a divalent alcohol residue, $Z_1$ represents a divalent carboxylic acid residue, m represents an integer of 1 to 5, and p represents selected from a range of 5 to 5,000.

In the general formula (III-1), $A_1$ represents at least one selected from the structures represented by the above general formulas (I-1) and (I-2), and p represents an integer from 5 to 5,000.

In addition, in the general formulas (IV-1) and (IV-2), $A_1$ represents at least one selected from the structures represented by the above general formulas (I-1) and (I-2), T represents a divalent straight hydrocarbon group having a carbon number of 1 to 6, or a divalent branched hydrocarbon group having a carbon number of 2 to 10, $Y_2$ and $Z_2$ represent divalent diisocyanate, alcohol or amine residue, m represents an integer from 1 to 5, and p represents an integer from 5 to 5,000.

The structure represented by $A_1$ in the general formulas (II-1), (II-2), (III-1), (IV-1) and (IV-4) represents at least one rescent substance or an organic fluorescent substance, an organic fluorescent substance is preferable in view of a magnitude of light emitting quantum efficiency and diversity of a material, and an organic fluorescent substance which has a further high quantum efficiency, is chemically stable, and has heat resistance is more preferable.

Examples of such a organic fluorescent substance include a compound having a substituted or unsubstituted monovalent benzene ring or a substituted or unsubstituted monovalent polynuclear aromatic hydrocarbon having an aromatic ring number of 2 to 10, a compound having a substituted or unsubstituted monovalent condensed aromatic hydrocarbon having an aromatic ring number of 2 to 10, and a compound having a substituted or unsubstituted monovalent aromatic heterocyclic ring.

More specifically, examples thereof include polyacene derivative compounds such as a naphthalene derivative, an anthracene derivative, a tetracene derivative, a perylene derivative, a pyrene derivative and the like, a styrylamine compound, a quinacridone derivative compound, a rubulene derivative compound, a coumarin derivative compound and a pyran derivative compound In addition, since chelating metal complexes containing a metal such as Al, Zn, Be, Mg, Eu, Ga, Pt, Ir and the like have high fluorescent quantum efficiency, are chemically stable and have heat resistance, they can be suitably used as a fluorescent substance.

In addition, it is preferable that a maximum peak wavelength of fluorescent spectrum of a fluorescent substance is in the visible light region (380 nm to 700 nm). When a maximum peak wavelength is outside a range of the visible light region, sufficient light emitting intensity is not obtained in some cases.

Examples of such a fluorescent substance are shown in Tables 89 to 95, but the fluorescent substance used in the invention is not limited to them.

TABLE 89

| Structure | Fluorscent material |
|---|---|
| 585 | |
| 586 | |
| 587 | |

TABLE 89-continued

| Structure | Fluorescent material |
|---|---|
| 588 | |
| 589 | |
| 590 | |
| 591 | |

TABLE 89-continued
| Structure | Fluorscent material |
| --- | --- |
| 592 | 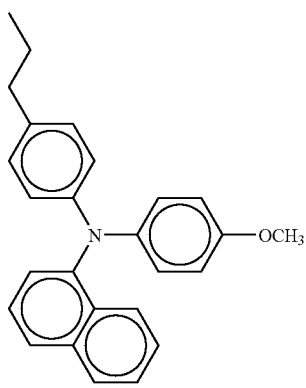 |
| 593 | 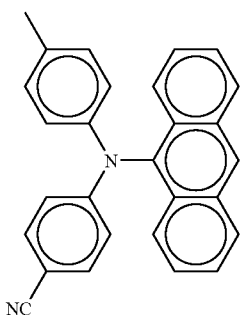 |
| 594 | 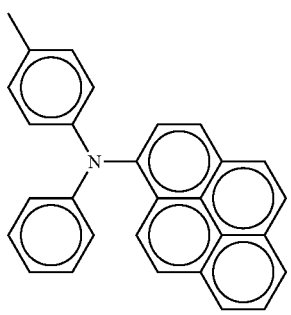 |
TABLE 89-continued
| Structure | Fluorscent material |
| --- | --- |
| 595 | 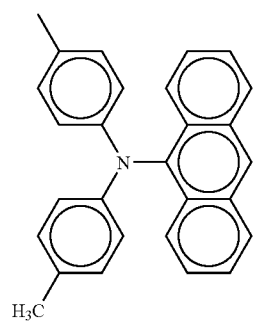 |
| 596 | 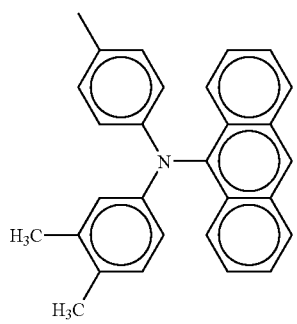 |
TABLE 90
| Structure | Fluorscent material |
| --- | --- |
| 597 | 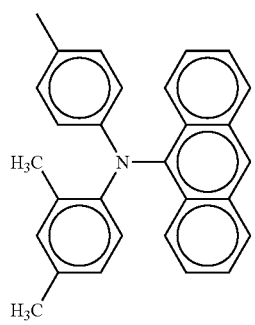 |

TABLE 90-continued

| Structure | Fluorscent material |
| --- | --- |
| 598 | |
| 599 | |
| 600 | |
| 601 | |

TABLE 90-continued
| Structure | Fluorscent material |
| --- | --- |
| 602 | 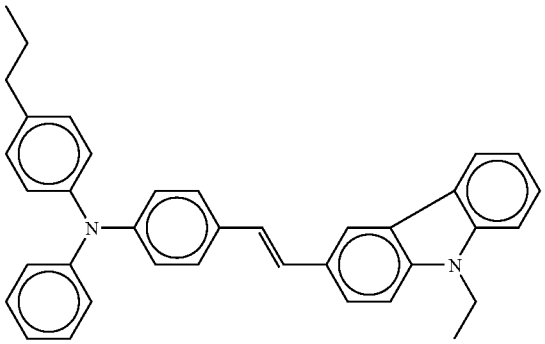 |
| 603 | 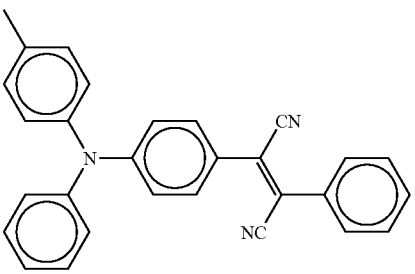 |
| 604 | 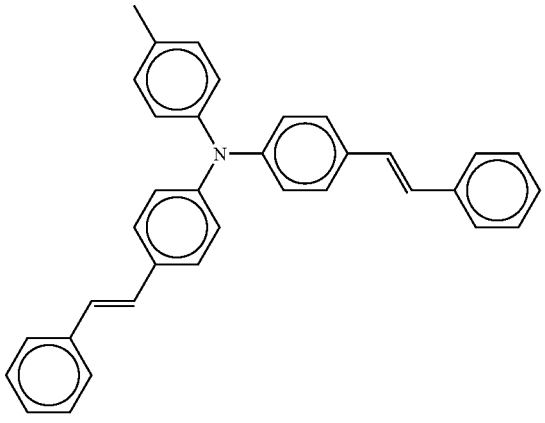 |
| 605 | 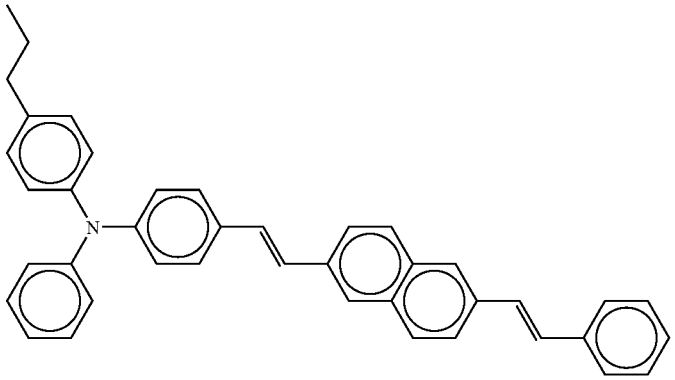 |

TABLE 90-continued
| Structure | Fluorscent material |
|---|---|
| 606 | 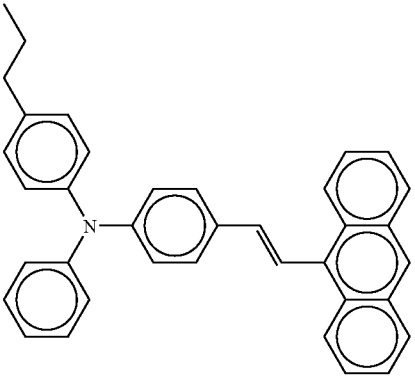 |
| 607 | 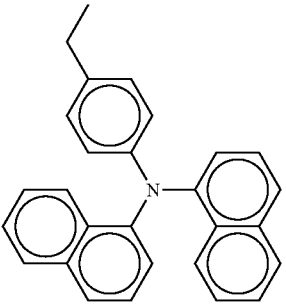 |
| 608 | 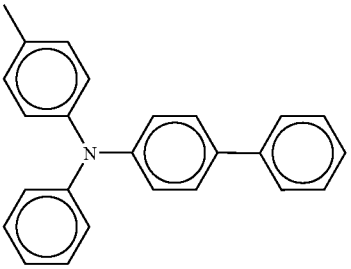 |
TABLE 91
| Structure | Fluorscent material |
|---|---|
| 609 | 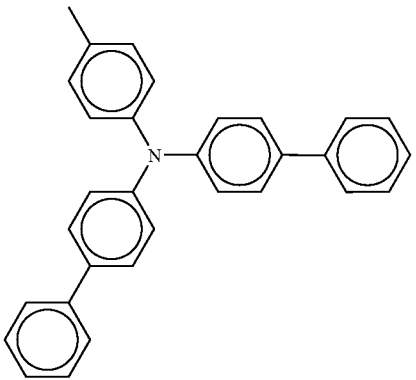 |

TABLE 91-continued
| Structure | Fluorscent material |
|---|---|
| 610 | 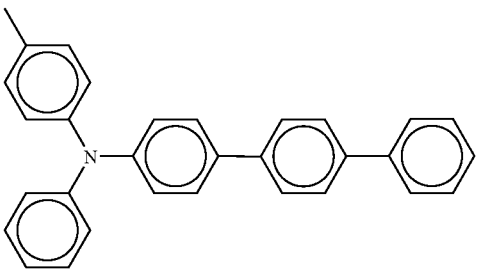 |
| 611 | 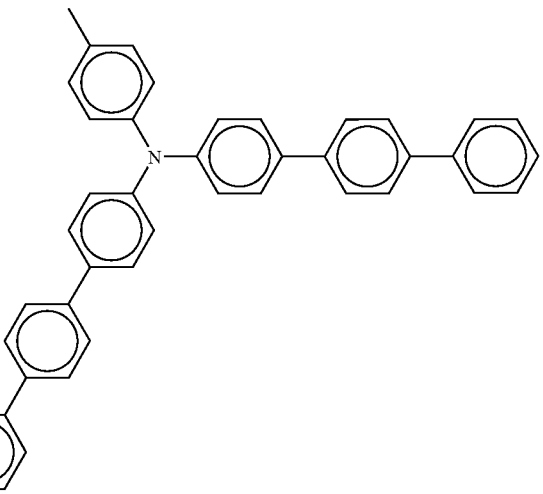 |
| 612 | 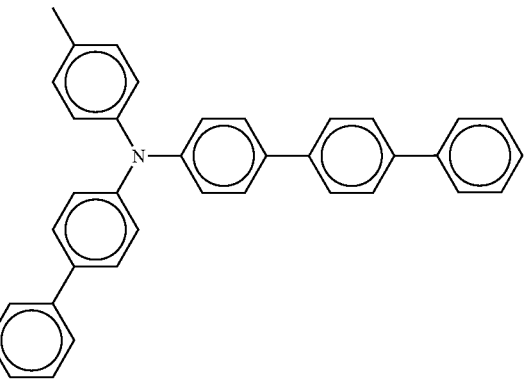 |
| 613 | 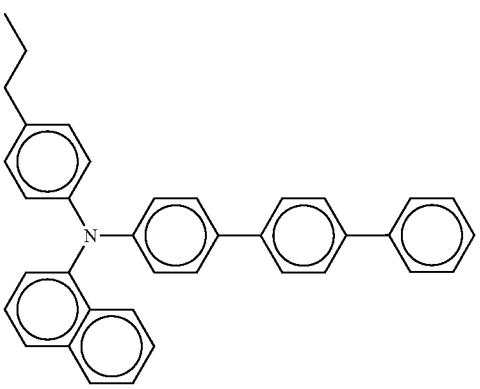 |

TABLE 91-continued
| Structure | Fluorscent material |
|---|---|
| 614 | 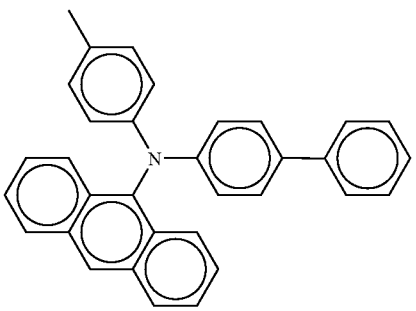 |
| 615 | 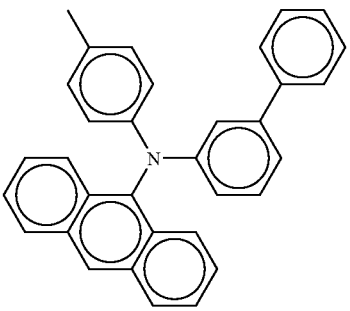 |
| 616 | 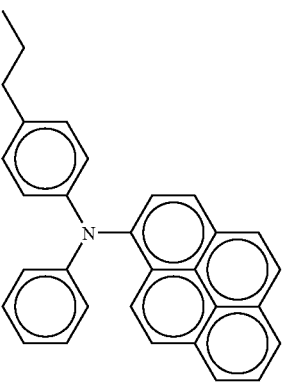 |
| 617 | 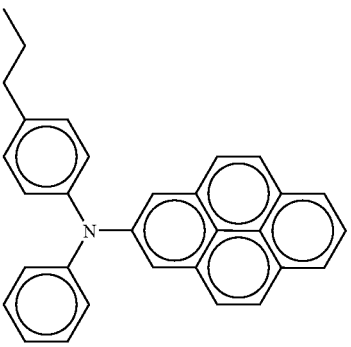 |

TABLE 91-continued
| Structure | Fluorscent material |
|---|---|
| 618 | 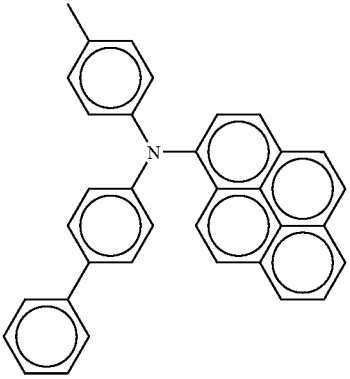 |
TABLE 92
| Structure | Fluorscent material |
|---|---|
| 619 | 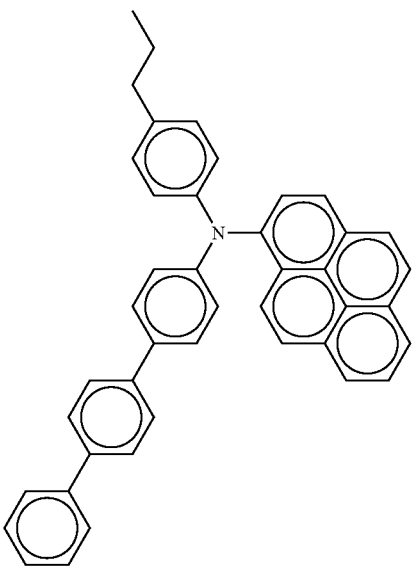 |
| 620 | 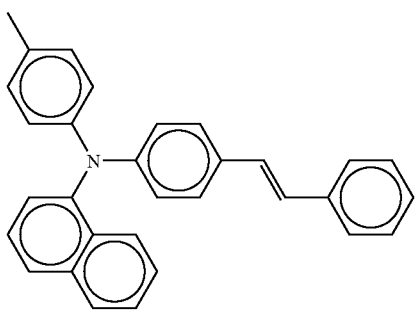 |
TABLE 92-continued
| Structure | Fluorscent material |
|---|---|
| 621 | 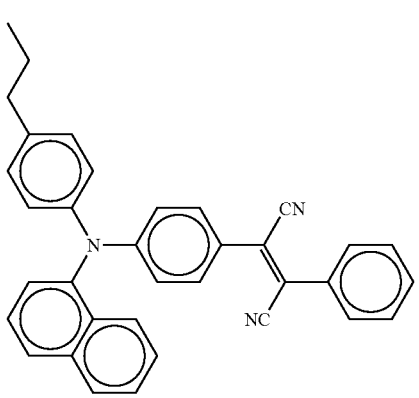 |
| 622 | 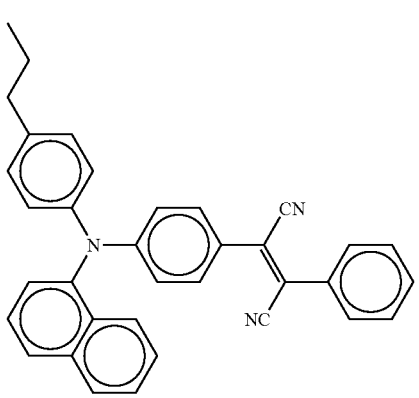 |

TABLE 92-continued
| Structure | Fluorscent material |
|---|---|
| 623 | 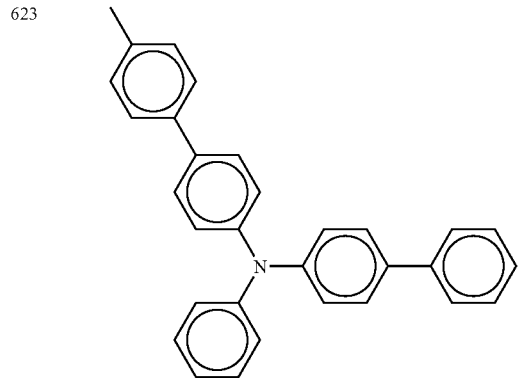 |
| 624 | 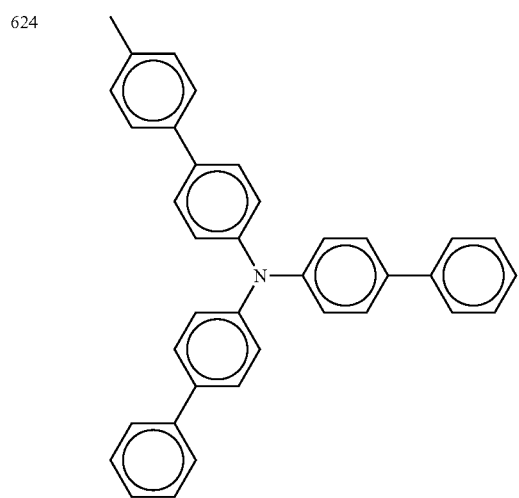 |
| 625 | 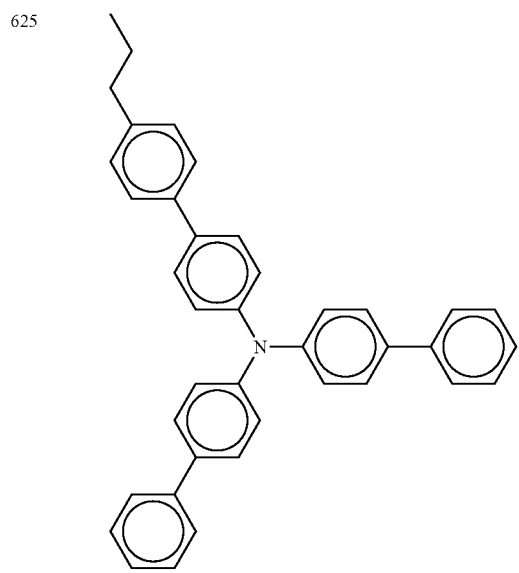 |
| 626 | 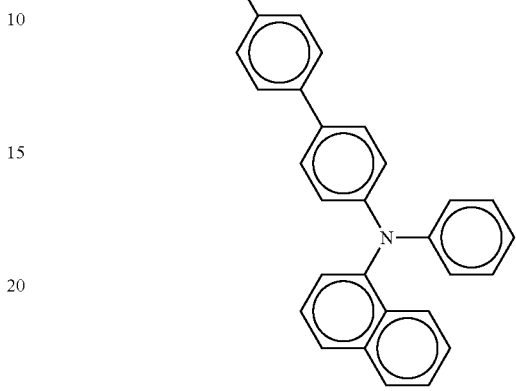 |
| 627 | 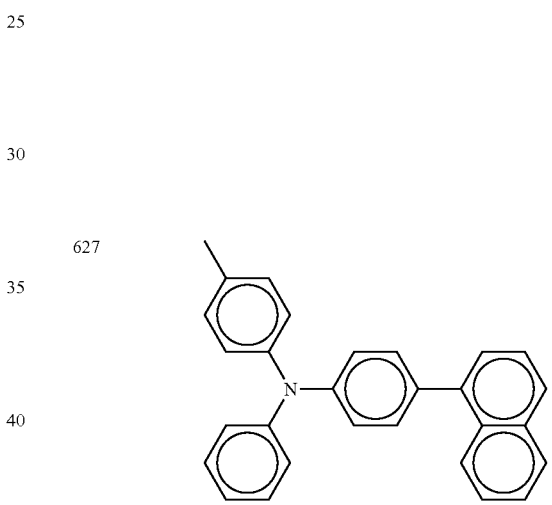 |
| 628 | 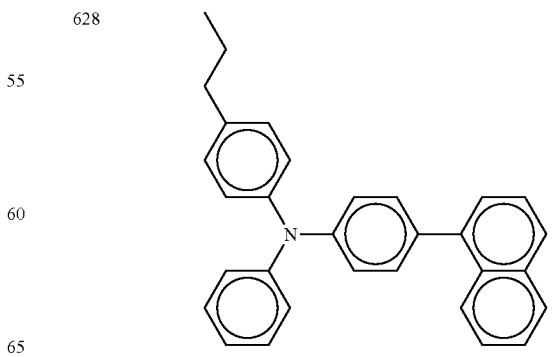 |

TABLE 93
| Structure | Fluorscent material |
|---|---|
| 629 | 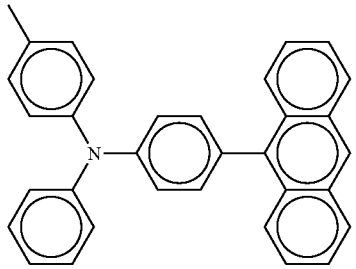 |
| 630 | 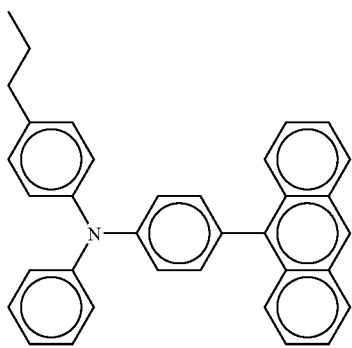 |
| 631 | 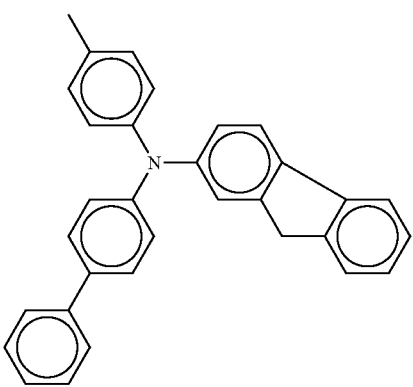 |
TABLE 93-continued
| Structure | Fluorscent material |
|---|---|
| 632 | 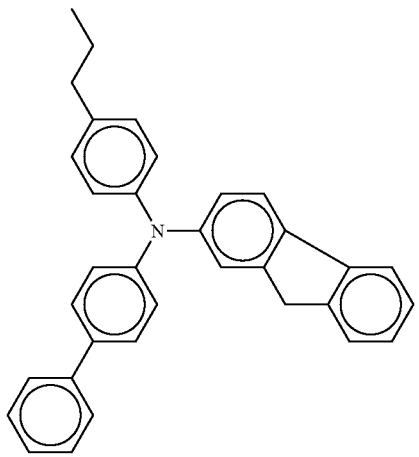 |
| 633 | 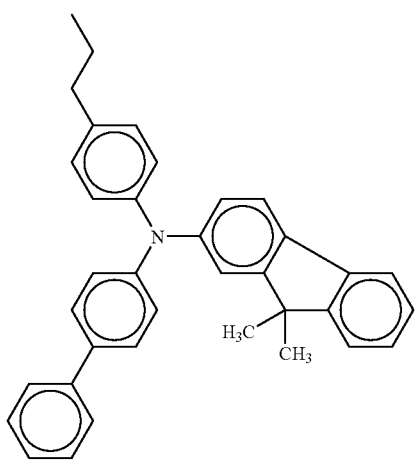 |

TABLE 93-continued
| Structure | Fluorscent material |
|---|---|
| 634 | |
| 635 | |
| 636 | |
| 637 | |
| 638 | |
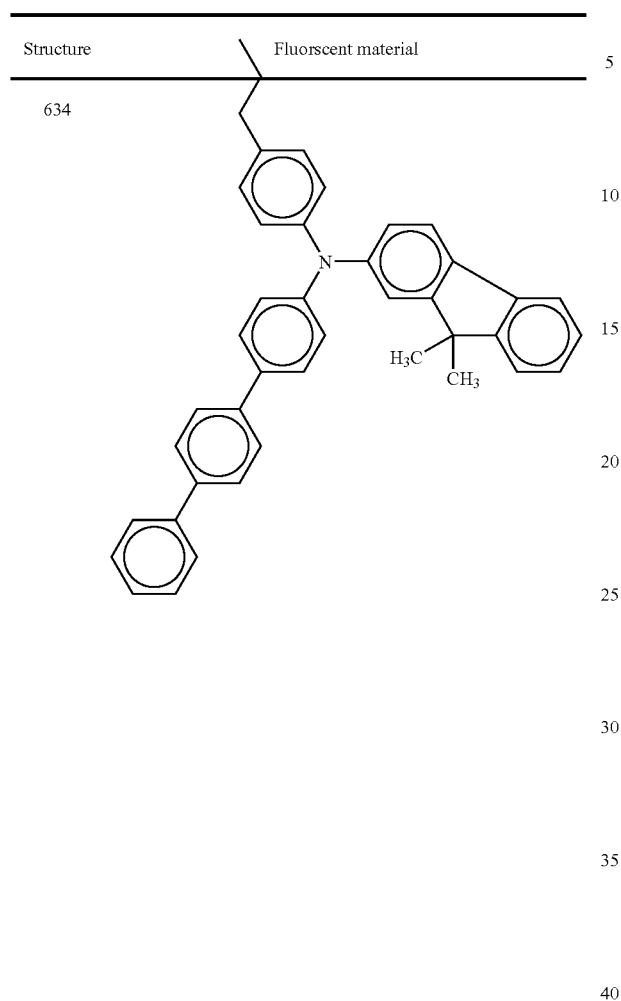
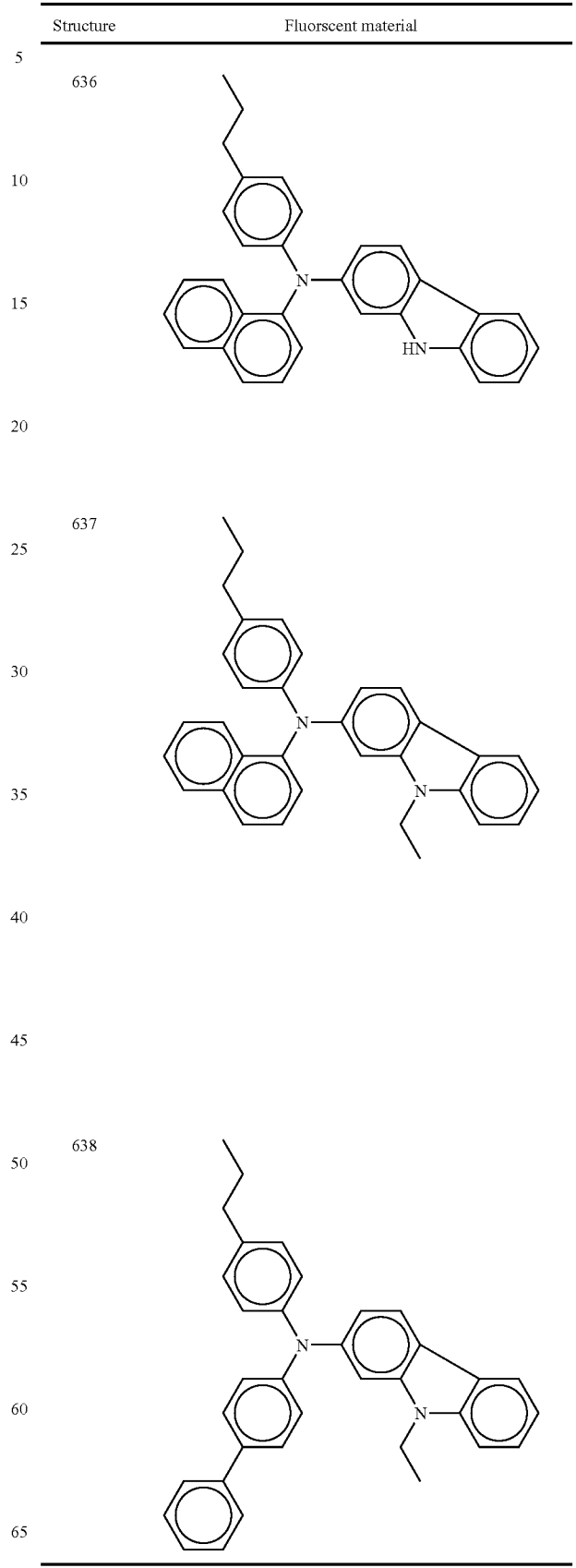

TABLE 94
| Structure | Fluorscent material |
|---|---|
| 639 | 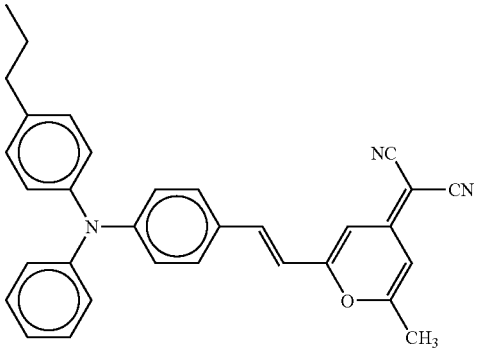 |
| 640 | 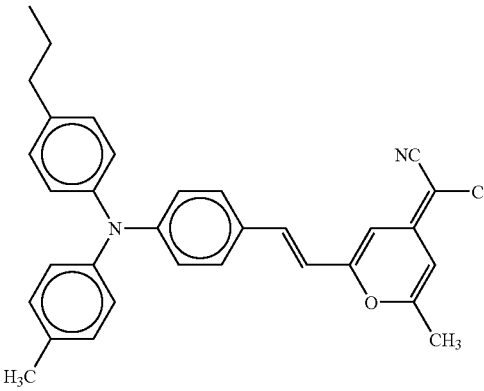 |
| 641 | 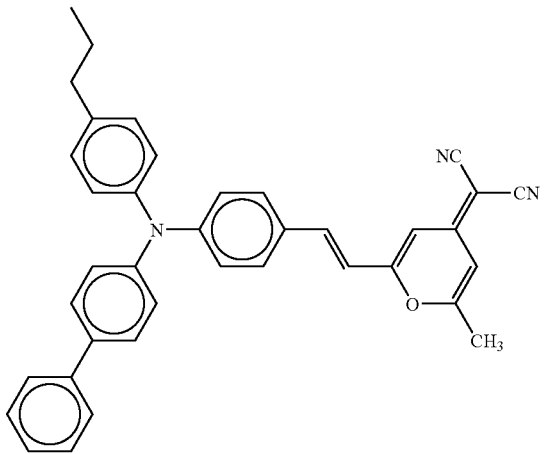 |

TABLE 94-continued

| Structure | Fluorscent material |
| --- | --- |
| 642 | |
| 643 | |
| 644 | |
| 645 | |

TABLE 94-continued
| Structure | Fluorscent material |
|---|---|
| 646 | 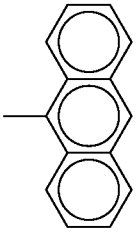 |
| 647 | 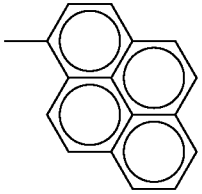 |
| 648 | 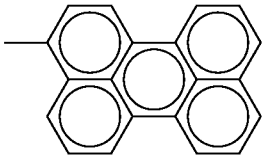 |
| 649 | 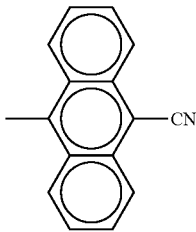 |
| 650 | 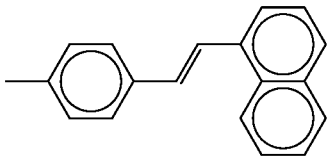 |
TABLE 95
| Structure | Fluorscent material |
|---|---|
| 651 | 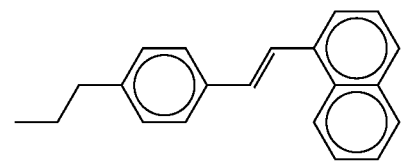 |
| 652 | 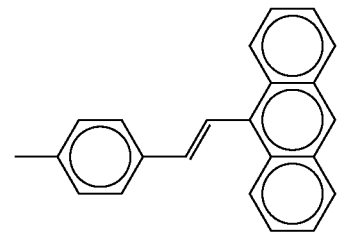 |

TABLE 95-continued

| Structure | Fluorscent material |
|---|---|
| 653 | |
| 654 | |
| 655 | |
| 656 | |
| 657 | |

TABLE 95-continued

| Structure | Fluorscent material |
|---|---|
| 658 | 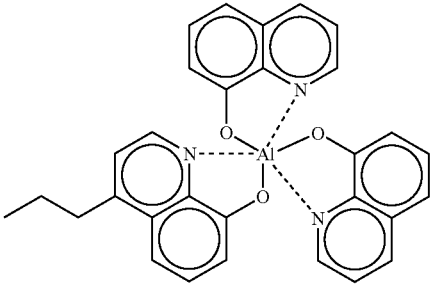 |
| 659 | 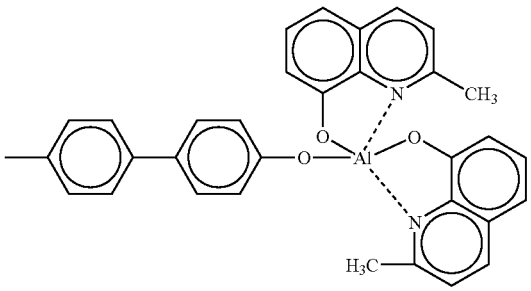 |
| 660 | 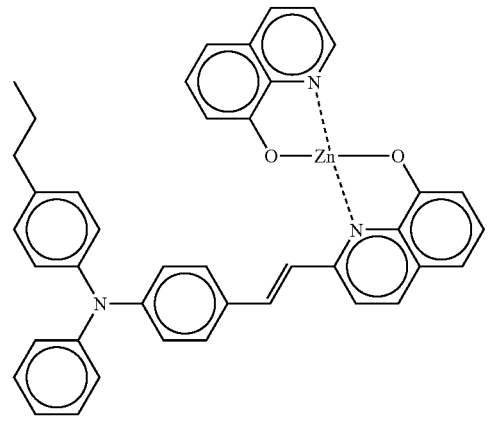 |

A weight average molecular weight Mw of the non-conjugated polymer used in the invention is not particularly limited, but when the non-conjugated polymer comprises a repetition unit containing at least one partial structure selected from the group consisting of the general formulas (I-1) and (I-2), it is preferable that the weight average molecular weigh Mw is in the range of 5000 to 300000.

Below, as a non-conjugated polymer, examples of polyester represented by the general formula (I-1) or (II-2) are shown in Tables 96 to 101, examples of polyether represented by the general formula (III-1) are shown in Tables 102 to 103, and examples of polyurethane represented by the general formula (IV-1) or (IV-2) are shown in Tables 104 to 107, but the polyester, the polyether and the polyurethane used in the invention are not limited to these examples.

Herein, the number in "$A_1$" column of the "monomer" in Tables 96 to 107 corresponds to a compound having the number described in "structure" column in Tables 1 to 88 (specific examples of the above general formulas (I-1) and (I-2)). In addition, "m" means "m" shown in the general formulas (I-1) and (I-2). Hereinafter, an example (compound) with each number added thereto in Tables 96 to 107 is described as an example compound and, for example, an example with number 15 added thereto describes an exemplified compound (15).

In addition, in Table 96 to Table 101, example compounds, a partial structure of which is described only in "$Y_1$" column, among "$Y_1$" and "$Z_1$" columns, mean polyester represented by the general formula (II-1). In addition, example compounds, a partial structure of which is described in both "$Y_1$" and "$Z_1$" columns, mean polyester represented by the general formula (II-2).

In addition, in Table 104 to Table 107, example compounds, a partial structure of which is described only in "$Y_2$" column, among "$Y_2$" and "$Z_2$" columns, mean polyurethane represented by the general formula (IV-1). In addition, example compounds, a partial structure of which is described only in "$Z_2$" column, among "$Y_2$" and "$Z_2$" columns, mean polyurethane represented by the general formula (IV-2).

TABLE 96

| Compound | Monomer A₁ | Ratio | Y₁ | Z₁ | Fluorscent material | m | p |
|---|---|---|---|---|---|---|---|
| (1) | 2 | — | —CH₂CH₂— | — | 585 | 1 | 12 |
| (2) | 5 | — | —CH₂CH₂— | — | 585 | 1 | 50 |
| (3) | 9 | — | —CH₂CH₂— | — | 585 | 1 | 58 |
| (4) | 9 | — | —CH₂CH₂— | 1,4-phenylene | 585 | 1 | 62 |
| (5) | 9 | — | —CH₂CH₂— | 1,4-phenylene | 585 | 1 | 95 |
| (6) | 9 | — | —CH₂CH₂— | 1,3-phenylene | 585 | 2 | 48 |
| (7) | 13 | — | 1,4-cyclohexylene | — | 587 | 1 | 35 |
| (8) | 13 | — | 1,2-cyclohexylene | —(CH₂)₄— | 587 | 1 | 31 |
| (9) | 19 | — | —CH₂-(1,4-cyclohexylene)-CH₂— | — | 587 | 1 | 25 |
| (10) | 19 | — | —CH₂CH₂— | — | 587 | 1 | 25 |
| (11) | 41 | — | —CH₂CH₂— | — | 589 | 1 | 25 |
| (12) | 42 | — | —CH₂CH₂— | — | 589 | 1 | 47 |
| (13) | 42 | — | —CH₂CH₂— | 1,4-phenylene | 590 | 2 | 75 |
| (14) | 39 | — | —CH₂CH₂— | —(CH₂)₄— | 590 | 1 | 89 |

TABLE 97

| Compound | Monomer A₁ | Ratio | Y₁ | Z₁ | Fluorscent material | m | p |
|---|---|---|---|---|---|---|---|
| (15) | 46 | — | —CH₂CH₂— | — | 594 | 1 | 59 |
| (16) | 46 | — | —CH₂CH₂— | 1,4-phenylene | 594 | 2 | 44 |
| (17) | 49 | — | 1,4-cyclohexylene | — | 594 | 1 | 78 |
| (18) | 53 | — | 1,4-cyclohexylene | — | 594 | 1 | 74 |
| (19) | 80 | — | —CH₂-(1,4-cyclohexylene)-CH₂— | 4,4'-biphenylene | 600 | 1 | 67 |

TABLE 97-continued
| Compound | Monomer A₁ | Ratio | Y₁ | Z₁ | Fluorscent material | m | p |
|---|---|---|---|---|---|---|---|
| (20) | 80 | — | —CH₂CH₂— | — | 603 | 1 | 55 |
| (21) | 80 | — | —CH₂CH₂— |  | 609 | 1 | 87 |
| (22) | 85 | — |  | — | 609 | 1 | 48 |
| (23) | 87 | — | 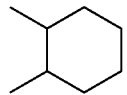 | — | 609 | 1 | 36 |
| (24) | 87 | — | 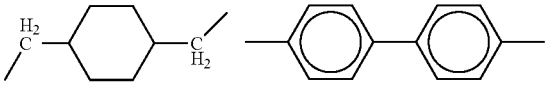 |  | 609 | 1 | 66 |
| (25) | 88 | — | —CH₂CH₂— | — | 616 | 1 | 48 |
| (26) | 92 | — | —CH₂CH₂— | — | 616 | 1 | 44 |
TABLE 98
| Compound | Mononer A₁ | Ratio | Y₁ | Z₁ | Fluorscent material | m | p |
|---|---|---|---|---|---|---|---|
| (27) | 127 | — | —CH₂CH₂— |  | 616 | 1 | 85 |
| (28) | 127 | — | 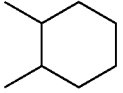 | — | 616 | 1 | 66 |
| (29) | 127 | — | 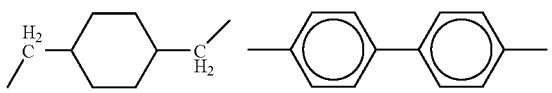 | — | 616 | 1 | 78 |
| (30) | 127 | — |  | | 616 | 1 | 14 |
| (31) | 137 | — | —CH₂CH₂— | — | 626 | 1 | 74 |
| (32) | 156 | — | —CH₂CH₂— | | 629 | 1 | 74 |
| (33) | 160 | — | —CH₂CH₂— | — | 633 | 1 | 56 |
| (34) | 173 | — | —CH₂CH₂— | — | 618 | 1 | 63 |
| (35) | 175 | — | —CH₂CH₂— | — | 618 | 1 | 78 |
| (36) | 178 | — | —CH₂CH₂— | — | 618 | 1 | 75 |
| (37) | 181 | — | —CH₂CH₂— | — | 618 | 1 | 25 |
| (38) | 182 | — | —CH₂CH₂— | — | 618 | 1 | 65 |
| (39) | 183 | — | —CH₂CH₂— | — | 618 | 1 | 45 |
| (40) | 191 | — | —CH₂CH₂— | — | 630 | 1 | 42 |
| (41) | 193 | — | —CH₂CH₂— | — | 630 | 1 | 85 |

TABLE 99

| Compound | Monomer A₁ | Ratio | Y₁ | Z₁ | Fluorsoent material | m | p |
|---|---|---|---|---|---|---|---|
| (42) | 233 | — | —CH₂CH₂— | — | 630 | 1 | 45 |
| (43) | 234 | — | —CH₂CH₂— | — | 630 | 1 | 54 |
| (44) | 238 | — | —CH₂CH₂ | 1,3-phenylene | 616 | 1 | 86 |
| (45) | 243 | — | —(CH₂)₄— | —(CH₂)₄— | 616 | 1 | 65 |
| (46) | 243 | — | 1,4-cyclohexylene | — | 616 | 1 | 23 |
| (47) | 243 | — | —CH₂CH₂— | — | 606 | 1 | 78 |
| (48) | 243 | — | —CH₂CH₂ | 1,4-phenylene | 587 | 1 | 92 |
| (49) | 248 | — | 1,4-cyclohexylene | — | 597 | 1 | 79 |
| (50) | 249 | — | —CH₂CH₂— | — | 597 | 1 | 86 |
| (51) | 251 | — | —CH₂CH₂— | — | 604 | 1 | 58 |
| (52) | 251 | — | 1,4-cyclohexylene | — | 639 | 1 | 98 |
| (53) | 255 | — | 1,2-cyclohexylene | — | 639 | 1 | 36 |
| (54) | 262 | — | —CH₂CH₂— | — | 639 | 1 | 59 |
| (55) | 267 | — | —CH₂CH₂— | 1,4-phenylene | 645 | 1 | 48 |

TABLE 100

| Compound | Monomer A₁ | Ratio | Y₁ | Z₁ | Fluorscent material | m | p |
|---|---|---|---|---|---|---|---|
| (56) | 305 | — | 1,4-cyclohexylene | — | 655 | 1 | 18 |
| (57) | 307 | — | 1,2-cyclohexylene | — | 655 | 1 | 47 |
| (58) | 305 | — | —CH₂–(1,4-cyclohexylene)–CH₂— | 4,4'-biphenylene | 655 | 1 | 22 |
| (59) | 267 | — | —CH₂CH₂— | — | 655 | 1 | 45 |

TABLE 100-continued
| Compound | Monomer A₁ | Ratio | Y₁ | Z₁ | Fluorscent material | m | p |
|---|---|---|---|---|---|---|---|
| (60) | 336 | — | —CH₂CH₂— |  | 656 | 1 | 56 |
| (61) | 336 | — | 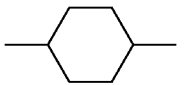 | — | 656 | 1 | 44 |
| (62) | 336 | — | 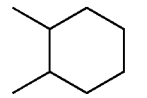 | — | 656 | 1 | 47 |
| (63) | 352 | — | 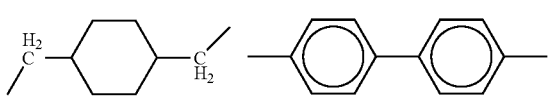 | 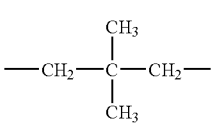 | 656 | 1 | 35 |
| (64) | 352 | — | 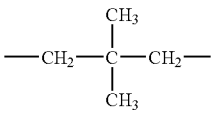 | — | 656 | 1 | 38 |
| (65) | 376 | — | 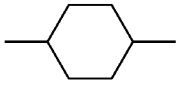 | — | 656 | 1 | 75 |
TABLE 101
| Compound | Monomer A₁ | Ratio | Y₁ | Z₁ | Fluorescent material | m | p |
|---|---|---|---|---|---|---|---|
| (66) | 376 | — | 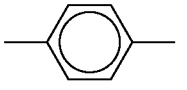 | — | 659 | 1 | 53 |
| (67) | 379 | — | —CH₂CH₂— | — | 659 | 1 | 45 |
| (68) | 379 | — | —CH₂CH₂— | 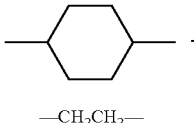 | 658 | 1 | 55 |
| (69) | 7/92 | 1/1 | —CH₂CH₂— | — | 658 | 1 | 63 |
| (70) | 7/92 | 1/1 | —CH₂CH₂— | — | 658 | 2 | 80 |
| (71) | 7/92 | 1/1 |  | 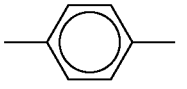 | 658 | 1 | 45 |
| (72) | 7/92 | 1/1 | —CH₂CH₂— | — | 658 | 1 | 43 |
| (73) | 7/127 | 1/1 | —CH₂CH₂— | — | 618 | 1 | 60 |
| (74) | 7/127 | 1/1 | —CH₂CH₂— | — | 613 | 2 | 26 |
| (75) | 7/175 | 1/1 | —CH₂CH₂— | — | 613 | 1 | 24 |
| (76) | 7/92/175 | 1/1/1 | —CH₂CH₂— | — | 618 | 1 | 75 |
| (77) | 173/220 | 1/1 | —CH₂CH₂— | — | 613 | 1 | 63 |
| (78) | 7/311 | 1/1 | —CH₂CH₂— | 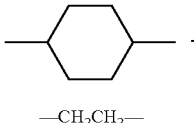 | 613 | 1 | 70 |
| (79) | 7/311 | 1/2 | —CH₂CH₂— | — | 618 | 1 | 42 |
| (80) | 311/338 | 2/1 | —CH₂CH₂— | — | 613 | 1 | 38 |

TABLE 102

| Compound | Monomer A₁ | Ratio | Fluorscent material | m | p |
|---|---|---|---|---|---|
| (81) | 3 | — | 585 | 1 | 23 |
| (82) | 5 | — | 587 | 2 | 43 |
| (83) | 6 | — | 587 | 1 | 45 |
| (84) | 7 | — | 587 | 1 | 70 |
| (85) | 12 | — | 587 | 2 | 45 |
| (86) | 12 | — | 587 | 1 | 65 |
| (87) | 19 | — | 587 | 1 | 35 |
| (88) | 20 | — | 587 | 0 | 31 |
| (89) | 22 | — | 587 | 1 | 45 |
| (90) | 41 | — | 587 | 1 | 68 |
| (91) | 43 | — | 587 | 1 | 74 |
| (92) | 44 | — | 587 | 1 | 35 |
| (93) | 47 | — | 600 | 2 | 36 |
| (94) | 49 | — | 600 | 1 | 62 |
| (95) | 53 | — | 600 | 2 | 33 |
| (96) | 56 | — | 600 | 1 | 65 |
| (97) | 88 | — | 600 | 1 | 61 |
| (98) | 90 | — | 606 | 1 | 39 |
| (99) | 92 | — | 606 | 1 | 25 |
| (100) | 93 | — | 606 | 1 | 45 |
| (101) | 127 | — | 606 | 1 | 35 |
| (102) | 145 | — | 606 | 1 | 61 |
| (103) | 175 | — | 606 | 1 | 43 |
| (104) | 176 | — | 606 | 1 | 58 |
| (105) | 178 | — | 616 | 1 | 68 |
| (106) | 179 | — | 616 | 1 | 65 |
| (107) | 181 | — | 616 | 1 | 35 |
| (108) | 188 | — | 616 | 1 | 34 |
| (109) | 221 | — | 616 | 1 | 37 |
| (110) | 243 | — | 616 | 1 | 62 |
| (111) | 245 | — | 616 | 1 | 36 |
| (112) | 247 | — | 616 | 1 | 46 |
| (113) | 249 | — | 616 | 1 | 38 |
| (114) | 262 | — | 616 | 1 | 98 |
| (115) | 265 | — | 616 | 1 | 38 |

TABLE 103

| Compound | Monomer A₁ | Ratio | Fluorscent material | m | p |
|---|---|---|---|---|---|
| (116) | 267 | — | 616 | 1 | 68 |
| (117) | 273 | — | 618 | 1 | 78 |
| (118) | 277 | — | 618 | 1 | 88 |
| (119) | 297 | — | 618 | 1 | 65 |
| (120) | 304 | — | 618 | 1 | 93 |
| (121) | 305 | — | 618 | 1 | 75 |
| (122) | 307 | — | 618 | 1 | 67 |
| (123) | 311 | — | 618 | 1 | 37 |
| (124) | 314 | — | 618 | 1 | 68 |
| (125) | 317 | — | 652 | 1 | 62 |
| (126) | 319 | — | 652 | 2 | 61 |
| (127) | 320 | — | 652 | 1 | 37 |
| (128) | 339 | — | 652 | 1 | 64 |
| (129) | 340 | — | 652 | 1 | 35 |
| (130) | 341 | — | 659 | 1 | 78 |
| (131) | 342 | — | 639 | 1 | 36 |
| (132) | 347 | — | 639 | 1 | 87 |
| (133) | 417 | — | 659 | 1 | 45 |
| (134) | 461 | — | 639 | 1 | 84 |
| (135) | 462 | — | 660 | 1 | 35 |
| (136) | 529 | — | 639 | 1 | 84 |
| (137) | 7/36 | 1/1 | 639 | 1 | 36 |
| (138) | 7/43 | 1/1 | 639 | 1 | 63 |
| (139) | 7/44 | 1/2 | 589 | 1 | 47 |
| (140) | 7/53 | 1/1 | 606 | 2 | 56 |
| (141) | 7/85 | 1/1 | 600 | 1 | 59 |
| (142) | 20/85 | 1/2 | 600 | 1 | 65 |
| (143) | 57/90 | 1/1 | 606 | 1 | 43 |
| (144) | 57/92 | 1/2 | 589 | 1 | 15 |
| (145) | 57/94 | 5/1 | 589 | 1 | 34 |
| (146) | 57/127 | 1/1 | 600 | 1 | 44 |
| (147) | 127/196 | 1/2 | 606 | 1 | 48 |
| (148) | 176/340 | 6/1 | 606 | 1 | 37 |
| (149) | 243/376 | 2/1 | 589 | 1 | 39 |
| (150) | 7/20/57 | 1/2/4 | 589 | 1 | 57 |

TABLE 104

| Compound | Monomer A₁ | Ratio | Y₂ | Z₂ | Fluorscent material | T | m | p |
|---|---|---|---|---|---|---|---|---|
| (151) | 2 | — | —(CH₂)₆— | — | 585 | —CH₂— | 1 | 65 |
| (152) | 2 | — | —(CH₂)₆— | — | 587 | —CH₂CH₂— | 1 | 84 |
| (153) | 4 | — | —(CH₂)₆— | — | 587 | —CH₂— | 1 | 38 |
| (154) | 6 | — | —(CH₂)₆— | — | 587 | —CH₂— | 1 | 64 |
| (155) | 7 | — | —(CH₂)₆— | — | 587 | —CH₂CH₂— | 1 | 36 |

TABLE 104-continued

| Compound | Monomer A₁ | Ratio | Y₂ | Z₂ | Fluorscent material | T | m | p |
|---|---|---|---|---|---|---|---|---|
| (156) | 7 | — | -C₆H₄-CH₂-C₆H₄- | — | 587 | —CH₂CH₂— | 1 | 55 |
| (157) | 9 | — | —(CH₂)₆— | — | 587 | —CH₂CH₂— | 1 | 36 |
| (158) | 9 | — | trimethyl-(CH₂-)cyclohexyl (with CH₃ groups) | — | 587 | —CH₂CH₂— | 1 | 63 |
| (159) | 19 | — | trimethylphenyl | — | 587 | —CH₂CH₂— | 1 | 65 |
| (160) | 19 | — | — | —CH₂CH₂— | 587 | —CH₂CH₂— | 1 | 43 |
| (161) | 41 | — | —(CH₂)₆— | — | 587 | —CH₂CH₂— | 1 | 36 |
| (162) | 42 | — | —(CH₂)₆— | — | 587 | —CH₂CH₂— | 1 | 28 |
| (163) | 44 | — | —CH₂-C₆H₄-CH₂— (meta) | — | 600 | —CH₂— | 1 | 35 |

TABLE 105

| Compound | Monomer A₁ | Ratio | Y₂ | Z₂ | Fluorscent material | T | m | p |
|---|---|---|---|---|---|---|---|---|
| (164) | 44 | — | -C₆H₄-CH₂-C₆H₄- | — | 600 | —CH₂— | 1 | 47 |
| (165) | 46 | — | —(CH₂)₆— | — | 600 | —CH₂— | 1 | 62 |
| (166) | 53 | — | —(CH₂)₆— | — | 600 | —CH₂— | 1 | |
| (167) | 54 | — | —(CH₂)₆— | — | 600 | —CH₂CH₂— | 1 | 45 |
| (168) | 54 | — | -C₆H₄-CH₂-C₆H₄- | — | 606 | —CH₂— | 1 | 40 |
| (169) | 80 | — | — | —CH₂CH₂— | 606 | —CH₂— | 1 | 75 |
| (170) | 88 | — | —(CH₂)₆— | — | 606 | —CH₂— | 1 | 61 |
| (171) | 92 | — | —(CH₂)₆— | — | 606 | —CH₂— | 1 | 43 |
| (172) | 127 | — | —(CH₂)₆— | — | 606 | —CH₂— | 1 | 88 |
| (173) | 127 | — | -C₆H₄-CH₂-C₆H₄- | — | 606 | —CH₂— | 1 | 47 |
| (174) | 156 | — | —(CH₂)₆— | — | 606 | —CH₂— | 1 | 71 |
| (175) | 175 | — | —(CH₂)₆— | — | 616 | —CH₂— | 1 | 22 |
| (176) | 176 | — | —(CH₂)₆— | — | 616 | —CH₂CH₂— | 1 | 54 |
| (177) | 178 | — | —(CH₂)₆— | — | 616 | —CH₂CH₂— | 1 | 36 |
| (178) | 182 | — | —(CH₂)₆— | — | 616 | —CH₂CH₂— | 1 | 57 |
| (179) | 183 | — | —(CH₂)₆— | — | 616 | —CH₂CH₂— | 1 | 85 |

TABLE 106

| Compound | Monomer A$_1$ | Ratio | Y$_2$ | Z$_2$ | Fluorscent material | T | m | p |
|---|---|---|---|---|---|---|---|---|
| (180) | 185 | — | —(CH$_2$)$_6$— | — | 616 | —CH$_2$CH$_2$— | 1 | 63 |
| (181) | 188 | — | —(CH$_2$)$_6$— | — | 616 | —CH$_2$CH$_2$— | 1 | 41 |
| (182) | 192 | — | —(CH$_2$)$_6$— | — | 616 | —CH$_2$CH$_2$— | 1 | 52 |
| (183) | 209 | — | —(CH$_2$)$_6$— | — | 616 | —CH$_2$CH$_2$— | 1 | 67 |
| (184) | 220 | — | —(CH$_2$)$_6$— | — | 616 | —CH$_2$CH$_2$— | 1 | 52 |
| (185) | 221 | — | —(CH$_2$)$_6$— | — | 616 | —CH$_2$CH$_2$— | 1 | 36 |
| (186) | 222 | — | —(CH$_2$)$_6$— | — | 616 | —CH$_2$CH$_2$— | 1 | 78 |
| (187) | 243 | — | —(CH$_2$)$_6$— | — | 618 | —CH$_2$CH$_2$— | 1 | 45 |
| (188) | 244 | — | —(CH$_2$)$_6$— | — | 618 | —CH$_2$CH$_2$— | 1 | 74 |
| (189) | 247 | — | —(CH$_2$)$_6$— | — | 618 | —CH$_2$CH$_2$— | 1 | 98 |
| (190) | 249 | — | —(CH$_2$)$_6$— | — | 618 | —CH$_2$CH$_2$— | 1 | 78 |
| (191) | 254 | — | —(CH$_2$)$_6$— | — | 618 | —CH$_2$CH$_2$— | 1 | 58 |
| (192) | 256 | — | —(CH$_2$)$_6$— | — | 618 | —CH$_2$CH$_2$— | 1 | 98 |
| (193) | 262 | — | —(CH$_2$)$_6$— | — | 618 | —CH$_2$CH$_2$— | 1 | 62 |
| (194) | 297 | — | —(CH$_2$)$_6$— | — | 618 | —CH$_2$CH$_2$— | 1 | 85 |
| (195) | 303 | — | —(CH$_2$)$_6$— | — | 652 | —CH$_2$CH$_2$— | 1 | 47 |
| (196) | 305 | — | —(CH$_2$)$_6$— | — | 652 | —CH$_2$CH$_2$— | 1 | 65 |
| (197) | 313 | — | — | —CH$_2$CH$_2$— | 652 | —CH$_2$CH$_2$— | 1 | 69 |

TABLE 107

| Compound | Monomer A$_1$ | Ratio | Y$_2$ | Z$_2$ | Fluorscent material | T | m | p |
|---|---|---|---|---|---|---|---|---|
| (198) | 340 | — | —(CH$_2$)$_6$— | — | 652 | —CH$_2$CH$_2$— | 1 | 77 |
| (199) | 376 | — | — | —CH$_2$CH$_2$— | 652 | —CH$_2$CH$_2$— | 1 | 48 |
| (200) | 377 | — | —(CH$_2$)$_6$— | — | 659 | —CH$_2$CH$_2$— | 1 | 85 |
| (201) | 379 | — | —(CH$_2$)$_6$— | — | 639 | —CH$_2$CH$_2$— | 1 | 25 |
| (202) | 7/43 | 1/1 | —(CH$_2$)$_6$— | — | 639 | —CH$_2$CH$_2$— | 1 | 76 |
| (203) | 7/44 | 1/1 | —(CH$_2$)$_6$— | — | 659 | —CH$_2$CH$_2$— | 1 | 87 |
| (204) | 7/53 | 1/1 | —(CH$_2$)$_6$— | — | 639 | —CH$_2$CH$_2$— | 1 | 47 |
| (205) | 57/127 | 1/1 | —(CH$_2$)$_6$— | — | 660 | —CH$_2$CH$_2$— | 1 | 74 |

A method of synthesizing the non-conjugated polymer used in the invention is not particularly limited, but the known methods can be utilized by combining them depending on a desired structure, and examples thereof are explained below. The following specific examples explain in detail the cases where a non-conjugated polymer comprising a repetition unit containing at least one partial structure selected from the group consisting of the above general formulas (I-1) and (I-2) is a polyester represented by the above general formula (II-1) or (II-2), a polyether represented by the above general formula (III-1), or a polyurethane represented by the above general formula (IV-1) or (IV-2).

I) In the Case of Polyester

When the non-conjugated polymer used in the invention is polyester represented by the above general formula (II-1) or (II-2), the non-conjugated polymer can be synthesized by polymerizing a monomer represented by the following general formula (II-3), for example, by the known method described in 4th edition, Experimental Chemical Course, vol. 28 (Maruzen Co., Ltd., 1992).

A'-A$_1$-A'     (II-3)

In the general formula (II-3), A$_1$ represents at least one selected from the structures represented by the general formulas (I-1) and (I-2), A' represents a hydroxyl group, a halogen atom, or a group —O—R$_{18}$, and R$_{18}$ represents an alkyl group, a substituted or unsubstituted aryl group, or an aralkyl group.

That is, polyester represented by the above general formula (II-1) or (II-2) can be synthesized as follows:

1) When A' is a hydroxy group, a divalent alcohol represented by HO—(Y—O)$_m$—H is mixed with a monomer at an approximately equivalent amount, and this is polymerized using an acid catalyst. As an acid catalyst, catalysts which are used for a normal esterification reaction such as sulfuric acid, toluenesulfonic acid, trifluoroacetic acid and the like can be used, and are used in the range of 1/10,000 to 1/10 parts by weight, preferably 1/1,000 to 1/50 parts by weight relative to 1 part by weight of a monomer. In addition, as a solvent, it is preferable to use a solvent which can be azeotroped with water in order to remove water produced during polymerization, toluene, chlorobenzene, 1-chloronaphthalene and the like are effective, and the solvent is used in the range of 1 to 100 parts by weight, preferably 2 to 50 parts by weight relative to 1 part by weight of a monomer. A reaction temperature can be set arbitrarily, but in order to remove water produced during polymerization, it is preferable that a reaction is performed at a boiling point of a solvent.

After completion of the reaction, when a solvent was not used, the reaction solution is dissolved in a solvent which can dissolve the reaction solution. When a solvent was used, the reaction solution is added as it is dropwise to a poor solvent in which a polymer is hardly dissolved, such as alcohols such as methanol, ethanol and the like, acetone and the like, to precipitate polyester. Then, precipitated polyester is separated, washed with water or an organic solvent well, and is dried. Further, if necessary, polyester is dissolved in a suitable organic solvent, the solution is added dropwise to a poor solvent, and re-precipitating treatment for precipitating polyester may be repeated. Re-precipitating treatment is preferably performed while effectively stirring with a mechanical stirrer or the like. A solvent which dissolves polyester upon re-precipitating treatment is used in the range of 1 to 100 parts by weight, preferably 2 to 50 parts by weight relative to 1 part by weight of polyester. In addition, a poor solvent is used in the range of 1 to 1,000 parts by weight, preferably 10 to 500 parts by weight relative to 1 part by weight of polyester.

2) When A' is halogen, polymerization is performed by adding an organic basic catalyst such as pyridine and triethylamine to a mixture solution obtained by mixing a monomer and a divalent alcohol represented by HO—(Y—O)$_m$—H at an approximately equivalent amount. An organic basic catalyst is used in the range of 1 to 10 equivalent, preferably 2 to 5 equivalent relative to 1 equivalent of a monomer. As a solvent, methylene chloride, tetrahydrofuran (THF), toluene, chlorobenzene, 1-chloronaphthalene and the like are effective, and the solvent is used in the range of 1 to 100 parts by weight, preferably 2 to 50 parts by weight relative to 1 part by weight of a monomer. A reaction temperature can be set arbitrarily. After polymerization, the reaction is subjected to re-precipitating treatment as described above, and is purified.

In addition, in the case of a divalent alcohol having the high acidity such as bisphenol, an interface polymerization method may be used. That is, polymerization can be performed by adding a divalent alcohol to water, adding an equivalent amount of a base to dissolve them, and adding a monomer solution at the same equivalent as that of a divalent alcohol while vigorously stirring. Upon this, water is used in the range of 1 to 1,000 parts by weight, preferably 2 to 500 parts by weight relative to 1 part by weight of a divalent alcohol. As a solvent which dissolves a monomer, methylene chloride, dichloroethane, trichloroethane, toluene, chlorobenzene, 1-chloronaphthalene and the like are effective. A reaction temperature can be set arbitrarily and, in order to promote a reaction, it is effective to use a phase transfer catalyst such as ammonium salt, sulfonium salt and the like. A phase transfer catalyst is used in the range of 0.1 to 10 parts by weight, preferably 0.2 to 5 parts by weight relative to 1 part by weight of a monomer.

3) When A' is —O—R$_{18}$, transesterification is available for polymerization. Such transesterification can be performed by heating a reaction solution which include a monomer, an excessive amount of a divalent alcohol [represented by HO—(Y—O)$_m$—H] relative to the monomer, and a catalyst such as titanium alkoxide, acetate or carbonate of calcium and cobalt, or oxide of zinc or lead. A divalent alcohol is used in the range of 2 to 100 equivalent, preferably 3 to 50 equivalent relative to 1 equivalent of a monomer. A catalyst is used in the range of 1/10,000 to 1 parts by weight, preferably 1/1,000 to I-2 parts by weight relative to 1 part by weight of a monomer. A reaction is performed at a reaction temperature of 200 to 300° C. and, after completion of transesterification from a group —O—R$_{18}$ to a group —O—(Y—O)$_m$—H, it is preferable to perform a reaction under reduced pressure in order to promote polymerization by leaving of HO—(Y—O)$_m$—H. Alternatively, a reaction may be performed while removing HO—(Y—O)$_m$—H by azeotropy under a normal pressure using a high boiling point solvent such as 1-chloronaphthalene which can be azeotroped with HO—(Y—O)$_m$—H.

Alternatively, polyester may be synthesized as follows: In aforementioned respective cases, after a compound represented by the following general formula (II-4) is produced by a reaction by adding an excessive amount of a divalent alcohol and, by using this compound in place of a monomer represented by the above general formula (II-3), the compound may be reacted with divalent carboxylic acid or divalent carboxylic halide according to the aforementioned method, whereby, polyester can be obtained.

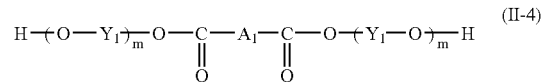

(II-4)

In the general formula (II-4), A$_1$ represents at least one selected from the structures represented by the above general formulas (I-1) and (I-2), Y$_1$ represents a divalent alcohol residue, and m represents an integer from 1 to 5.

4) Introduction of a fluorescent substance is not particularly limited, but there are following methods. That is, when A' is a hydroxy group, a fluorescent substance can be introduced in a polymer by copolymerizing monocarboxylic acid of a fluorescent substance, or after a polymerization reaction for a polymer, using monocarboxylic acid of a fluorescent substance to react them. In addition, when A' is halogen, a fluorescent substance can be introduced into a polymer by copolymerizing monoacid chloride of a fluorescent substance, or after a polymerization reaction for a polymer, using monoacid chloride of a fluorescent substance to react them. When A' is —O—R$_{18}$, a fluorescent substance can be introduced into a polymer by copolymerizing monoester of a fluorescent substance, or after a polymerization reaction for a polymer, placing monoester of a fluorescent substance to react them.

II) In the Case of Polyether

When the non-conjugated polymer used in the invention is polyether represented by the above general formula (III-1), the non-conjugated polymer can be easily prepared by condensing between molecules of a compound having a hydroxyl group represented by the following general formulas (III-2).

HO—A$_1$-OH (III-2)

In the general formula (III-2), A$_1$ represents at least one selected from the structures represented by the above general formulas (I-1) and (I-2).

Polyether represented by the above general formula (III-1) can be specifically synthesized, for example, by the following method.

1) The aforementioned polyether can be synthesized by a method of heating and dehydration-condensing a monomer having two hydroxyl groups on both ends of a structure represented by A$_1$, as in the above general formula (III-2). In this case, it is desirable that a monomer is heated to melt without using a solvent, and a reaction is performed under reduced pressure in order to promote a polymerization reaction by leaving of water. In addition, when a solvent is used, in order to remove water, it is effective to use a solvent which is azeotoped with water, for example, trichloroethane, toluene, chlorobenzene, dichlorobenzene, nitrobenzene, 1-chloronaphthalene and the like. In this case, a solvent is used in the range of 1 to 100 equivalent, preferably 2 to 50 equivalent relative to 1 equivalent of a monomer. In addition, a reaction temperature can be set arbitrarily, but in order to remove water produced during polymerization, it is preferable to perform a reaction at a boiling point of a solvent. When polymerization does not proceed, a solvent may be removed from a reaction system, and the reaction may be heated to stir at the viscous state.

2) The aforementioned polyether may be synthesized by a method of performing dehydration-condensation using, as an acid catalyst, protonic acids such as p-toluenesulfonic acid, hydrochloric acid, sulfuric acid, trifluoroacetic acid and the like, or Lewis acids such as zinc chloride and the like. In this case, an acid catalyst is used in the range of 1 to 1/10000 to 1/10 equivalent, preferably 1/1000 to 1/50 equivalent relative to 1 equivalent of a monomer. In order to remove water produced during polymerization, it is preferable to use a solvent which can be azeotroped with water. As such a solvent, toluene, chlorobenzene, dichlorobenzene, nitrobenzene, 1-chloronaphthalene and the like are effective, and they are used in the range of 1 to 100 equivalent, preferably 2 to 50 equivalent relative to 1 equivalent of a monomer. A reaction temperature can be set arbitrarily, but in order to remove water during a polymerization, a reaction is preferably performed at a boiling point of a solvent.

3) The aforementioned monomer can be also synthesized by a method using a condensing agent such as alkyl isocyanate such as cyclohexyl isocyanate and the like, alkyl cyanate such as cyclohexyl cyanate and the like, cyanate ester such as p-tolyl cyanate, 2,2-bis(4-cyanatophenyl)propane and the like, dichlorohexylcarbodiimide (DCC), trichloroacetonitrile and the like. In this case, a condensing agent is used in the range of I-2 to 10 equivalent, preferably 1 to 3 equivalent relative to 1 equivalent of a monomer. As a solvent, toluene, chlorobenzene, dichlorobenene, 1-chloronaphthalene and the like are effective, and they are used in the range of 1 to 100 equivalent, preferably 2 to 50 equivalent. A reaction temperature can be set arbitrarily, but it is preferable that a reaction is performed at room temperature to a boiling point of a solvent. Among synthesizing methods 1) to 3) explained regarding polyester, the synthesizing method 1) or 3) is preferable because isomerization and side reactions are hardly caused. In particular, the synthesizing method 3) is preferable because the reaction condition is milder.

After completion of the reaction, when a solvent was not used, the reaction solution is dissolved as it is in a solvent which can dissolve it. When a solvent was used, the reaction solution is added as it is dropwise to a poor solvent which hardly dissolves a non-conjugated polymer, such as alcohols such as methanol, ethanol and the like, acetone or the like, to precipitate polyether, and polyether is separate, washed with water or an organic solvent well, and dried. Further, if necessary, re-precipitating treatment be repeated in which polyether is dissolved in a suitable organic solvent, and the solution is added dropwise to a poor solvent to precipitate a monomer. Upon re-precipitating treatment, it is preferable to perform treatment while stirring effectively with a mechanical stirrer or the like. A solvent which dissolves a monomer upon re-precipitating treatment is used in the range of 1 to 100 equivalent, preferably 2 to 50 equivalent relative to 1 equivalent of polyether. In addition, a poor solvent is used in the range of 1 to 1000 equivalent, preferably 10 to 500 equivalent relative to 1 equivalent of polyether. Further, in the aforementioned reaction, it is possible to copolymerize using two or more kinds of, preferably 2 to 5 kinds of, more preferably 2 to 3 kinds of monomers. By copolymerizing different monomers, the electric property, the film forming property, the solubility and the fluorescent property can be controlled.

When a polymerization degree of polyether is too low, the film forming property is inferior, and a firm film is hardly obtained. On the other hand, a polymerization degree is too high, solubility in a solvent is reduced, and the processibility is deteriorated in some cases. Therefore, a polymerization degree is preferably in the range of 5 to 5000, more preferably in the range of 10 to 3000, further preferably in the range of 15 to 1000.

In order to introduce L1, as in a monomer, a hydroxyl group, that is, a terminal group R may be a hydrogen atom. However, when the polymer physical properties such as the solubility, the film forming property, the mobility and the like are adversely influenced, a terminal group R can be modified to control the physical property. For example, a terminal hydroxyl group can be alkyletherized with alkyl sulfate, alkyl iodide or the like. A specific reagent can be arbitrarily selected from dimethyl sulfate, diethyl sulfate, methyl iodide, ethyl iodide and the like, and is used in the range of 1 to 3 equivalent, preferably in the range of 1 to 2 equivalent relative to a terminal hydroxyl group. Upon this, a base catalyst can be used, and can be selected from sodium hydroxide, potassium hydroxide, sodium hydride, sodium metal and the like, and is used in a range of to 3 equivalent, preferably in the range of 1 to 2 equivalent relative to a terminal hydroxyl group.

A reaction can be performed at 0° C. to a boiling point of a solvent to be used. In addition, as a solvent used thereupon, a single solvent selected from inert solvents such as benzene, toluene, methylene chloride, tetrahydrofuran, N,N-dimethylformamide, dimethyl sulfoxide, N-methylpyrrolidone, 1,3-dimethyl-2-imidazolidinone and the like, or a mixed solvent of 2 to 3 of them can be used. In addition, depending on a reaction, a quaternary ammonium salt such as tetra-n-butylammonium iodide and the like may be used as a phase transfer catalyst. Alternatively, a terminal hydroxyl group may be acylated using acid halide to convert a terminal group R into an acyl group.

Examples of acid halide are not particularly limited, but include acryoyl chloride, crotonoyl chloride, methacryloyl chloride, n-butyl chloride, 2-furoyl chloride, benzoyl chloride, cyclohexanecarbonyl chloride, enantyl chloride, phenylacethyl chloride, o-toluoyl chloride, m-toluoyl chloride, p-toluoyl chloride and the like. They are used in the range of 1 to 3 equivalent, preferably 1 to 2 equivalent relative to a terminal hydroxyl group. Upon this, a base catalyst can be used, and can be selected arbitrarily from pyridine, dimethylaminopyridine, trimethylamine, triethylamine and the like, and is used in the range of 1 to 3 equivalent, preferably 1 to 2 equivalent relative to acid chloride. Examples of a solvent to be used thereupon include benzene, toluene, methylene chloride, tetrahydrofuran, methyl ethyl ketone and the like.

A reaction can be performed at 0° C. to a boiling point of the solvent, preferably, in the range of 0° C. to 30° C. Further, acylation may be also performed using acid anhydride such as acetic anhydride and the like. When a solvent is used, specifically, inert solvents such as benzene, toluene, chlorobenzene and the like can be used. A reaction can be performed at 0° C. to a boiling point of the solvent, preferably, 40° C. to a boiling point of a solvent.

Besides, an urethane residue (—CONH—R') can be introduced into a terminal end using monoisocyatnate. Specifically, monoisocyanate can be arbitrarily selected from benzyl isocyanate, n-butyl isocyanate, t-butyl isocyanate, cyclohexyl isocianate, 2,6-dimethyl isocyanate, ethyl isocyanate, isopropyl isocyanate, 2-methoxyphenyl isocyanate, 4-methoxyphenyl isocyanate, n-octadecyl isocyanate, phenyl isocyanate, I-propyl isocyanate, m-tolyl isocyanate, p-tolyl isocyanate, 1-naphthyl isocyanate and the like. Monoisocyanate is used in the range of 1 to 3 equivalent, preferably 1 to 2 equivalent relative to a terminal hydroxyl group.

Examples of a solvent to be used upon this include benzene, toluene, chlorobenzene, dichlorobenzene, methylene chloride, tetrahydrofuran, N,N-dimethylformamide, dimethyl sulfoxide, N-methylpyrrolidone, 1,3-dimethyl-2-imidazolidinone and the like. A reaction can be performed at a temperature of 0° C. to a boiling point of a solvent to be used. When a reaction hardly proceeds, metal compounds such as dibutyltin (II) dilaurate, tin (II) octylate, lead naphthenate and the like, or tertiary amines such as triethylamine, trimethylamine, pyridine, dimethylaminopyridine and the like may be added as a catalyst.

In addition, introduction of a fluorescent substance is not particularly limited, but the following methods are exemplified. That is, a method of acylating a terminal hydroxyl group by a monoacid salt compound of a fluorescent substance, and a method of introducing an urethane residue into a terminal hydroxyl group by using monoisocyanate of a fluorescent substance can be applied.

III) In the Case of Polyurethane

When the non-conjugated polymer used in the invention is polyurethane represented by the above general formula (IV-1) or (IV-2), the non-conjugated polymer can be synthesized by polymerizing monomers represented by the following general formulas (IV-3) to (IV-6) by the known method, for example, described in 4th Experimental Chemical Course, vol. 28 (Maruzen Co., Ltd., 1992), New Polymer Experiment, vol. 2 (Kyouritsushupan) 1995 and the like.

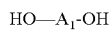  (IV-3)

  (IV-4)

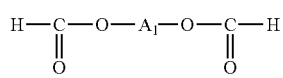  (IV-5)

  (IV-6)

In the general formulas (IV-3) to (IV-6), $A_1$ represents at least one selected from the structures represented by the above general formulas (I-1) and (I-2).

Specifically, for example, when monomers represented by the general formulas (IV-3) and (IV-4) are used, polyurethane can be synthesized as follows.

When a monomer is a divalent alcohol represented by the general formula (IV-3), the monomer is mixed with diisocyanate represented by the OCN—Y—NCO at an equivalent amount and, when a monomer is diisocyanate represented by the general formula (IV-4), the monomer is mixed with a divalent alcohol represented by HO—Y—OH at an equivalent amount, whereby, polyaddition is performed.

As the catalyst, catalysts which are used in a reaction of synthesizing polyurethane by normal polyaddition, such as organometal compounds such as dibutyltin (II) dilaurate, dibutyltin (II) diacetate, lead naphthenate and the like can be used. In addition, when aromatic diisocyanate is used in synthesis of polyurethane, tertiary amines such as triethylenediamine and the like can be used as a catalyst. These organometal compounds and tertiary amines may be used by mixing them as a catalyst. An amount of a catalyst is in the range of 1/10,000 to 1/10 parts by weight, preferably 1/1,000 to 1/50 parts by weight relative to 1 part by weight of a monomer. Any solvents may be used as far as they dissolve a monomer and diisocyanate, or divalent alcohols. However, in view of the reactivity, it is preferable to use a solvent having the low polarity or a solvent forming no hydrogen bond to alcohols, and toluene, chlorobenzene, dichlorobenzene, 1-chloronaphthalene are effective. An amount of a solvent is in the range of 1 to 100 parts by weight, preferably 2 to 50 parts by weight relative to 1 part by weight of a monomer. A reaction temperature can be arbitrarily set.

After completion of the reaction, the reaction solution is added as it is dropwise to a poor solvent in which a polymer is hardly dissolved, such as alcohols such as methanol, ethanol and the like, acetone and the like, and polyurethane is precipitated and separated from the reaction solution, washed with water or an organic solvent well, and is dried. Further, if necessary, re-precipitating treatment may be repeated in which polyurethane is dissolved in a suitable organic solvent, and the solution is added dropwise to a poor solvent, to precipitate polyurethane. Upon re-precipitated treatment, it is preferable to perform the treatment while effectively stirring with a mechanical stirrer or the like. A solvent which dissolves polyurethane upon re-precipitating treatment is used in the range of 1 to 100 parts by weight, preferably 2 to 50 parts by weight relative to 1 part by weight of polyurethane. In addition, a poor solvent is used in the range of 1 to 1,000 parts by weight, preferably 10 to 500 parts by weight relative to 1 part by weight of charge transporting polyurethane.

On the other hand, when monomers represented by the general formulas (IV-5) and (IV-6) are used, polyurethane can be synthesized as follows:

That is, when a monomer is bischloroformate represented by the general formula (IV-5), synthesis of polyurethane can be performed by mixing with diamine represented by $_2$HN—$Y_2$—NH$_2$ at an equivalent amount and conducting polycondensation. In addition, when a monomer is diamine represented by the general formula (IV-6), synthesis of polyurethane can be performed by mixing with bischloroformate represented by ClOCO—$Y_2$—OCOCl at an equivalent amount and conducting polycondensation.

As a solvent, methylene chloride, dichloroethane, trichloroethane, tetrahydrofuran (THF), toluene, chlorobenzene, 1-chloronaphthalene and the like are effective, and they are used in the range of 1 to 100 parts by weight, preferably 2 to 50 parts by weight relative to 1 part by weight of a monomer. A reaction temperature can be arbitrarily set. After polymerization, polyurethane is purified by re-precipitating treatment as described above.

In addition, when basicity of diamine represented by $_2$HN—Y—NH$_2$ is high, an interface polymerization method may be used. That is, polymerization can be performed by adding water to diamine, adding an equivalent amount of an acid to dissolve the material, and adding diamine and a solution of an equivalent amount of a monomer represented by the aforementioned general formula (IV-5) while vigorously stirring. Upon this, water is used in the range of 1 to 1,000 parts by weight, preferably 10 to 500 parts by weight relative to 1 part by weight of diamine.

As a solvent which dissolves a monomer, methylene chloride, dichloroethane, trichloroethane, toluene, chlorobenzene, 1-chloronaphthalene and the like are effective. A reaction temperature can be arbitrarily set. In addition, in order to promote a reaction, it is effective to use a phase transfer catalyst such as ammonium salt, sulfonium salt and the like. A phase transfer catalyst is used in the range of 0.1 to 10 parts by weight, preferably 0.2 to 5 parts by weight relative to 1 part by weight of a monomer.

In addition, introduction of a fluorescent substance is not particularly limited, but following methods are exemplified. When a monomer represented by the general formula (IV-3) is used, a fluorescent substance can be introduced by copolymerizing a monovalent alcohol of a fluorescent substance, or after a polymerization reaction of a polymer, using a monovalent alcohol of a fluorescent substance to conduct a reaction.

When a monomer represented by the general formula (IV-4) is used, a fluorescent substance can be introduced by copolymerizing monoisocyanate of a fluorescent substance, or after a polymerization reaction of a polymer, using monoisocyanate of a fluorescent substance to conduct a reaction.

When a monomer represented by the general formula (IV-5) is used, a fluorescent substance can be introduced by copolymerizing a monovalent carboxyilic acid of a fluorescent substance, or after a polymerization reaction of a polymer, using monovalent carboxyilic acid of a fluorescent substance to conduct a reaction.

When a monomer represented by the general formula (IV-6) is used, a fluorescent substance can be introduced by copolymerizing monoamine of a fluorescent substance, or after a polymerization reaction of a polymer, using monoamine of a fluorescent substance to conduct a reaction.

Then, a layer construction of the organic electroluminescent element of the invention will be described in detail.

A layer construction of the organic electroluminescent element of the invention is not particularly limited as far as the element comprises at least one pair of electrodes comprising an anode and a cathode, at least one of which having light transmissive, and at least one organic compound layer held by the electrodes, and the aforementioned non-conjugated polymer is contained in the at least one organic compound layer.

In the organic electroluminescent element of the invention, when the at least one organic compound layer is a single layer, this organic compound layer means a light emitting layer having the charge transporting function, and this light emitting layer having the charge transporting function contains the aforementioned non-conjugated polymer.

On the other hand, when the at least one organic compound layer is composed of a plurality of layers (that is, when this organic compound layer is function-separated type that functions of respective layers are different), at least one layer comprises a light emitting layer, and this light emitting layer may be a light emitting layer having a charge transporting function. In this case, examples of a layer construction comprising the aforementioned light emitting layer or the light emitting layer having the charge transporting function, and other layers include (1) a layer construction comprising a light emitting layer, an electron transporting layer and/or an electron injecting layer, (2) a layer construction comprising a hole transporting layer and/or a hole injecting layer, a light emitting layer, and an electron transporting layer and/or an electron injecting layer, and (3) a layer construction comprising a hole transporting layer and/or a hole injecting layer, and a light emitting layer having the charge transporting function. Layers other than the light emitting layer and the light emitting layer having the charge transporting function in these layer constructions (1) to (3) have function as a charge transporting layer or a charge injecting layer.

In addition, in any layer construction of the layer constructions (1) to (3), the non-conjugated polymer may be contained in any one layer, and it is preferable that the non-conjugated polymer is contained in a light emitting layer in the layer construction (1) and (2) and it is preferable that the non-conjugated polymer is contained in a light emitting layer having the electron transporting function in the layer construction (3).

In addition, the light emitting layer having the charge transporting layer, the hole transporting layer, the hole injecting layer, the electron transporting layer and the electron injecting layer may further contain a charge transporting compound (hole transporting material, electron transporting material) other than the aforementioned non-conjugated polymer. The details of such a charge transporting compound will be described below.

Hereinafter, the invention will be explained in detail by referring to the drawings, but is not limited to them.

Figure 2:
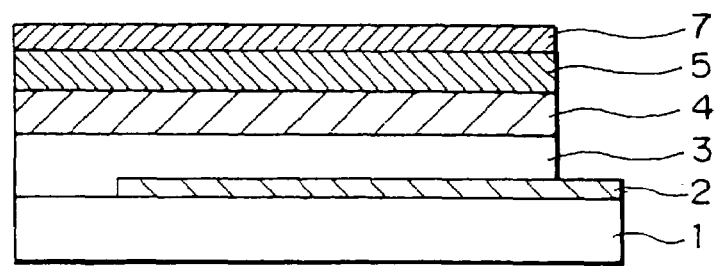
FIG. 2 is a schematic view showing another example of a layer construction of the organic electroluminescent element of the invention.
Figure 3:
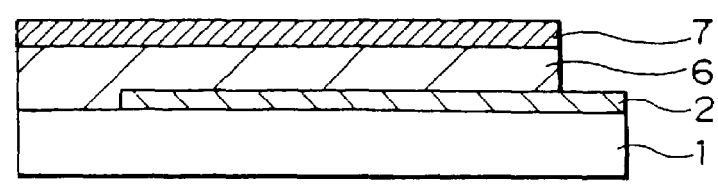
FIG. 3 is a schematic view showing another example of a layer construction of the organic electroluminescent element of the invention.
Figure 4:
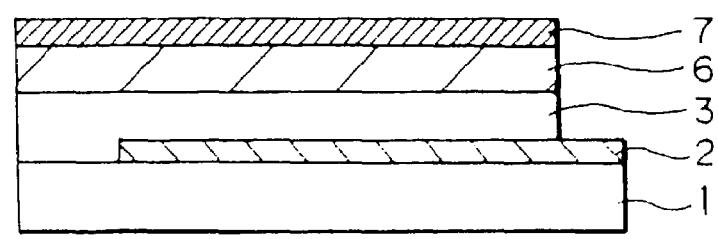
FIG. 4 is a schematic view showing another example of a layer construction of the organic electroluminescent element of the invention.

FIGS. 1 to 4 are schematic cross-sectional views for explaining a layer construction of the organic electroluminescent element of the invention. FIGS. 1-2 and 4 show one example of the case where the organic compound layer comprises a plurality of layers, and FIG. 3 shows an example of the case where the organic compound layer comprises one layer. In FIGS. 1 to 4, the same symbol is given to a member having the same function.

In the organic electroluminescent element shown in FIG. 1, a transparent electrode 2, a light emitting layer 4, an electron transporting layer and/or an electron injecting layer 5, and a rear surface electrode 7 are deposited in this order on a transparent insulating substrate 1. When a layer shown by the symbol 5 comprising an electron transforming layer and an electron injecting layer, an electron transporting layer, an electron injecting layer and a rear surface electrode 7 are deposited in this order on a side where a rear surface electrode 7 of a light emitting layer 4 is provided.

In the organic electroluminescent element shown in FIG. 2, a transparent electrode 2, a hole transporting layer and/or a hole injecting layer 3, a light emitting layer 4, an electron transporting layer and/or an electron injecting layer 5, and a rear surface electrode 7 are deposited in this order on transparent insulating substrate 1. When a layer shown by the symbol 3 comprises a hole transporting layer and a hole injecting layer, a hole injecting layer, a hole transporting layer and a light emitting layer 4 are deposited in this order on a side where a rear electrode 7 of a transparent electrode 2 is provided. In addition, when a layer shown by the symbol 5 comprises an electron transporting layer and an electron injecting layer, an electron transporting layer, an electron injecting layer, and a rear surface electrode 7 are deposited in this order on a side where a rear electrode 7 of a light emitting layer 4 is provided.

In the organic electroluminescent element shown in FIG. 3, a transparent electrode 2, a light emitting layer 6 having the charge transporting function, and a rear surface electrode 7 are deposited in this order on a transparent insulating substrate 1. In the organic electroluminescent element shown in FIG. 4, a transparent electrode 2, a hole transporting layer and/or a hole injecting layer 3, a light emitting layer 6 having the charge transporting function, and a rear electrode 7 are deposited in this order on a transparent insulating substrate 1. When a layer shown by the symbol 3 comprises a hole transporting layer and a hole injecting layer, a hole injecting layer, a hole transporting layer, and a light emitting layer 6 having the charge transporting function are deposited in this order on a side where a rear electrode 7 of a transparent electrode 2 is provided. Each constituent member will be explained in detail below.

In the case of a layer construction of the organic electroluminescent element shown in FIGS. 1 to 4, a transparent insulating substrate 1 is preferably transparent for taking out the emitted light and glass, plastic film and the like are used. The transparency means that transmittance of the light in a visible region is 10% or more, and further, it is preferable that this transmittance is 75% or more.

A transparent electrode 2 is transparent for taking out the emitted light as in the transparent insulating substrate, and it is preferable that the electrode has the large work function for carrying out the injection of holes. It is preferable that the value of this work function is 4 eV or more. Examples of the transparent electrode 2 include oxidized films such as tin indium oxide (ITO), tin oxide (NESA), indium oxide, zinc oxide, indium zinc oxide and the like, and gold, platinum, palladium and the like formed by deposition or sputtering. A lower sheet resistance of a transparent electrode 2 is desirable, a few hundreds Ω/□ or less is preferable, further 100 Ω/□ or less is more preferable. In addition, in a transparent electrode 2, transmittance of the light in a visible region is 10% or more as in the transparent insulating substrate, and further, it is preferable that this transmittance is 75% or more.

In addition, for the purpose of improving the durability or the light emitting efficiency of the organic electroluminescent element, a hole transporting material other than the aforementioned non-conjugated polymer for regulating the hole mobility may be mixed and dispersed in the range of 0.1% by weight to 50% by weight relative to the non-conjugated polymer used in the invention. Examples of such a hole transporting material include a tetraphenylenediamine derivative, a triphenylamine derivative, a carbazole derivative, a stilbine derivative, an arylhydrazone derivative and a porphyrin compound. Among them, a tetraphenylenediamine derivative and a triphenylamine derivative are preferable because they have the better compatibility with the non-conjugated polymer.

In addition, similarly, when the electron mobility is adjusted, an electron transporting material may be mixed and dispersed in the range of 0.1% by weight to 50% by weight relative to the non-conjugated polymer. Examples of such a electron transporting material include an oxadiazole derivative, a nitro-substituted fluorenone derivative, a diphenoquinone derivative, a thiopyrandioxide derivative, a fluorenylidenmethane derivative and the like.

In addition, when both of the hole mobility and the electron mobility are required to be adjusted, both of the hole transporting material and the electron transporting material may be mixed into the non-conjugated polymer.

Further, for the purpose of improvement of the film forming property and prevention of pinhole, a suitable resin (polymer) and additive may be added. As a resin, for example, a polycarbonate resin, polyester resin, a methacryl resin, an acryl resin, a polyvinyl chloride resin, a cellulose resin, an urethane resin, an epoxy resin, a polystyrene resin, a polyvinyl acetate resin, a styrene butadiene copolymer, vinylidene chloride-acrylonitrile copolymer, a vinyl chloride-vinyl acetate-maleic anhydride copolymer, a silicon resin, a poly-N-vinylcarbazole resin, and a polysilane resin, and electrically conducting resins such as polythiophene and polypyrrole can be used. In addition, as an additive, the known antioxidant, ultraviolet ray absorber, plasticizer and the like can be used.

In addition, for improving the light emitting intensity and adjusting the color purity and the light emitting spectrum, different dye compounds as a guest material may be doped. A dye compound to be doped may be an organic low-molecular compound or an organic high-molecular compound.

When a dye compound to be doped is an organic low-molecular compound, preferable example of this organic low-molecular compound include a chelating type organic metal complex, a polynuclear aromatic ring compound, a condensation aromatic ring compound, a perylene derivative, a coumarin derivative, a styrylarylene derivative, a silol derivative, an oxazole derivative, a oxathiazole derivative, an oxadiazole derivative and the like. In addition, when a dye compound to be doped is a high-molecular compound, as this high-molecular compound, a polyparaphenylene derivative, a polyparaphenylenevinylene derivative, a polythiophene derivative, a polyacetylene derivative and the like are used. As a suitable example of a dye compound, the following dye compounds (V-1) to (V-15) are used, being not limiting. In addition, in dye compounds (V-13) to (V-15), n and x represent an integer of 1 or more.

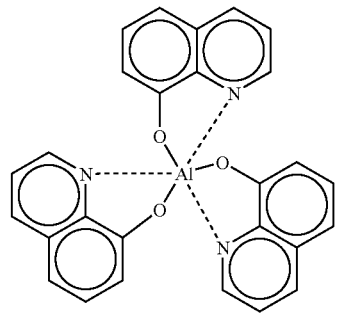
(V-1)

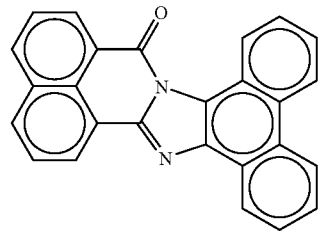
(V-2)

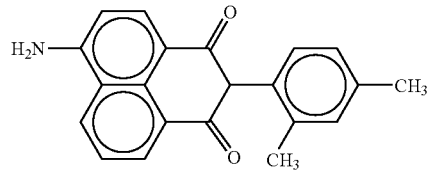
(V-3)

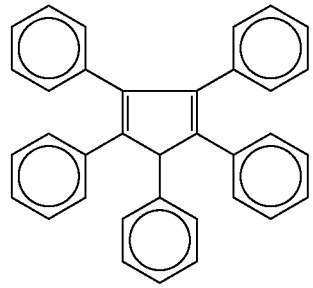
(V-4)

(V-5) 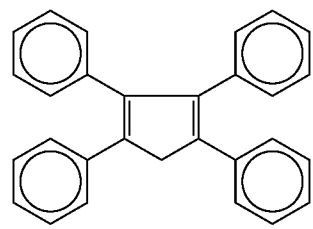

(V-6) 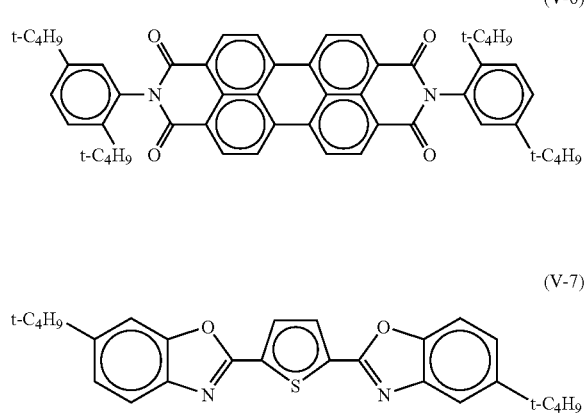

(V-7) 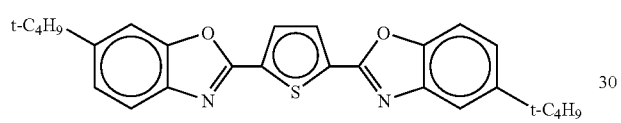

(V-8) 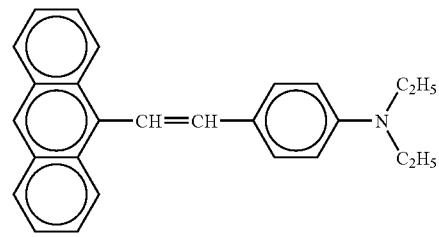

(V-9) 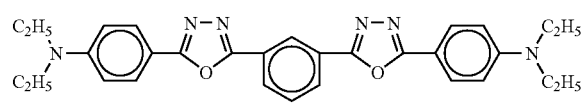

(V-10) 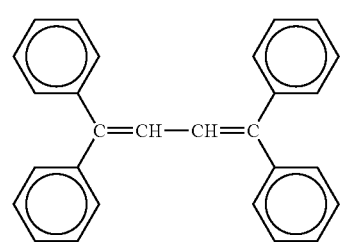

(V-11) 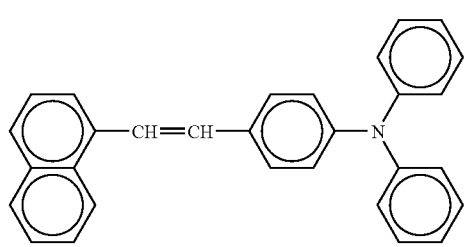

(V-12) 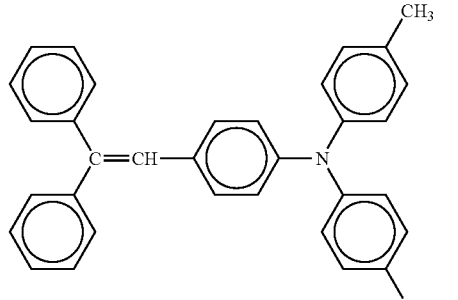

(V-13) 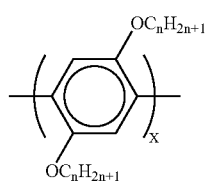

(V-14) 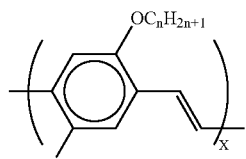

(V-15) 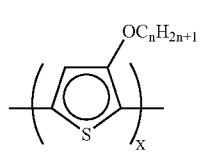

A ratio of doping of a dye compound is around 0.001% by weight to 40% by weight, preferably around 0.001% by weight to 10% by weight. As dye compound to be used for such a doping, organic compounds having the better compatibility with a light emitting material and do not prevent better film forming of a light emitting layer are used and, suitably, a DCM derivative, a quinacridone derivative, a rublene derivative, porphyrin and the like are used. Suitable examples include the following dye compounds (VI-1) to (VI-4), being not limiting.

(VI-1) 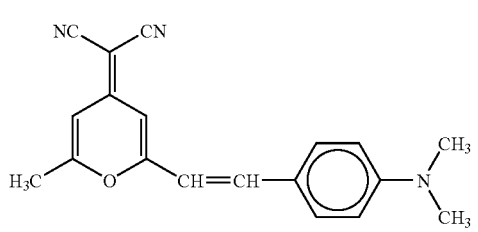

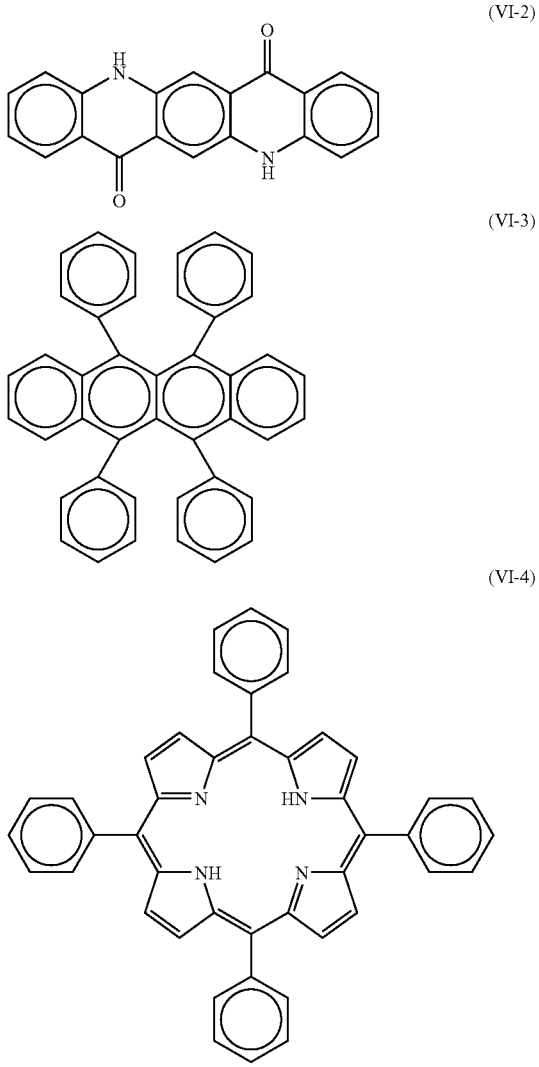

In the case of a layer construction of the organic electroluminescent element shown in FIGS. 1 to 4, a metal, metal oxide, metal fluoride and the like which can be vacuum-deposited and has small work function for carrying out electron injection are used in a rear surface electrode 7. Examples of the metal include magnesium, aluminum, silver, indium, lithium, calcium and alloys thereof. Examples of the metal oxide include lithium oxide, magnesium oxide and aluminum oxide. In addition, examples of the metal fluoride include lithium fluoride, magnesium fluoride, strontium fluoride, calcium fluoride and aluminum fluoride. Further, in order to prevent deterioration of an organic electroluminescent element due to water or oxide, a protecting layer may be provided on a rear surface electrode 7.

Examples of a material for the protecting layer include metals such as In, Sn, Pb, Au, Cu, Ag, Al and the like, metal oxides such as MgO, $SiO_2$, $TiO_2$ and the like, and resins such as a polyethylene, a polyurea resin, a polyimide resin and the like. For forming a protecting layer, a vacuum-deposition method, a sputtering method, a plasma polymerization method, a CVD method and a coating method can be applied.

These organic electroluminescent elements shown in FIGS. 1 to 4 can be prepared by first forming individual layers corresponding to a layer construction of each organic electroluminescent element, in this order, on a transparent electrode 2.

In addition, a hole transporting layer and/or a hole injecting layer 3, a light emitting layer 4 and an electron transporting layer and/or an electron injecting layer 5, or a light emitting layer 6 having the charge transporting function is formed using the aforementioned respective materials by a vacuum-deposition method, or is formed on a transparent electrode 2 using a coating solution obtained by dissolving or dispersing the aforementioned respective materials in a suitable organic solvent by a spin-coating method, a casting method, a dipping method or the like.

Thicknesses of a hole transporting layer and/or hole injecting layer 3, a light emitting layer 4, an electron transporting layer and/or an electron injecting layer 5, as well as a light emitting layer 6 having the charge transporting function are preferably in the range of 10 μm or smaller, particularly 0.001 to 5 μm, respectively. The dispersed state for the aforementioned respective materials (non-conjugated polymer, light emitting material etc.) may be the state where materials are dispersed at a molecular level, or the state where fine particles such as fine crystals are dispersed. In the case of a method of forming a film using a coating solution, in order to obtain the state of dispersion at a molecular level, it is necessary to select a dispersing solvent in view of the dispersing property and the solubility of the aforementioned respective materials. In order to obtain dispersion of fine particles, a ball mill, a sand mill, a paint shaker, an attritor, a homogenizer, ultrasound method and the like can be utilized.

Finally, in the case of the organic electroluminescent element shown in FIG. 1 and FIG. 2, the organic electroluminescent element of the invention is completed by forming a rear electrode 7 on an electron transporting layer and/or an electron injecting layer 5 by a vacuum-deposition method, or a sputtering method or the like. In addition, in the case of the organic electroluminescent element shown in FIGS. 3 and 4, the organic electroluminescent element of the invention is completed by forming a rear electrode 7 on a light emitting layer 6 having the charge transporting function by a vacuum-deposition method, a sputtering method or the like.

EXAMPLES

The present invention will be explained more specifically by way of Examples below. However, the invention is not limited the following Examples.

Example 1

By using a substrate (manufactured by Sanyosinku) in which an ITO film is formed on a glass substrate, subjecting this ITO film of a substrate to patterning by photolithography using a photomask on which a strip-like pattern is formed, and subjecting the patterned ITO film to etching treatment, a strip-like ITO electrode (width 2 mm) was formed. Then, this glass substrate equipped with an ITO electrode was washed with neutral detergent, pure water, acetone (for electronic industry, manufactured by Kanto Kagaku) and isopropanol (for electronic industry, manufactured by Kanto Kagaku) by adding ultrasound for each 5 minutes, and dried with a spin coater. Thereafter, the substrate was washed with ultraviolet-ray ozone.

Then, a solution obtained by filtering dichloroethane containing 5% by weight of a non-conjugated polymer [exemplified compound (11)] with a PTFE filter having an opening of 0.1 μm, was coated on the surface of an ITO electrode of a substrate equipped with the ITO electrode, whereby, a light emitting layer of a thickness of 0.100 μm having the charge transporting layer function was formed.

Finally, a metal mask on which a strip-like hole is provided was arranged on the surface of a light emitting layer having the charge transporting layer function, and a Mg—Ag alloy was deposited thereon by codeposition to form a rear electrode having a width of 2 mm and a thickness of 0.15 μm so as to cross with the ITO electrode. An effective area of the formed organic electroluminescent element was 0.04 cm².

Example 2

Dichloroethane containing 10% by weight of a mixture comprising 1 part by weight of the non-conjugated polymer [exemplified compound (11)] used in Example 1, 4 parts by weight of poly(N-vinylcarbazole) and 0.02 part by weight of the aforementioned dye compound (V-1), was filtered with a PTFE filter having an opening of 0.1 μm to prepare a solution.

Then, the above solution was coated on a surface of a side where an ITO electrode of a glass substrate equipped with an ITO electrode prepared and washed as in Example 1 was provided, by a spin coater method, to form a light emitting layer of a thickness of about 0.110 μm having the charge transporting function, which was sufficiently dried. Finally, a Mg—Ag alloy was deposited by codeposition on the surface of a light emitting layer having the charge transporting function as in Example 1, to form a rear electrode having a width of 2 mm and a thickness of 0.15 μm so as to cross the ITO electrode. An effective area of the formed organic electroluminescent element was 0.04 cm².

Example 3

A non-conjugated polymer [exemplified compound (15)] as a layer functioning as a hole transporting layer and a light emitting layer was formed at a thickness of 0.050 μm, on a surface of a side where an ITO electrode of a glass substrate equipped with an ITO electrode prepared and washed as in Example 1 was provided.

Then, a light emitting layer of a thickness of 0.065 μm containing the dye compound (V-1) and the dye compound (VI-1) was formed by a vacuum-deposition method and, further, on the surface of a light emitting layer, the following compound (VII-1) as an electron transporting layer was formed at a thickness of 0.030 μm by a vacuum deposition method.

Finally, a Mg—Ag alloy was deposited by codeposition, on the surface of an electron transporting layer as in Example 1, to form a rear electrode having a width of 2 mm and a thickness of 0.15 μm so as to cross with the ITO electrode. An effective area of the formed organic electroluminescent element was 0.04 cm².

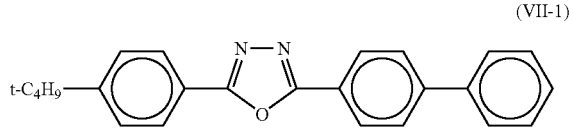

(VII-1)

Example 4

According to the same manner as that of Example 1 except that an exemplified compound (59) was used in place of an exemplified compound (11) used in Example 1, an organic electroluminescent element was prepared.

Example 5

According to the same manner as that of Example 2 except that an exemplified compound (87) was used in place of an exemplified compound (11) used in Example 2, an organic electroluminescent element was prepared.

Example 6

According to the same manner as that of Example 3 except that an exemplified compound (103) was used in place of an exemplified compound (11) used in Example 1, an organic electroluminescent element was prepared.

Example 7

According to the same manner as that of Example 3 except that an exemplified compound (110) was used in place of an exemplified compound (11) used in Example 1, an organic electroluminescent element was prepared.

Example 8

According to the same manner as that of Example 3 except that an exemplified compound (165) was used in place of an exemplified compound (11) used in Example 1, an organic electroluminescent element was prepared.

Example 9

According to the same manner as that of Example 3 except that an exemplified compound (166) was used in place of an exemplified compound (11) used in Example 1, an organic electroluminescent element was prepared.

Example 10

According to the same manner as that of Example 3 except that an exemplified compound (190) was used in place of an exemplified compound (11) used in Example 1, an organic electroluminescent element was prepared.

Comparative Example 1

Dichloroethane containing 2% by weight of polyvinylcarbazole (PVK) was filtered with a PTFE filter having an opening of 0.1 μm to prepare a solution. Then, the above solution was coated on the surface of a side where an ITO electrode of a glass substrate equipped with an ITO electrode prepared and washed as in Example 1 was provided, by a dipping method, to form a hole transporting layer having a thickness of 0.06 μm, which was sufficiently dried. Then, a light emitting layer having a thickness of 0.05 μm comprising the dye compound (V-1) as a light emitting material was formed by a vacuum deposition method.

Finally, a Mg—Ag alloy was deposited by codeposition on the surface of this light emitting layer as in Example 1, to form a rear electrode having a width of 2 mm and a thickness of 0.15 μm so as to cross with the ITO electrode. An effective area of the formed organic EL element was 0.04 cm².

Comparative Example 2

A dichloroethane solution containing 10% by weight of a mixture obtained by mixing 2 parts by weight of polyvinylcarbazole (PVK), 0.1 part by weight of the dye compound (VI-1) as a light emitting material, and 1 part by weight of the above compound (VII-1) as an electron transporting material, was filtered with a PTFE filter having an opening of 0.1 μm, to prepare a solution.

Then, the above solution was coated on the surface of a side where an ITO electrode of a glass substrate equipped with an ITO electrode prepared and washed as in Example 1 was provided, by a dipping method, to form a hole transporting layer having a thickness of 0.15 μm, which was sufficiently dried. Finally, a Mg—Ag alloy was deposited by codeposition on the surface of this hole transporting layer as in Example 1, to form a rear electrode having a width of 2 mm and a thickness of 0.15 μm so as to cross with the ITO electrode. An effective area of the formed organic EL element was 0.04 cm$^2$.

-Assessment-

A direct voltage was applied to the thus prepared organic EL element in vacuum ($133.3 \times 10^{-3}$ Pa), in which an ITO electrode side was plus and a Mg—Ag rear electrode side was minus, and light emitting was measured, and the maximum luminance and the emission color were assessed. The results are shown in Table 108. In addition, a light emitting life of the organic EL element was measured in dry nitrogen. In assessment of a light emitting life, a current value was set so that the initial luminance became 100 cd/m$^2$, and a time required for reduction of the luminance from an initial value to half by constant current driving was adopted as an element life (hour). The driving current density upon this is shown together with an element life in Table 108.

TABLE 108

| | Emission Color | Luminance (cd/m$^2$) | Driving current density (mA/m$^2$) | Element life (hour) |
|---|---|---|---|---|
| Example 1 | Green | 115 | 18 | 175 |
| Example 2 | Green | 130 | 20 | 230 |
| Example 3 | Orange | 150 | 18 | 200 |
| Ecample 4 | Bluegreen | 140 | 18 | 170 |
| Example 5 | Bluegreen | 180 | 21 | 120 |
| Example 6 | Blue | 165 | 20 | 150 |
| Example 7 | Bluegreen | 105 | 23 | 210 |
| Example 8 | Blue | 200 | 19 | 260 |
| Example 9 | Green | 190 | 24 | 120 |
| Example 10 | Bluegreen | 155 | 22 | 150 |
| Comparative Example 1 | Green | 85 | 31 | 80 |
| Comparative Example 2 | Green | 88 | 29 | 90 |

As explained above, the organic electroluminescent element of the present invention is an electroluminescent element comprising one or more organic compound layers held between one pair of electrodes comprising an anode and a cathode, at least one of which is transparent or translucent, wherein at least one layer of the one or more organic compound layers contains at least one kind of non-conjugated polymer, and at least one of terminal groups of the non-conjugated polymer has a fluorescent substance emitting fluorescence in a solid state.

Thus, according to the invention, there can be provided an organic electroluminescent element which has the high luminance, the high efficiency and a long element life, and has little defect such as pinhole, and can be easily enlarged, using a light emitting non-conjugated polymer excellent in the heat resistance and solubility in and compatibility with a solvent and a resin.

What is claimed is:

1. An organic electroluminescent element comprising at least one pair of electrodes comprising an anode and a cathode, at least one of which is light transmissive, and at least one organic compound layer disposed between the electrodes,
    wherein the at least one organic compound layer contains at least one kind of non-conjugated polymer having terminal groups at terminal ends of the main chain of the non-conjugated polymer and both terminal groups of the non-conjugated polymer contain a fluorescent substance emitting fluorescence in a solid state;
    wherein the fluorescent substance emitting fluorescence in a solid state is selected from the group consisting of a compound having a substituted or unsubstituted monovalent polynuclear aromatic hydrocarbon having an aromatic ring number of 2 to 10, a compound having a substituted or unsubstituted monovalent condensed aromatic hydrocarbon having an aromatic ring number of 2 to 10, and a compound having a substituted or unsubstituted monovalent aromatic heterocyclic ring.

2. An organic electroluminescent element comprising at least one pair of electrodes comprising an anode and a cathode, at least one of which is light transmissive, and at least one organic compound layer disposed between the electrodes,
    wherein the at least one organic compound layer contains at least one kind of non-conjugated polymer having terminal groups, and at least one of the terminal groups of the non-conjugated polymer contains a fluorescent substance emitting fluorescence in a solid state;
    wherein the non-conjugated polymer comprises a repetition unit containing at least one partial structure selected from the group consisting of the following general formulas (I-1) and (I-2),

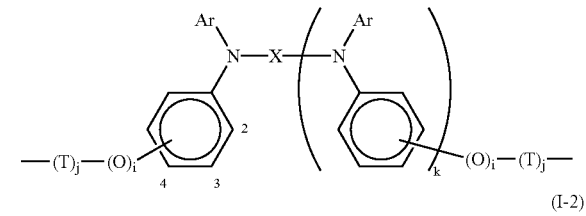

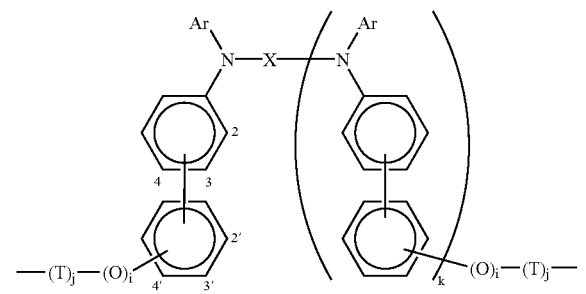

wherein, in the general formulas (I-1) and (I-2), Ar represents a group selected from the group consisting of a substituted or unsubstituted monovalent benzene ring, a substituted or unsubstituted monovalent polynuclear aromatic hydrocarbon having an aromatic ring number of 2 to 10, a substituted or unsubstituted monovalent condensed aromatic hydrocarbon having an aromatic ring number of 2 to 10, and a substituted or unsubstituted monovalent aromatic heterocyclic ring; X represents a group selected from the group consisting of a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, and a substituted or unsubstituted divalent aromatic heterocyclic ring; T represents a group selected from the group consisting of a divalent straight hydrocarbon group having a carbon number of 1 to 6, and a divalent branched hydrocarbon group having a carbon number of 2 to 10; and k, i and j each independently represent an integer selected from 0 to 1; and wherein the non-conjugated polymer is a polyester selected from the group consisting of the following general formulas (II-1) and (II-2),

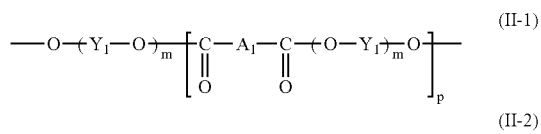

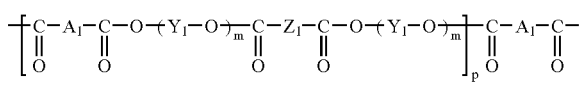

wherein, in the general formulas (II-1) and (II-2), $A_1$ represents at least one structure selected from the group consisting of general formulas (II-1) and (I-2), $Y_1$ represents a divalent alcohol residue, $Z_1$ represents a divalent carboxylic acid residue, m represents an integer from 1 to 5, and p represents an integer from 5 to 5,000.

3. An organic electroluminescent element according to claim 2, wherein the non-conjugated polymer is a hole transporting polymer.

4. An organic electroluminescent element according to claim 2, wherein the at least one organic compound layer comprises 2 or more layers including at least a light emitting layer, and the light emitting layer contains at least one kind of the non-conjugated polymer.

5. An organic electroluminescent element according to claim 4, wherein the at least one organic compound layer has a construction selected from the group consisting of a construction comprising the light emitting layer and an electron transporting layer, a construction comprising the light emitting layer and an electron injecting layer, and a construction comprising the light emitting layer, an electron transporting layer and an electron injecting layer.

6. An organic electroluminescent element according to claim 4, wherein the at least one organic compound layer has a construction selected from the group consisting of a construction comprising the light emitting layer and a hole transporting layer, a construction comprising the light emitting layer and a hole injecting layer, and a construction comprising the light emitting layer, a hole transporting layer and a hole injecting layer.

7. An organic electroluminescent element according to claim 4, wherein the at least one organic compound layer has a construction selected from the group consisting of a construction comprising the light emitting layer, a hole transporting layer and an electron transporting layer, a construction comprising the light emitting layer, a hole transporting layer and an electron injecting layer, a construction comprising the light emitting layer, a hole transporting layer, an electron transporting layer and an electron injecting layer, a construction comprising the light emitting layer, a hole injecting layer and an electron transporting layer, a construction comprising the light emitting layer, a hole injecting layer and an electron injecting layer, a construction comprising a light emitting layer, a hole injecting layer, an electron transporting layer and an electron injecting layer, a construction comprising the light emitting layer, a hole transporting layer, a hole injecting layer and an electron transporting layer, a construction comprising the light emitting layer, a hole transporting layer, a hole injecting layer and an electron injecting layer, and a construction comprising the light emitting layer, a hole transporting layer, a hole injecting layer, an electron transporting layer and an electron injecting layer.

8. An organic electroluminescent element according to claim 2, wherein the at least one organic compound layer is composed only of a light emitting layer having a charge transporting function, and the light emitting layer having the charge transporting function contains one or more kinds of non-conjugated polymers.

9. An organic electroluminescent element according to claim 2, wherein the fluorescent substance is an organic fluorescent substance.

10. An organic electroluminescent element according to claim 9, wherein the organic fluorescent substance is selected from the group consisting of a compound including an aromatic hydrocarbon having an aromatic ring number of 2 or more, and a chelating metal complex.

11. An organic electroluminescent element according to claim 10, wherein the compound including an aromatic hydrocarbon having an aromatic ring number of 2 or more is an organic fluorescent substance selected from the group consisting of a polyacene derivative compound, a styrylamine compound, a quinacridone derivative compound, a coumarin derivative compound and a pyran derivative compound.

12. An organic electroluminescent element according to claim 11, wherein the polyacene derivative compound is selected from the group consisting of a naphthalene derivative, an anthracene derivative, a tetracene derivative, a perylene derivative and a pyrene derivative.

13. An organic electroluminescent element according to claim 10, wherein the chelating metal complex contains a metal selected from the group consisting of Al, Zn, Be, Mg, Eu, Ga, Pt and Ir.

14. An organic electroluminescent element according to claim 2, wherein a maximum peak wavelength in a fluorescent spectrum of the fluorescent substance is in the visible light region.

15. An organic electroluminescent element comprising at least one pair of electrodes comprising an anode and a cathode, at least one of which is light transmissive, and at least one organic compound layer disposed between the electrodes, wherein the at least one organic compound layer contains at least one kind of non-conjugated polymer having terminal groups, and at least one of the terminal groups of the non-conjugated polymer contains a fluorescent substance emitting fluorescence in a solid state;

wherein the non-conjugated polymer comprises a repetition unit containing at least one partial structure selected from the group consisting of the following general formulas (I-1) and (I-2),

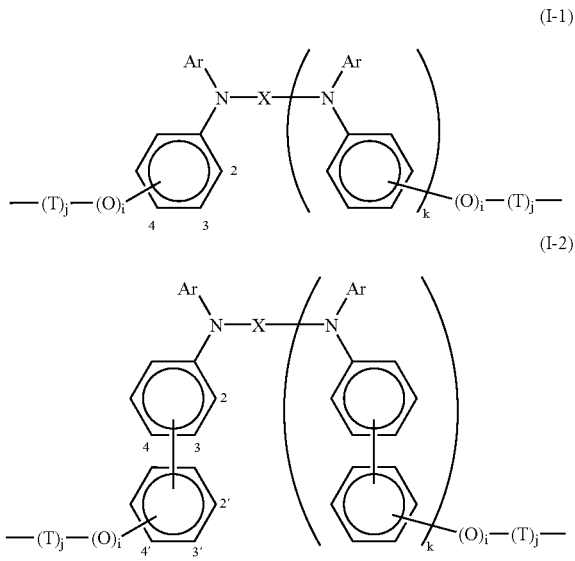

wherein, in the general formulas (I-1) and (I-2), Ar represents a group selected from the group consisting of a substituted or unsubstituted monovalent benzene ring, a substituted or unsubstituted monovalent polynuclear aromatic hydrocarbon having an aromatic ring number of 2 to 10, a substituted or unsubstituted monovalent condensed aromatic hydrocarbon having an aromatic ring number of 2 to 10, and a substituted or unsubstituted monovalent aromatic heterocyclic ring; X represents a group selected from the group consisting of a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, and a substituted or unsubstituted divalent aromatic heterocyclic ring; T represents a group selected from the group consisting of a divalent straight hydrocarbon group having a carbon number of 1 to 6, and a divalent branched hydrocarbon group having a carbon number of 2 to 10; and k, i and j each independently represent an integer selected from 0 to 1; and wherein the non-conjugated polymer is a polyether represented by the following general formula (III-1),

wherein, in the general formula (III-1), $A_1$ represents at least one structure selected from the group consisting of general formulas (I-1) and (I-2), and p represents an integer from 5 to 5,000.

16. An organic electroluminescent element according to claim 15, wherein the non-conjugated polymer is a hole transporting polymer.

17. An organic electroluminescent element according to claim 15, wherein the at least one organic compound layer comprises 2 or more layers including at least a light emitting layer, and the light emitting layer contains at least one kind of the non-conjugated polymer.

18. An organic electroluminescent element according to claim 17, wherein the at least one organic compound layer has a construction selected from the group consisting of a construction comprising the light emitting layer and an electron transporting layer, a construction comprising the light emitting layer and an electron injecting layer, and a construction comprising the light emitting layer, an electron transporting layer and an electron injecting layer.

19. An organic electroluminescent element according to claim 17, wherein the at least one organic compound layer has a construction selected from the group consisting of a construction comprising the light emitting layer and a hole transporting layer, a construction comprising the light emitting layer and a hole injecting layer, and a construction comprising the light emitting layer, a hole transporting layer and a hole injecting layer.

20. An organic electroluminescent element according to claim 17, wherein the at least one organic compound layer has a construction selected from the group consisting of a construction comprising the light emitting layer, a hole transporting layer and an electron transporting layer, a construction comprising the light emitting layer, a hole transporting layer and an electron injecting layer, a construction comprising the light emitting layer, a hole transporting layer, an electron transporting layer and an electron injecting layer, a construction comprising the light emitting layer, a hole injecting layer and an electron transporting layer, a construction comprising the light emitting layer, a hole injecting layer and an electron injecting layer, a construction comprising a light emitting layer, a hole injecting layer, an electron transporting layer and an electron injecting layer, a construction comprising the light emitting layer, a hole transporting layer, a hole injecting layer and an electron transporting layer, a construction comprising the light emitting layer, a hole transporting layer, a hole injecting layer and an electron injecting layer, and a construction comprising the light emitting layer, a hole transporting layer, a hole injecting layer, an electron transporting layer and an electron injecting layer.

21. An organic electroluminescent element according to claim 15, wherein the at least one organic compound layer is composed only of a light emitting layer having a charge transporting function, and the light emitting layer having the charge transporting function contains one or more kinds of non-conjugated polymers.

22. An organic electroluminescent element according to claim 15, wherein the fluorescent substance is an organic fluorescent substance.

23. An organic electroluminescent element according to claim 22, wherein the organic fluorescent substance is selected from the group consisting of a compound including an aromatic hydrocarbon having an aromatic ring number of 2 or more, and a chelating metal complex.

24. An organic electroluminescent element according to claim 23, wherein the compound including an aromatic hydrocarbon having an aromatic ring number of 2 or more is an organic fluorescent substance selected from the group consisting of a polyacene derivative compound, a styrylamine compound, a quinacridone derivative compound, a coumarin derivative compound and a pyran derivative compound.

25. An organic electroluminescent element according to claim 24, wherein the polyacene derivative compound is selected from the group consisting of a naphthalene derivative, an anthracene derivative, a tetracene derivative, a perylene derivative and a pyrene derivative.

26. An organic electroluminescent element according to claim 23, wherein the chelating metal complex contains a metal selected from the group consisting of Al, Zn, Be, Mg, Eu, Ga, Pt and Ir.

27. An organic electroluminescent element according to claim 15, wherein a maximum peak wavelength in a fluorescent spectrum of the fluorescent substance is in the visible light region.

28. An organic electroluminescent element comprising at least one pair of electrodes comprising an anode and a cathode, at least one of which is light transmissive, and at least one organic compound layer disposed between the electrodes,
wherein the at least one organic compound layer contains at least one kind of non-conjugated polymer having terminal groups, and at least one of the terminal groups of the non-conjugated polymer contains a fluorescent substance emitting fluorescence in a solid state;
wherein the non-conjugated polymer comprises a repetition unit containing at least one partial structure selected from the group consisting of the following general formulas (I-1) and (I-2),

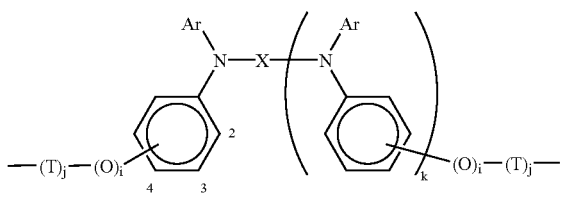

(I-1)

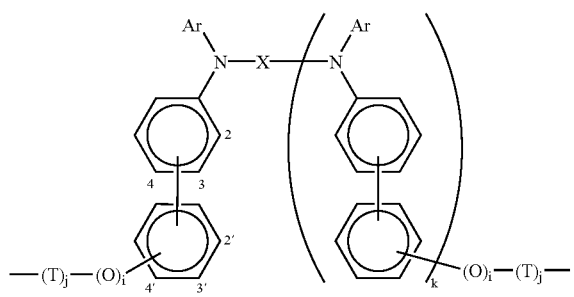

(I-2)

wherein, in the general formulas (I-1) and (I-2), Ar represents a group selected from the group consisting of a substituted or unsubstituted monovalent benzene ring, a substituted or unsubstituted monovalent polynuclear aromatic hydrocarbon having an aromatic ring number of 2 to 10, a substituted or unsubstituted monovalent condensed aromatic hydrocarbon having an aromatic ring number of 2 to 10, and a substituted or unsubstituted monovalent aromatic heterocyclic ring; X represents a group selected from the group consisting of a substituted or unsubstituted divalent benzene ring, a substituted or unsubstituted divalent polynuclear aromatic hydrocarbon having an aromatic ring number of 2 to 10, a substituted or unsubstituted divalent condensed aromatic hydrocarbon having an aromatic ring number of 2 to 10, and a substituted or unsubstituted divalent aromatic heterocyclic ring; T represents a group selected from the group consisting of a divalent straight hydrocarbon group having a carbon number of 1 to 6, and a divalent branched hydrocarbon group having a carbon number of 2 to 10; and k, i and j each independently represent an integer selected from 0 to 1; and
wherein the non-conjugated polymer is a polyurethane selected from the group consisting of the following general formulas (IV-1) and (IV-2),

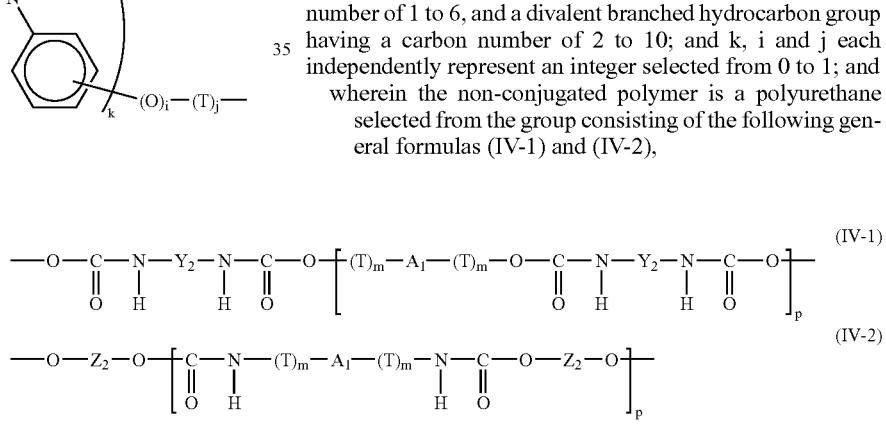

wherein, in the general formulas (IV-1) and (IV-2), $A_1$ represents at least one structure selected from the group consisting of general formulas (I-1) and (I-2), T represents a group selected from the group consisting of a divalent straight hydrocarbon group having a carbon number of 1 to 6, and a divalent branched hydrocarbon group having a carbon number of 2 to 10; $Y_2$ and $Z_2$ each independently represent a group selected from the group consisting of divalent diisocyanate, alcohol and amine residue; m represents an integer from 1 to 5; and p represents an integer from 5 to 5,000.

29. An organic electroluminescent element according to claim 28, wherein the non-conjugated polymer is a hole transporting polymer.

30. An organic electroluminescent element according to claim 28, wherein the at least one organic compound layer comprises 2 or more layers including at least a light emitting layer, and the light emitting layer contains at least one kind of the non-conjugated polymer.

31. An organic electroluminescent element according to claim 30, wherein the at least one organic compound layer has a construction selected from the group consisting of a construction comprising the light emitting layer and an electron transporting layer, a construction comprising the light emitting layer and an electron injecting layer, and a construction comprising the light emitting layer, an electron transporting layer and an electron injecting layer.

32. An organic electroluminescent element according to claim 30, wherein the at least one organic compound layer has a construction selected from the group consisting of a construction comprising the light emitting layer and a hole transporting layer, a construction comprising the light emitting layer and a hole injecting layer, and a construction comprising the light emitting layer, a hole transporting layer and a hole injecting layer.

33. An organic electroluminescent element according to claim 30, wherein the at least one organic compound layer has a construction selected from the group consisting of a construction comprising the light emitting layer, a hole transporting layer and an electron transporting layer, a construction comprising the light emitting layer, a hole transporting layer and an electron injecting layer, a construction comprising the light emitting layer, a hole transporting layer, an electron transporting layer and an electron injecting layer, a construction comprising the light emitting layer, a hole injecting layer and an electron transporting layer, a construction comprising the light emitting layer, a hole injecting layer and an electron injecting layer, a construction comprising a light emitting layer, a hole injecting layer, an electron transporting layer and an electron injecting layer, a construction comprising the light emitting layer, a hole transporting layer, a hole injecting layer and an electron transporting layer, a construction comprising the light emitting layer, a hole transporting layer, a hole injecting layer and an electron injecting layer, and a construction comprising the light emitting layer, a hole transporting layer, a hole injecting layer, an electron transporting layer and an electron injecting layer.

34. An organic electroluminescent element according to claim 28, wherein the at least one organic compound layer is composed only of a light emitting layer having a charge transporting function, and the light emitting layer having the charge transporting function contains one or more kinds of non-conjugated polymers.

35. An organic electroluminescent element according to claim 28, wherein the fluorescent substance is an organic fluorescent substance.

36. An organic electroluminescent element according to claim 35, wherein the organic fluorescent substance is selected from the group consisting of a compound including an aromatic hydrocarbon having an aromatic ring number of 2 or more, and a chelating metal complex.

37. An organic electroluminescent element according to claim 36, wherein the compound including an aromatic hydrocarbon having an aromatic ring number of 2 or more is an organic fluorescent substance selected from the group consisting of a polyacene derivative compound, a styrylamine compound, a quinacridone derivative compound, a coumarin derivative compound and a pyran derivative compound.

38. An organic electroluminescent element according to claim 37, wherein the polyacene derivative compound is selected from the group consisting of a naphthalene derivative, an anthracene derivative, a tetracene derivative, a perylene derivative and a pyrene derivative.

39. An organic electroluminescent element according to claim 36, wherein the chelating metal complex contains a metal selected from the group consisting of Al, Zn, Be, Mg, Eu, Ga, Pt and Ir.

40. An organic electroluminescent element according to claim 28, wherein a maximum peak wavelength in a fluorescent spectrum of the fluorescent substance is in the visible light region.

* * * * *